United States Patent
Chen et al.

(10) Patent No.: US 8,883,024 B2
(45) Date of Patent: *Nov. 11, 2014

(54) USING VACUUM ULTRA-VIOLET (VUV) DATA IN RADIO FREQUENCY (RF) SOURCES

(75) Inventors: Lee Chen, Cedar Creek, TX (US); Jianping Zhao, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 458 days.

This patent is subject to a terminal disclaimer.

(21) Appl. No.: 13/275,929

(22) Filed: Oct. 18, 2011

(65) Prior Publication Data

US 2012/0091097 A1    Apr. 19, 2012

Related U.S. Application Data

(60) Provisional application No. 61/394,290, filed on Oct. 18, 2010, provisional application No. 61/394,303, filed on Oct. 18, 2010.

(51) Int. Cl.
*G01L 23/06* (2006.01)
*H01J 37/32* (2006.01)
*H01L 21/67* (2006.01)

(52) U.S. Cl.
CPC ..... *H01L 21/67069* (2013.01); *H01J 37/32926* (2013.01); *H01L 21/67213* (2013.01); *H01J 37/3299* (2013.01); *H01J 37/32972* (2013.01); *H01J 2237/334* (2013.01); *H01L 21/67253* (2013.01)
USPC .......... 216/60; 216/59; 216/63; 216/67; 216/69; 438/706; 438/710; 156/345.24; 156/345.28

(58) Field of Classification Search
CPC ............ H01J 2237/32; H01J 2237/334; H01J 37/32082; H01J 37/32192; H01J 37/32935; H01J 37/3299; H01L 21/3065
See application file for complete search history.

(56) References Cited

U.S. PATENT DOCUMENTS

| | | |
|---|---|---|
| 6,486,941 B1 | 11/2002 | Hazelton et al. |
| 6,504,162 B1 | 1/2003 | Binnard et al. |
| 6,523,695 B1 | 2/2003 | Ueta et al. |
| 6,577,477 B1 | 6/2003 | Lin |
| 6,590,639 B1 | 7/2003 | Yuan et al. |
| 6,686,991 B1 | 2/2004 | Binnard et al. |
| 6,758,313 B2 | 7/2004 | Binnard |
| 6,774,981 B1 | 8/2004 | Watson et al. |
| 6,842,277 B2 | 1/2005 | Watson |
| 6,987,558 B2 | 1/2006 | Yuan et al. |
| 7,072,024 B2 | 7/2006 | Novak |
| 7,161,671 B2 | 1/2007 | Shibata et al. |
| 7,299,147 B2 | 11/2007 | Shibata et al. |
| 7,417,714 B2 | 8/2008 | Binnard et al. |
| 7,659,522 B2 | 2/2010 | Kim et al. |
| 2002/0085190 A1 | 7/2002 | Nishi |
| 2002/0093637 A1 | 7/2002 | Yuan et al. |
| 2002/0109823 A1 | 8/2002 | Binnard et al. |
| 2002/0137358 A1 | 9/2002 | Binnard et al. |

(Continued)

*Primary Examiner* — Lan Vinh
*Assistant Examiner* — Jiong-Ping Lu
(74) *Attorney, Agent, or Firm* — Manuel Madriaga

(57) ABSTRACT

The invention provide apparatus and methods for creating gate structures on a substrate in real-time using Vacuum Ultra-Violet (VUV) data and Electron Energy Distribution Function (EEDƒ) data and associated (VUV/EEDƒ)-related procedures in (VUV/EEDƒ) etch systems. The (VUV/EEDƒ)-related procedures can include multi-layer-multi-step processing sequences and (VUV/EEDƒ)-related models that can include Multi-Input/Multi-Output (MIMO) models.

19 Claims, 26 Drawing Sheets

(56) References Cited

U.S. PATENT DOCUMENTS

| | | | |
|---|---|---|---|
| 2002/0179806 A1 | 12/2002 | Teng | |
| 2003/0057619 A1 | 3/2003 | Ueta et al. | |
| 2003/0097205 A1 | 5/2003 | Yuan et al. | |
| 2003/0102721 A1 | 6/2003 | Ueta et al. | |
| 2003/0169412 A1 | 9/2003 | Hazelton | |
| 2003/0201162 A1* | 10/2003 | Liu et al. | 204/192.13 |
| 2003/0234918 A1 | 12/2003 | Watson | |
| 2004/0017623 A1 | 1/2004 | Watson | |
| 2004/0100007 A1 | 5/2004 | Engwall et al. | |
| 2004/0128918 A1 | 7/2004 | Yang et al. | |
| 2004/0244963 A1 | 12/2004 | Hazelton | |
| 2005/0085087 A1* | 4/2005 | Okigawa et al. | 438/710 |
| 2005/0128449 A1 | 6/2005 | Phillips | |
| 2005/0157280 A1 | 7/2005 | Novak | |
| 2005/0162802 A1 | 7/2005 | Kho et al. | |
| 2005/0174551 A1 | 8/2005 | Phillips | |
| 2006/0061751 A1 | 3/2006 | Teng et al. | |
| 2006/0087634 A1 | 4/2006 | Brown et al. | |
| 2006/0101928 A1 | 5/2006 | Binnard et al. | |
| 2006/0223317 A1* | 10/2006 | Hori et al. | 438/689 |
| 2007/0097340 A1 | 5/2007 | Yuan et al. | |
| 2007/0109534 A1 | 5/2007 | Shibata et al. | |
| 2007/0247602 A1 | 10/2007 | Binnard | |
| 2007/0252965 A1 | 11/2007 | Binnard | |
| 2008/0086440 A1 | 4/2008 | Hoey et al. | |
| 2008/0187087 A1 | 8/2008 | Kim et al. | |
| 2008/0285005 A1 | 11/2008 | Gery et al. | |
| 2009/0212702 A1 | 8/2009 | Yim et al. | |
| 2009/0304553 A1 | 12/2009 | Gordon | |
| 2010/0134445 A1 | 6/2010 | Cho et al. | |
| 2010/0186942 A1 | 7/2010 | Phillips et al. | |
| 2010/0284119 A1 | 11/2010 | Coakley et al. | |
| 2011/0008525 A1 | 1/2011 | Dalakos et al. | |

* cited by examiner

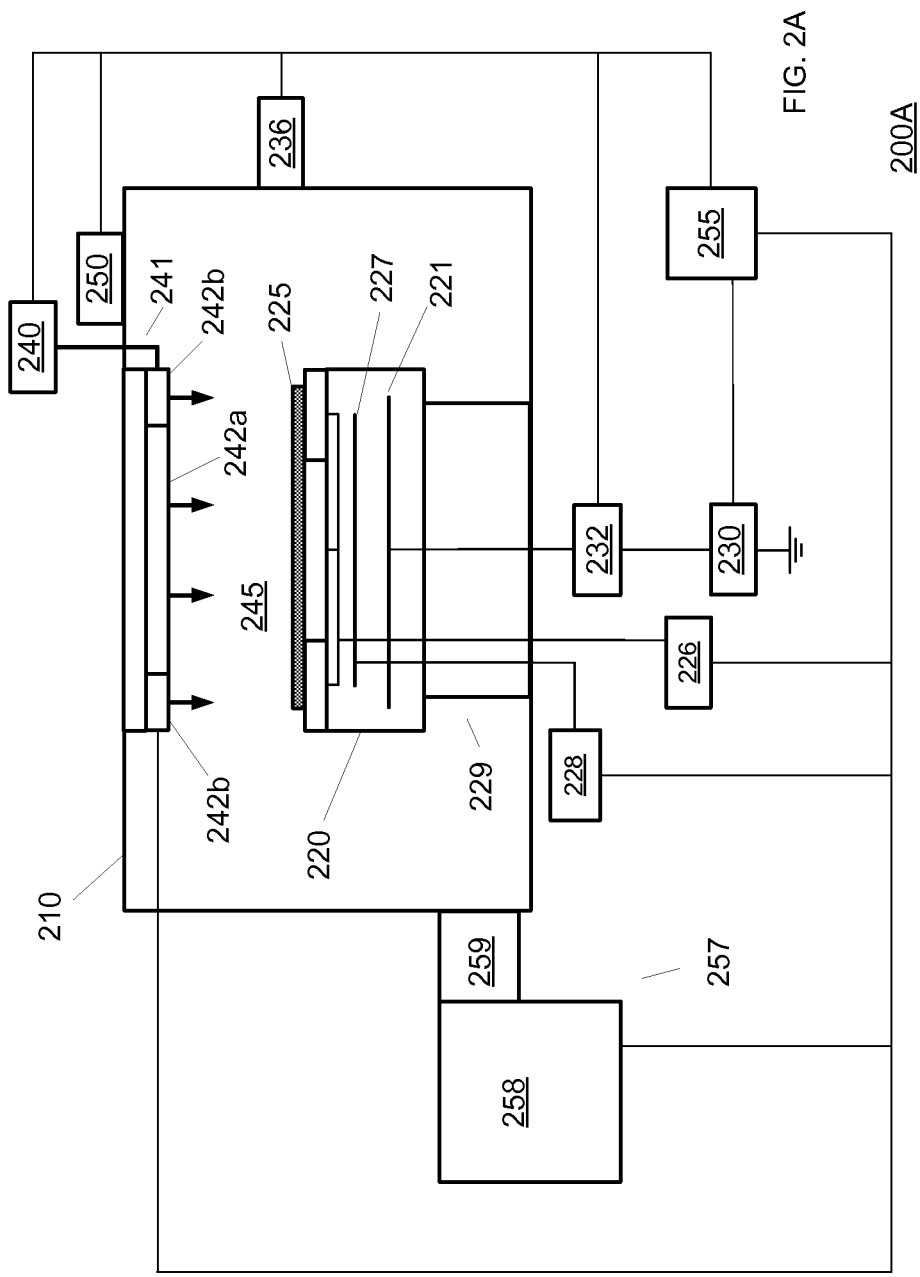

200B

200C

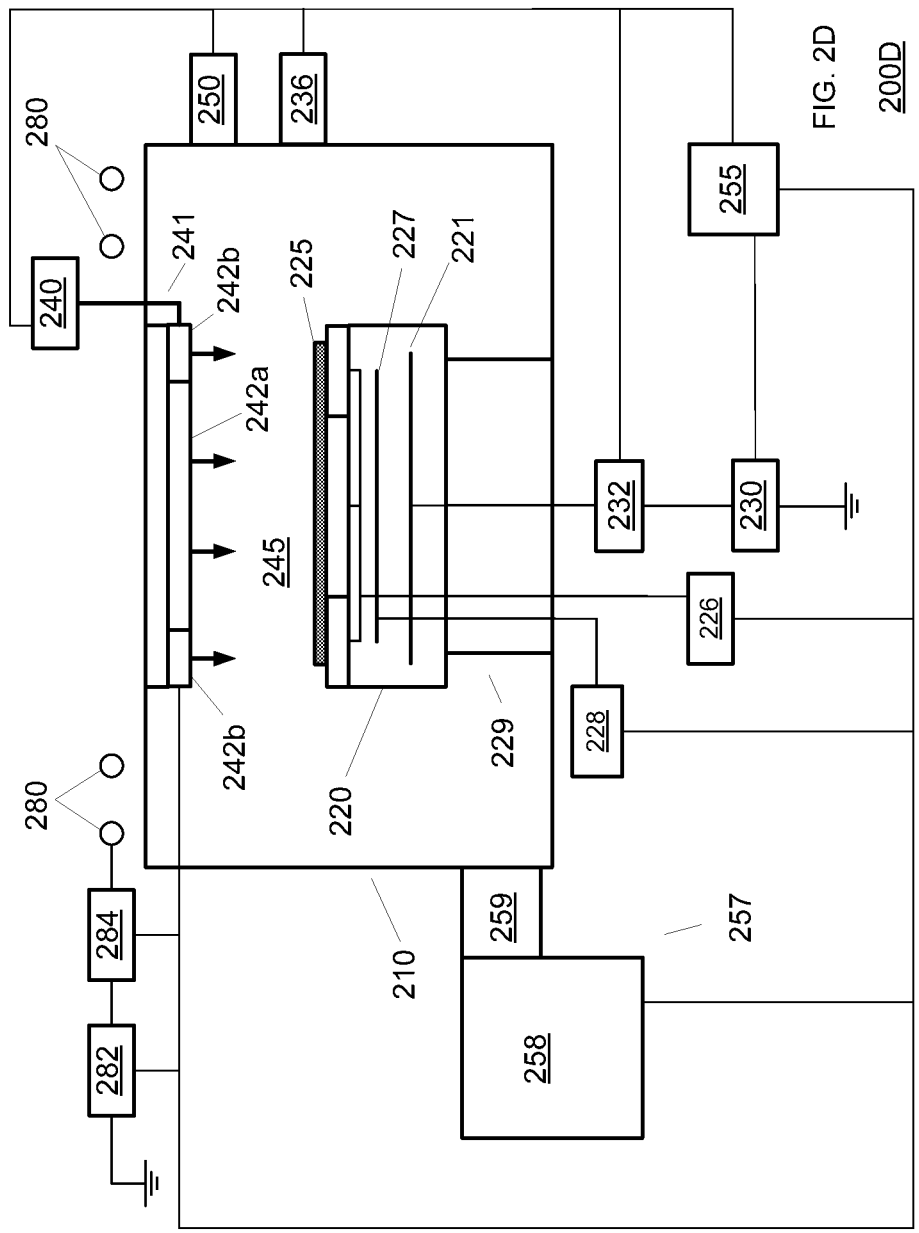

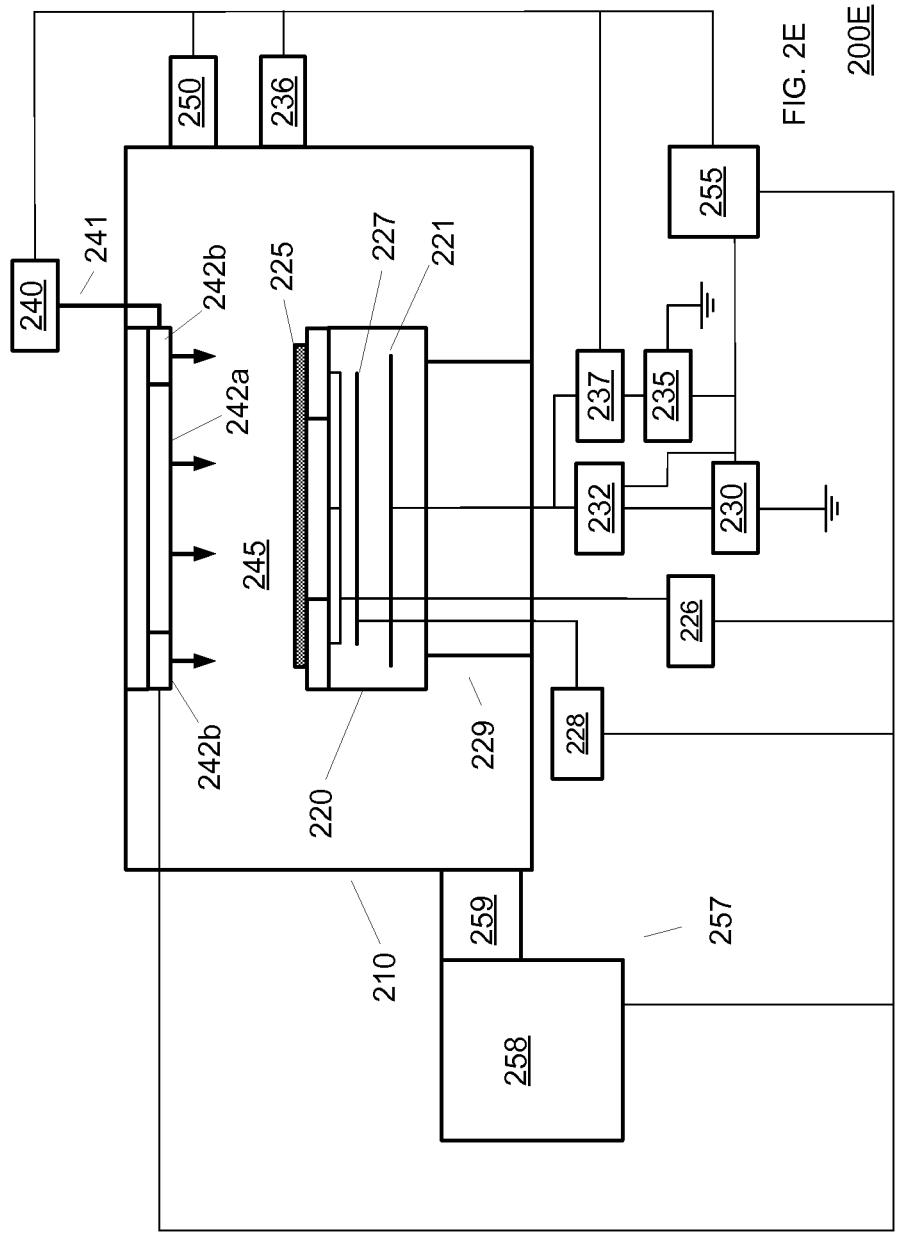

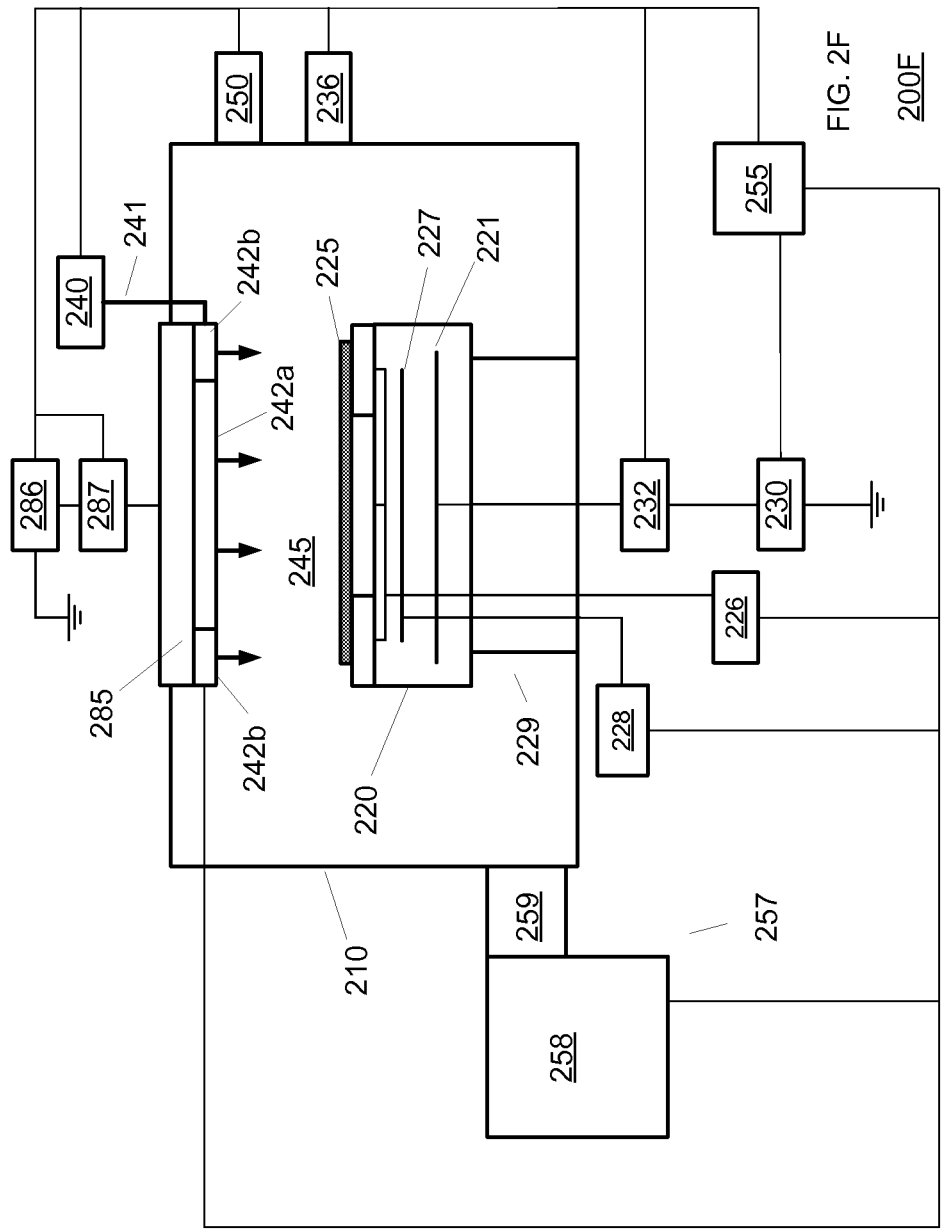

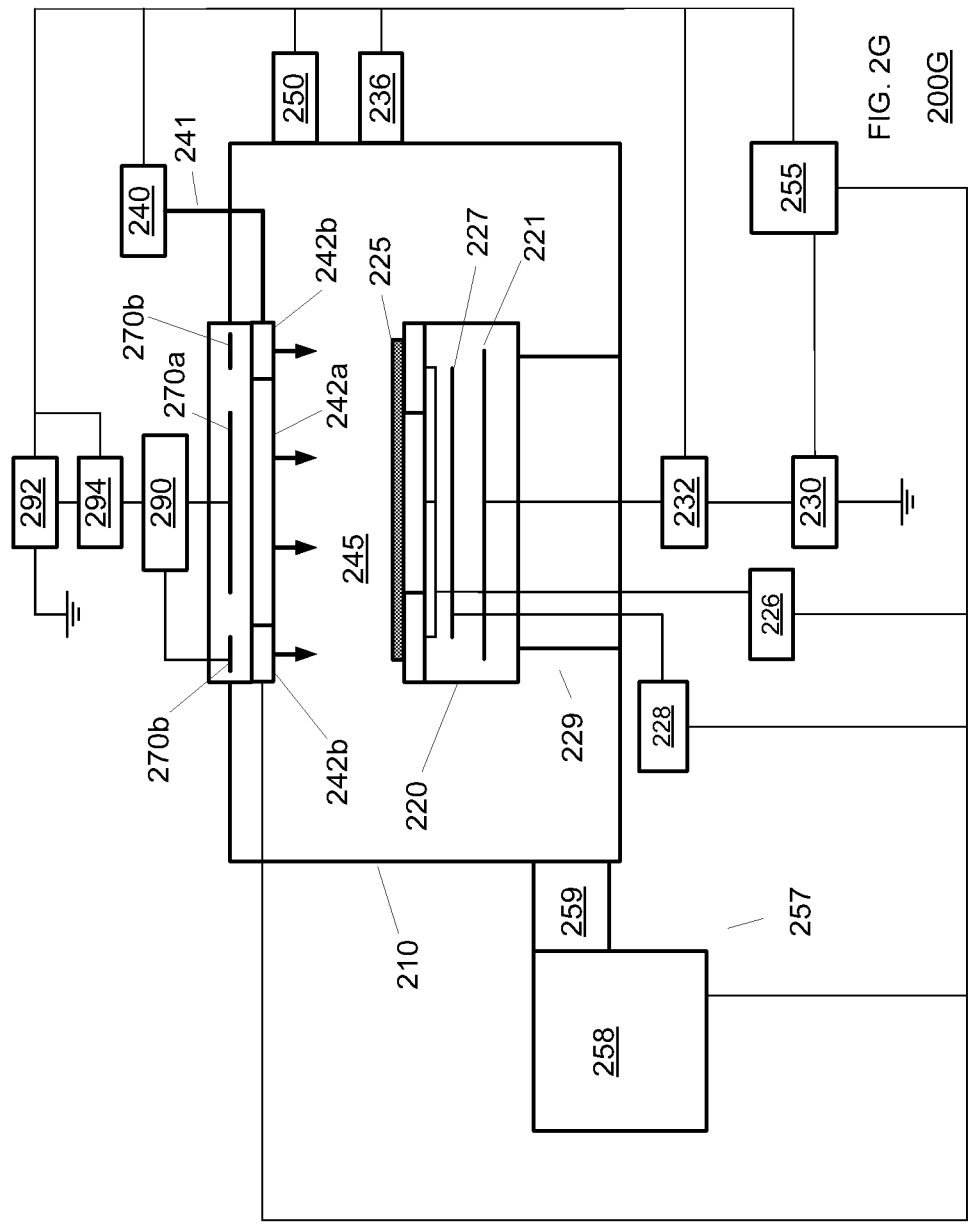

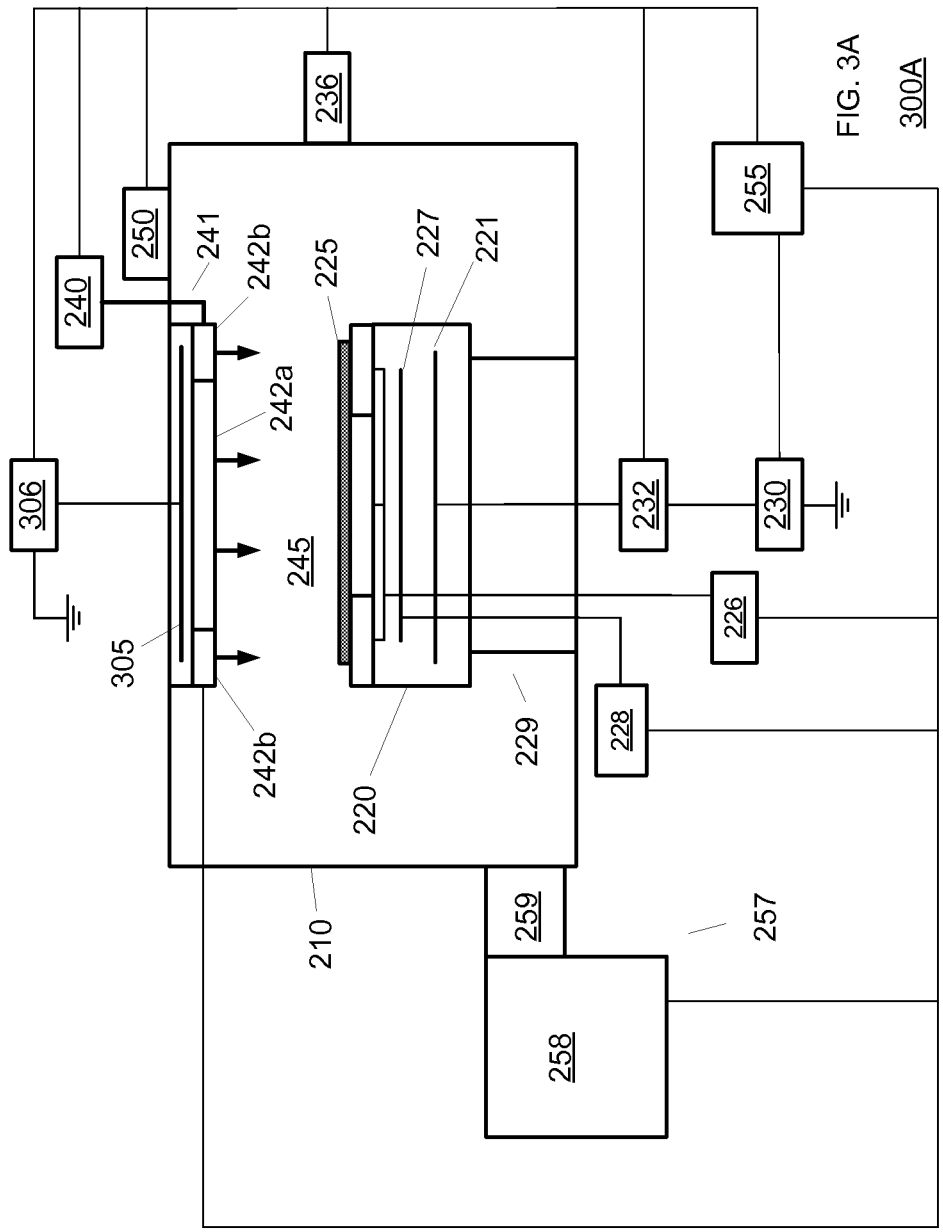

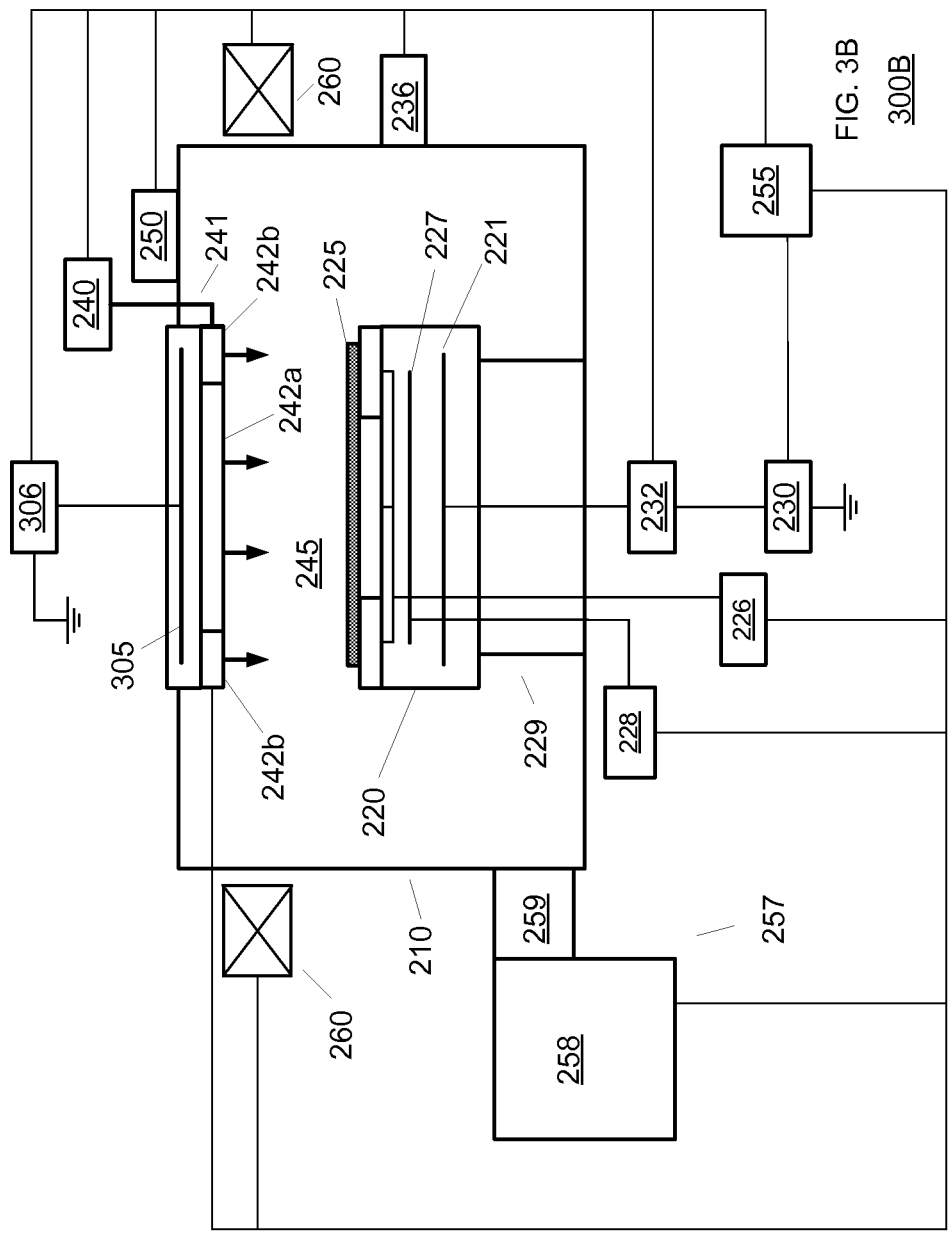

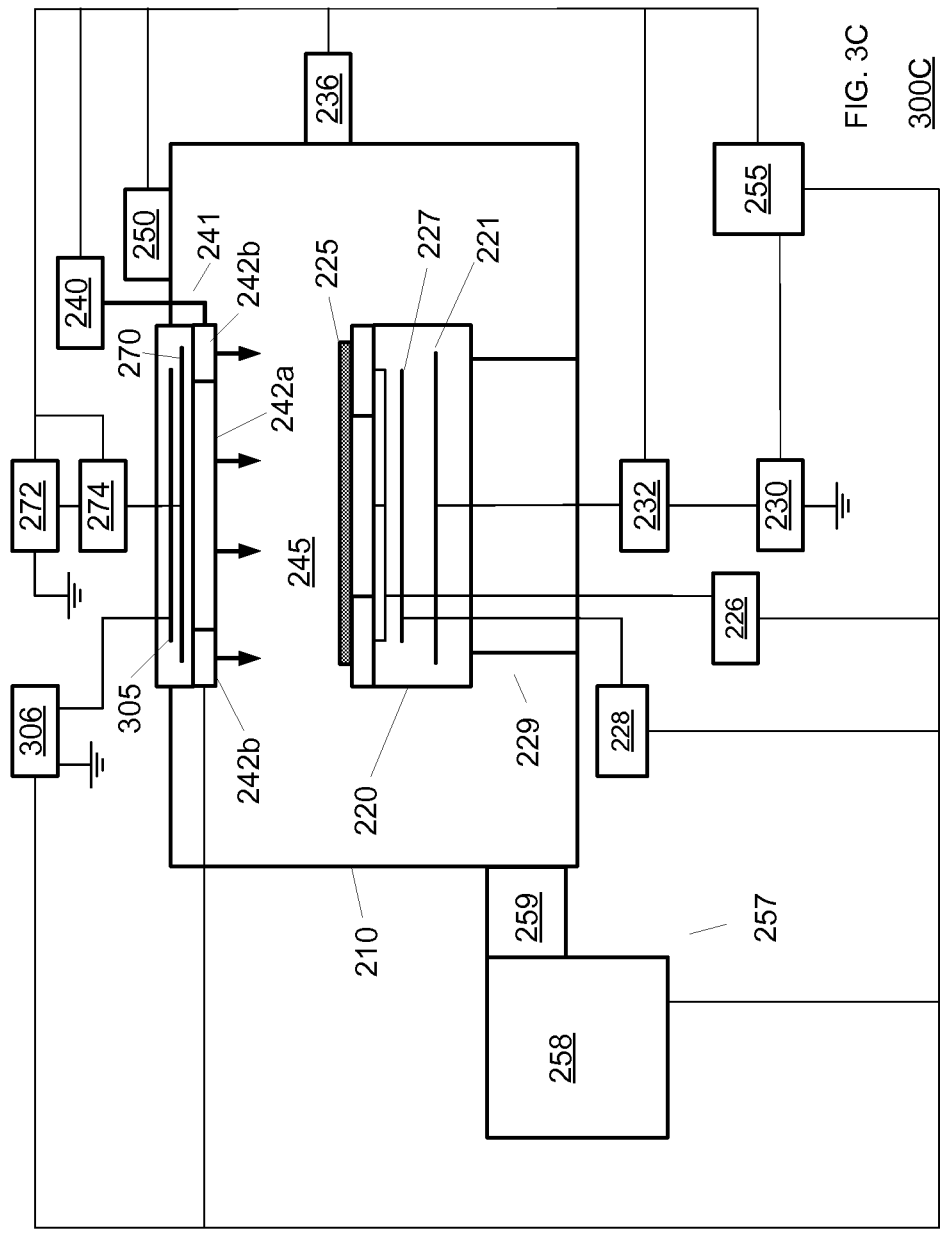

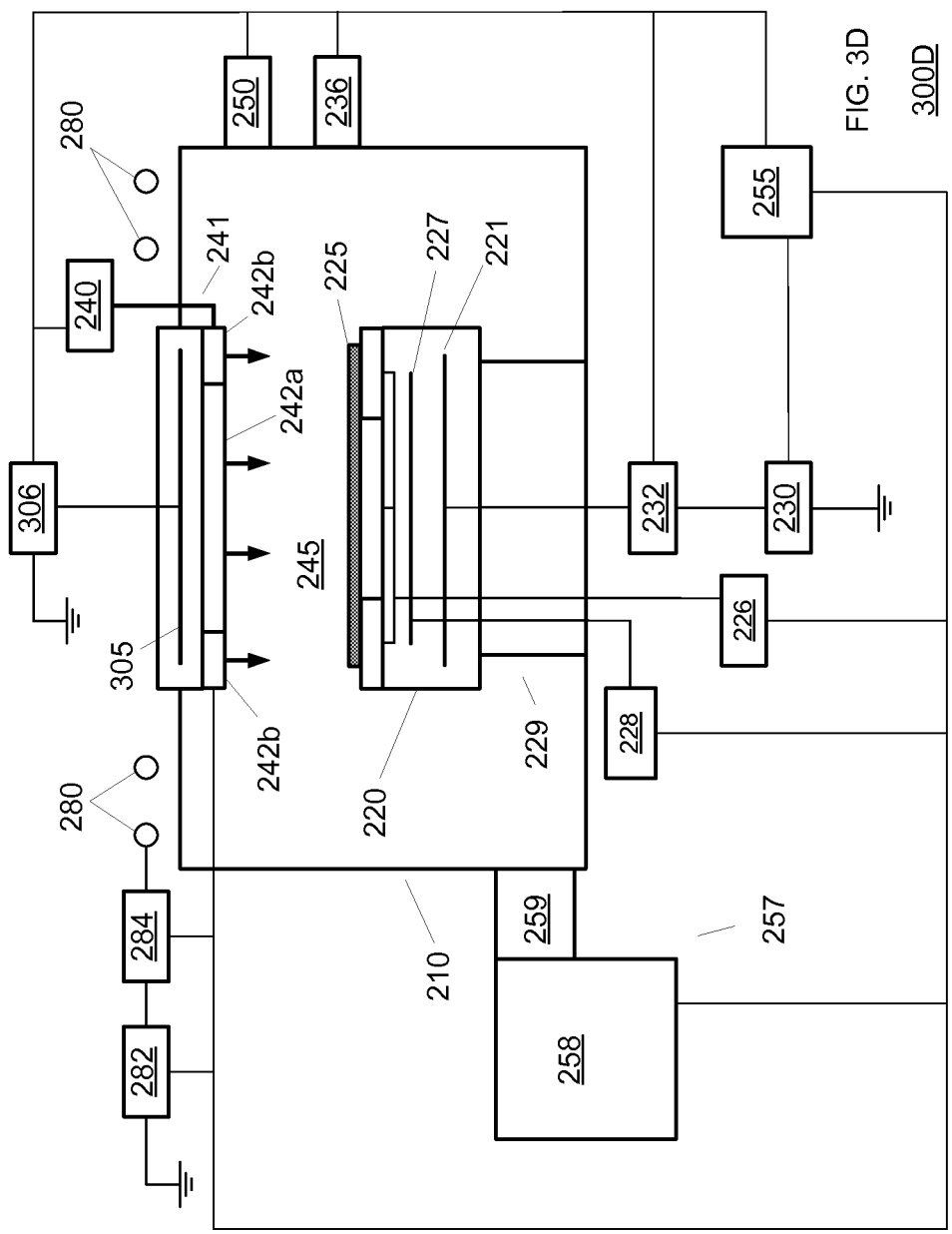

300E

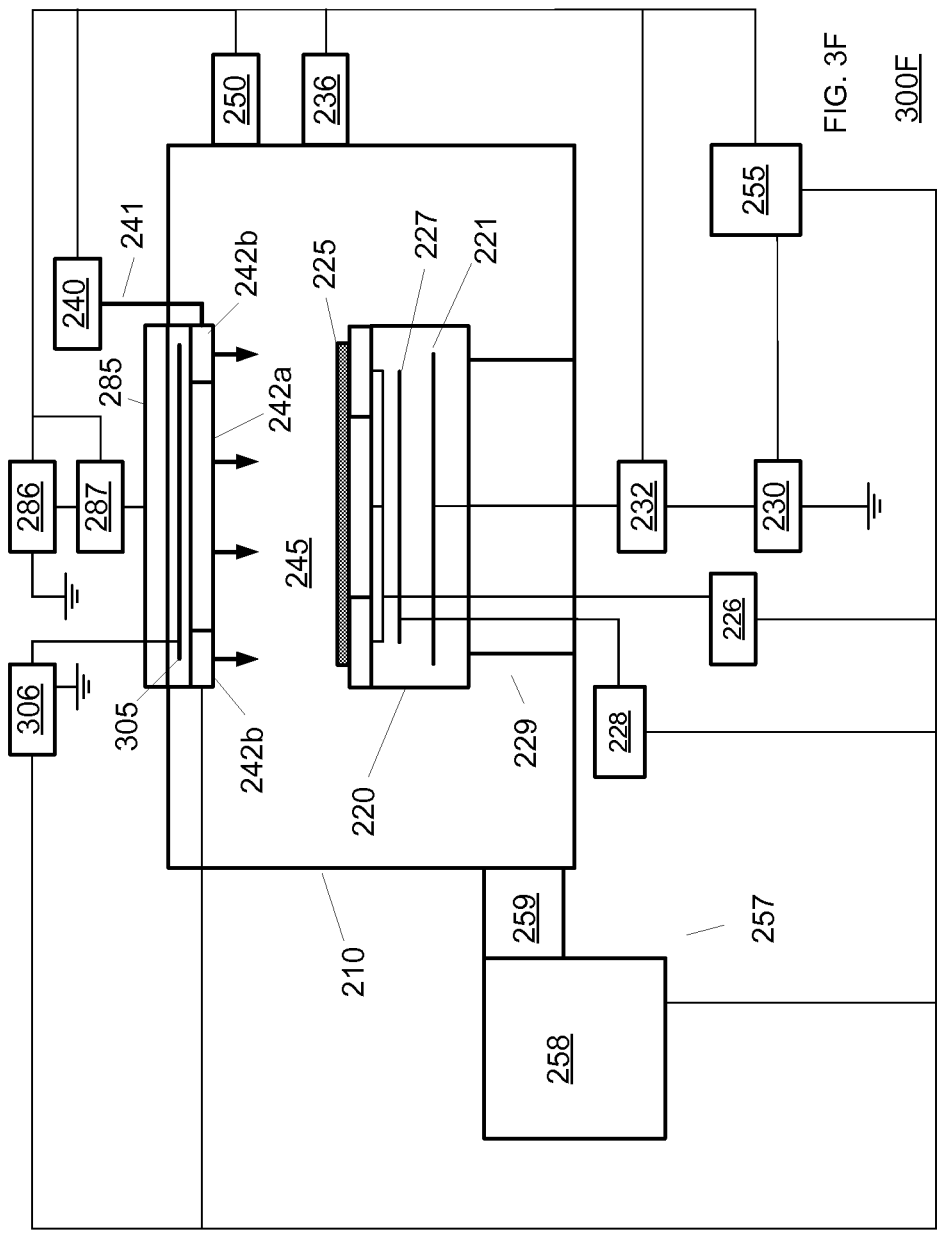

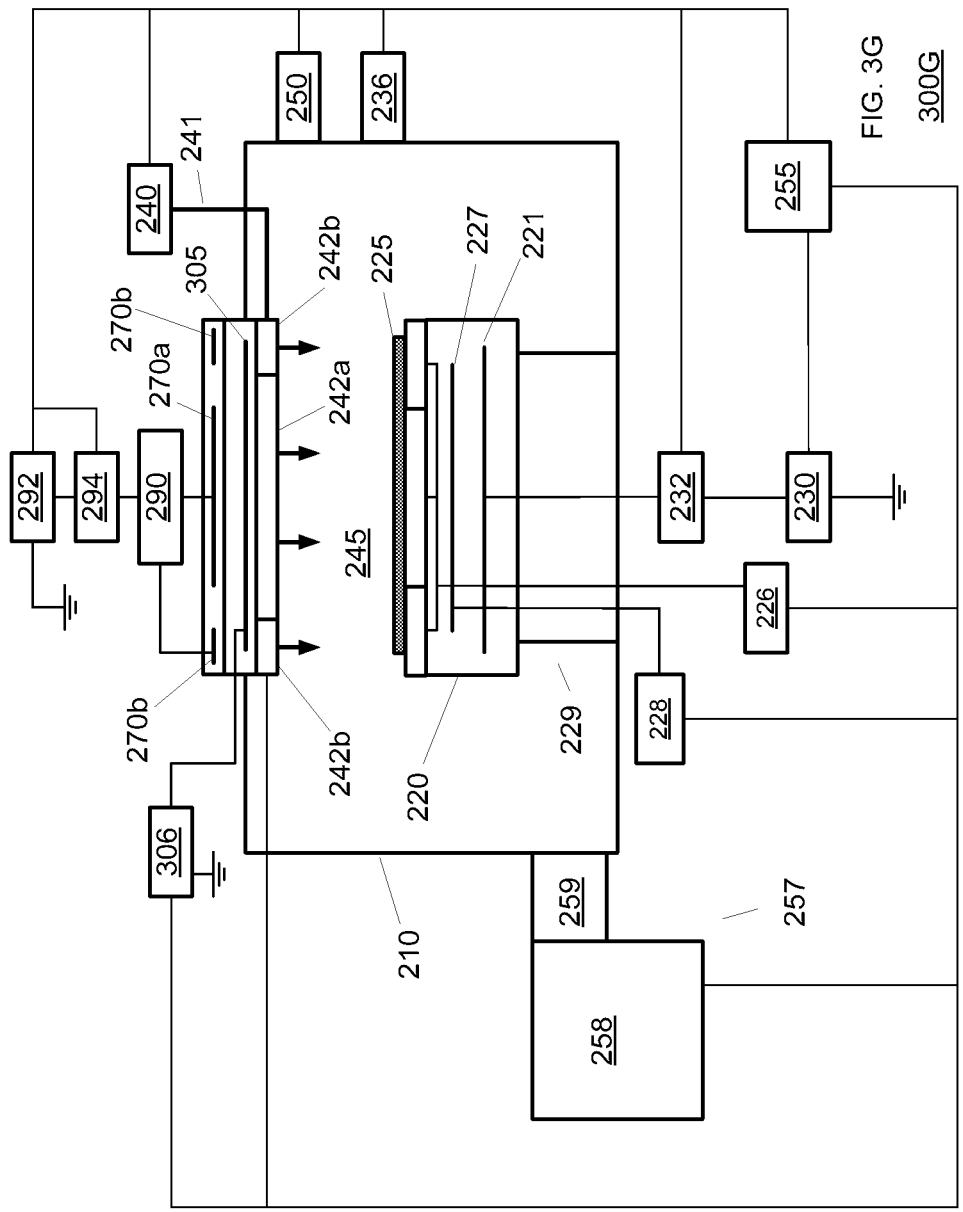

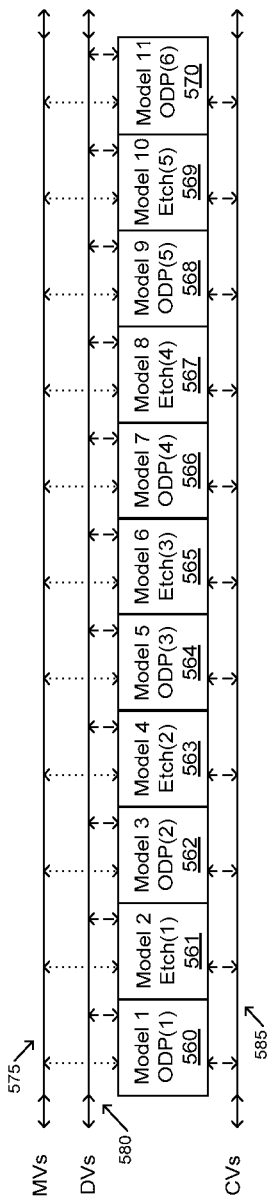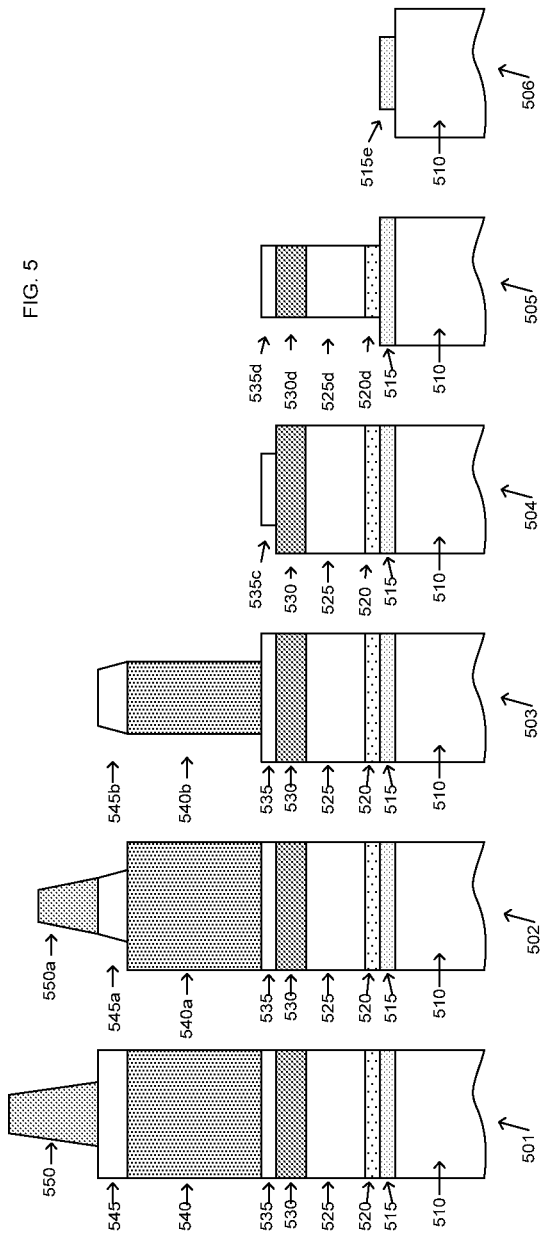
FIG. 5

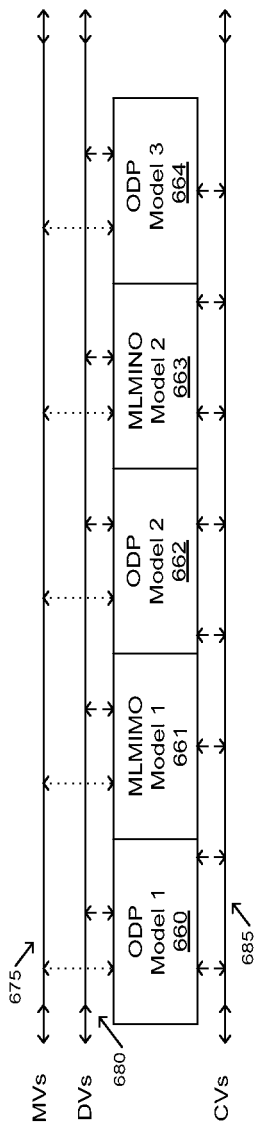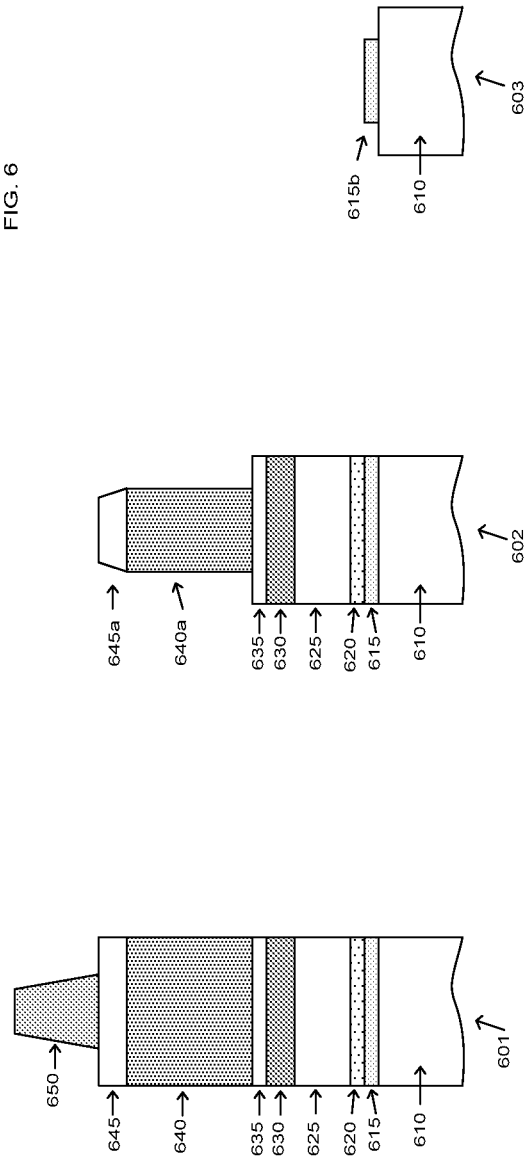
FIG. 6

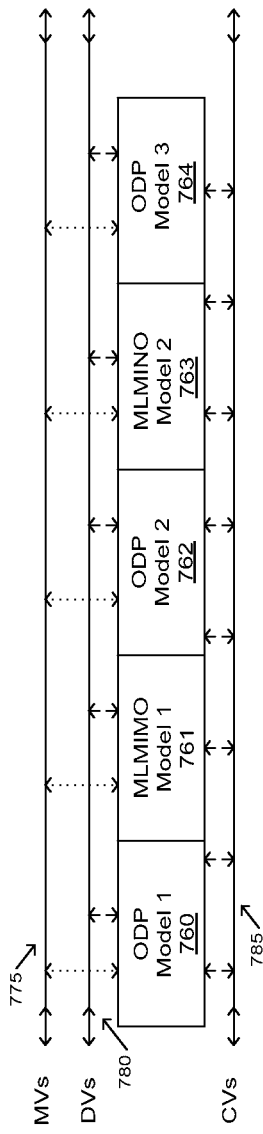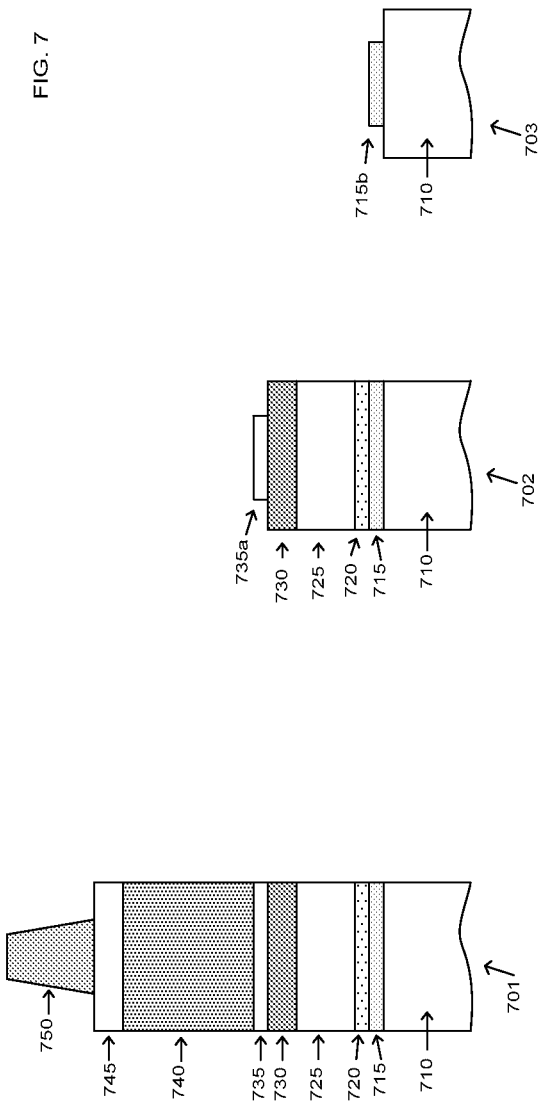
FIG. 7

1100

USING VACUUM ULTRA-VIOLET (VUV) DATA IN RADIO FREQUENCY (RF) SOURCES

CROSS-REFERENCE TO RELATED APPLICATIONS

This application is related to co-pending U.S. patent application Ser. No. 13/275,964, entitled "Using Vacuum Ultra-Violet (VUV) Data in Microwave Sources", filed on even date herewith. This application is related to Provisional Application 61/394,290 filed on Oct. 18, 2010 entitled "Using VUV Data and Electron Energy Distribution Data in Radio Frequency (RF) Sources". This application is related to Provisional Application 61/394,303 filed on Oct. 18, 2010 entitled "Using VUV Data and Electron Energy Distribution Data in Microwave Sources", and the contents of these applications are herein incorporated by reference in their entireties.

BACKGROUND OF THE INVENTION

1. Field of the Invention

The present invention relates to substrate processing, and more particularly to apparatus and methods for creating gate structures on a substrate in real-time using Vacuum Ultra-Violet (VUV) data and Electron Energy Distribution Function (EEDƒ) data and associated (VUV/EEDƒ) procedures in Radio Frequency (RF) etch systems.

2. Description of the Related Art

Etch process behavior is inherently non-linear and inter-acting step-to-step (layers) or as process stacks are compiled (etch/cvd/implant). With the knowledge of the process interactions based on physical modeling of Tokyo Electron Limited (TEL) chambers and base processes and empirical data and measurements from process refinement and tuning the control of Critical Dimension (CD), Sidewall Angle (SWA), depths, film thicknesses, over etching, undercuts, surface cleaning and damage control can be recursively calculated and optimized using multi-input multi-output non-linear models. Current low cost products use a bulk silicon technology. As the transistor continues to shrink, the impact of the channel depth is becoming critical (ultra-shallow source/drain extensions). As the Silicon-On-Insulator (SOI) film shrinks, smaller variations in the gate and/or spacer thickness and thickness of the SOI film can affect the transistor's performance. When etch procedures are not controlled, the removal of the material near the gate affects the electrical performance.

Current high performance microprocessors use PD SOI (partially depleted Silicon-on-Insulator film—giving a threshold voltage of about 0.2 volts. PD SOI films are around 50 nm thick while the gate and/or spacer reduction amount can be a large percentage (10%) of the total gate and/or spacer thickness. Future generations of SOI films are called FD SOI (fully depleted giving a threshold voltage 0.08 volts and a thickness of ~25 nm). Currently these films are not in production due to limitations in thickness uniformity control and defects. Channel mobility degrades with decreasing SOI thickness. With thinner films, the control of the gate structures becomes more critical.

SUMMARY OF THE INVENTION

The invention can provide apparatus and methods for creating gate structures on a substrate in real-time using Vacuum Ultra-Violet (VUV) data and Electron Energy Distribution Function (EEDƒ) data and associated (VUV/EEDƒ) procedures in Radio Frequency (RF) etch systems. The (VUV/EEDƒ) procedures can include multi-layer-multi-step processing sequences and (VUV/EEDƒ) models that can include Multi-Input/Multi-Output (MIMO) models.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2G shows exemplary block diagrams of etch systems in accordance with embodiments of the invention;

FIGS. 3A-3G shows exemplary block diagrams of additional etch systems in accordance with embodiments of the invention;

FIG. 5 illustrates an exemplary view of a multi-step processing sequence for creating a metal gate structure in accordance with embodiments of the invention;

FIG. 6 illustrates an exemplary view of a second multi-step modeling sequence for creating a metal gate structure in accordance with embodiments of the invention;

FIG. 7 illustrates an exemplary view of a third multi-step modeling sequence for creating a metal gate structure in accordance with embodiments of the invention;

DETAILED DESCRIPTION

Figure 1:
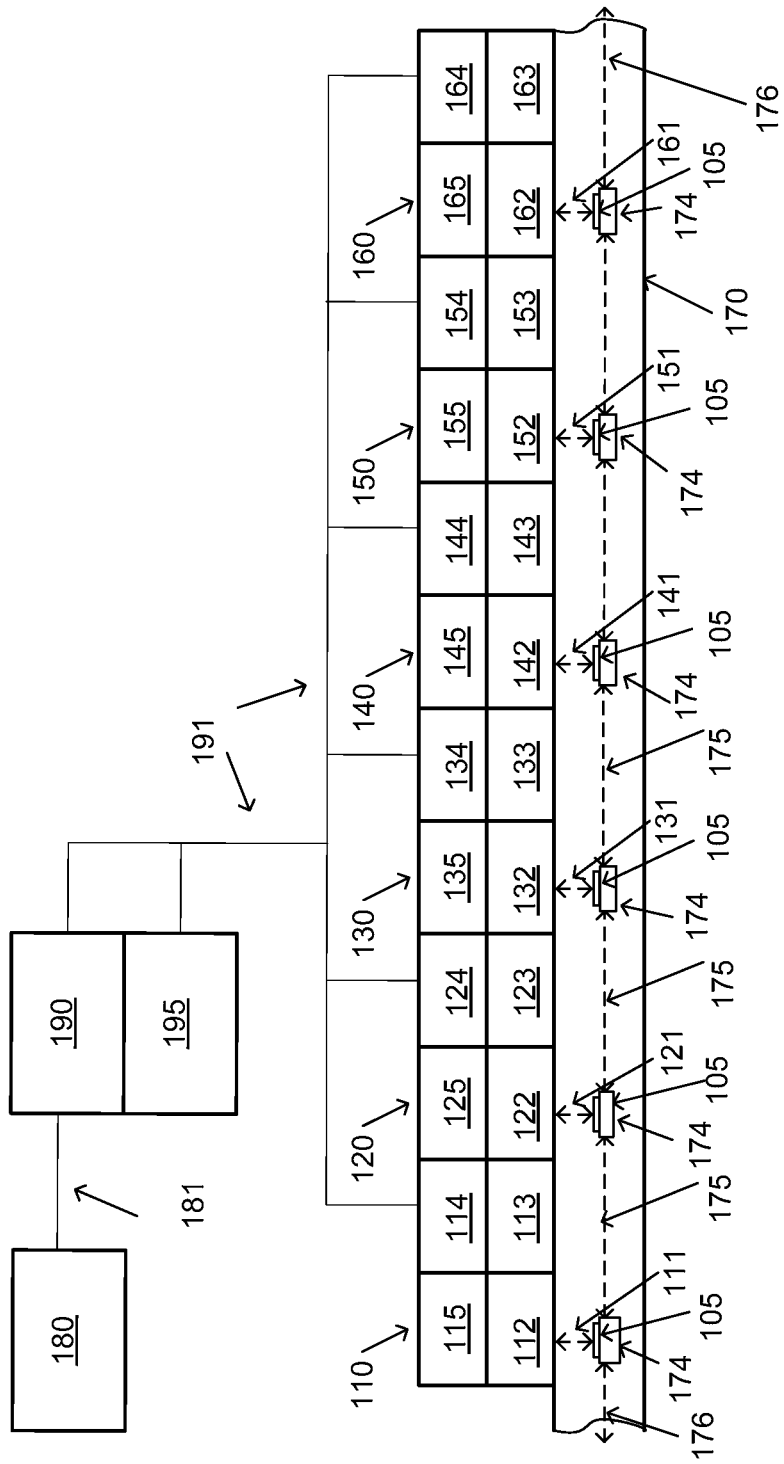
FIG. 1 shows an exemplary block diagram of a processing system in accordance with embodiments of the invention.

The (VUV/EEDƒ) model can be subdivided into layers of a finite granularity based on the application need. Each layer can be a physical material, with layer separation denoted by material changes or dimensional layer boundaries. Layers can be a combination of layers, such as metal gate stack layers and subsequent spacer deposition and etching of the spacer layer covering the metal gate layers. Layers can be mapped to etch steps with time or End Point Detection (EPD) being used to separate the steps. Additionally a continuous real-time controller can run with real-time updates from a combination of metrology data, sensors, and etch models.

In various plasma systems, the EEDƒ performance of the process chamber can be dependent on gaseous species and one or more Langmuir probes can be used to obtain EEDƒ data. In addition, the EEDƒ performance may be dependent on other process parameters.

In some examples, the EEDƒ optimized process can be an energetically de-coupled process in which the ionization electron population is separate from the dissociation/VUV-excitation population. For example, an energetically de-coupled EEDƒ process with a higher ionization population can produce $n_e$ efficiently with a lower <E> in the process chamber. In addition, an energetically de-coupled plasma source like an RLSA source can produce diffusion plasma where the wafer-region is quiescent. During some tests, strong VUV absorption has been observed by neutrals in RLSA plasma at pressures >50 mT for $N_2$, Ar, and $O_2$ plasma, and at pressures <50 mT, much weak VUV absorption was observed, which usually gives the highest VUV current at the wafer level.

During various experiments, VUV sensor measurements and Langmuir probe measurements were made at the top of the chamber, the middle portion of the chamber, and the bottom portion of the process chamber, and the middle portion is usually the highest for He plasma. In some examples, resonance conditions can occur in the bulk plasma in the middle portion of the process chamber. Alternatively, resonance conditions may occur in other regions of the process chamber.

When the He discharge is compared to the $N_2$, Ar, and $O_2$ discharge, the data showed that the He discharge is quicker and more stable in the current test configuration. For example, He plasma has much larger ionization potential compared to other molecules, and this can be the reason that He plasma is immune to small fluctuations of power, pressure, and flow rate.

During various experiments, VUV induced current was measured using SiN (<250 nm photons) for $N_2$, Ar, $O_2$, and He Plasmas for power levels vary from about 1000 W to about 4000 W; the pressure can vary from about 10 mT to about 500 mT. For example, the Ar plasma can have signals at one or more of the wavelengths: 104.82 nm, 106.66 nm, and 876.06 nm; the N plasma can have signals at one or more of the wavelengths: 149.26 nm, 149.47 nm, 119.96 nm, 113.50 nm, 124.32 nm, 141.19 nm, and 692.70 nm; and the O plasma can have signals at one or more of the wavelengths: 130.22 nm, 130.49 nm, 130.60 nm, and 102.58 nm. Alternatively, other wavelengths may be used.

Some of the VUV sensors with dielectric films seemed to be easily damaged by direct exposal of MW irradiation and this damage data can be used to establish threshold values for some process chambers.

In some examples, strong VUV absorption by neutrals has been observed in RLSA plasma for $N_2$, Ar, and $O_2$ plasma, and higher absorption is usually observed at higher pressure. In addition, the VUV absorption by neutrals, the reduction of VUV current could also be related to the EEDF change in which high energy electrons are quickly thermalized with increasing distance from the top of the process chamber, and this effect is also more prominent at higher pressure.

In other examples, VUV photons can be absorbed, quenched, and re-emitted and the EEDƒ data can change, and this can make the understanding of the experimental data more difficult. For example, the general trend shown in the experimental results has clearly indicated the dramatic reduction of the VUV current (or plasma-induced current) in RLSA plasma with the increasing distance from the top plate (i.e., plasma generation region). The results from this VUV measurement would reinforce the understanding on the decoupled nature of the RLSA plasma.

In still other examples, sensor calibration can be complicated, and the sensor calibration can be related to the position, the power, gas type, etc.

VUV intensity in the RLSA plasma continually decreases with the distance, which is quite different from the ICP plasma, and this may imply that in the ICP plasma there exist bulk plasma heating by weak RF E-field that can result in higher mean electron energy and stronger VUV irradiation. VUV irradiations are much stronger in the ICP plasma than in the RLSA plasma even without density normalization, implying much higher ionization efficiency in RLSA plasma.

VUV radiations in RLSA decrease at high pressure but can be saturated at low pressure, which is different from the ICP plasma in which VUV radiation always increases. This may imply that there exist bulk plasma heating in the ICP plasma by a weak RF E-field that then results in higher mean electron energy and stronger VUV radiations (local radiations>absorption in the ICP plasma).

VUV radiations are much stronger in the ICP plasma than in RLSA (~ax) even without density normalization, implying much higher ionization efficiency in RLSA plasma.

In some experiments, trace-amount of $O_2$ addition (~1%) increases the VUV intensity significantly, and the EEDƒ data should not have been modified by this trace-amount of foreign gas addition. With further increasing $O_2$ addition, VUV intensity starts to decline with $O_2$ addition in the ICP plasma. This follows the general trend of VUV absorption by $O_2$ and EEDƒ should also be changed by $O_2$ addition. However, it appears that there is second peak near 30% $O_2$ addition in RLSA. With further increase of $O_2$, it starts to decrease as that in the ICP plasma but relatively slowly. One possible reason that may explain the second peak that can happen in the RLSA plasma; but less possible in the ICP plasma because the RLSA plasma has lower mean electron energy than the ICP plasma.

In some examples, the RLSA VUV intensity has only a (×5) increase, while the ICP VUV intensity has a (×35) increase. For example, a higher degree of $O_2$ dissociation would happen in the ICP plasma rather than in the RLSA plasma due to (i) more middle energy electron population affecting the EEDƒ data and/or (ii) more Ar* and O* metastables in the ICP source, which have VUV emissions being transparent in plasma. Ionization and dissociation of $O_2$ by VUV photons emitting (~24 eV) from He would mainly contribute to the reduction of VUV intensity. In addition, $N_e$ would increase dramatically, and He EEDƒ data would also be cooled down with $O_2$ addition in both the RLSA plasma and the ICP plasma.

When experiments were performed using He—$N_2$ plasma, the VUV data vs. the $N_2$ flow rate data showed that the ICP data is similar to the $O_2$ addition case, but the amount of increase is less (×4) and the decline at higher $N_2$ flow rate is slower. In addition, the RLSA system also showed a (×4) increase in VUV intensity with $N_2$ addition, it increases much slowly and the decline at higher $N_2$ flow rate is also much slower than the ICP plasma.

Adding $N_2$ in the RLSA plasma may gradually modify the EEDƒ of the plasma even with small addition of $N_2$. Efficient ionization of $N_2$ ($N_2^+$) is more likely taken place in the RLSA plasma than to be dissociated into N radicals like that in the ICP plasma, and this can account for the different effects of $N_2$ addition. Ionization and dissociation of $N_2$ by VUV photons emitting (~21 eV) from He would mainly contribute to the reduction of VUV intensity. Because the $N_e$ can increase dramatically, the He EEDƒ data can also be cooled down by adding $N_2$ in both the RLSA system and ICP system.

When experiments were performed using Ar—$O_2$ plasma, the VUV data vs. $O_2$ flow rate data showed that the trace-amount of $O_2$ addition (~1%) increases the VUV intensity significantly. For example, the EEDƒ data should not have been modified by this trace-amount of foreign gas addition. With further increasing $O_2$ addition, VUV intensity starts decline with $O_2$ addition. This follows the general trend of VUV absorption by $O_2$ and EEDf should also be changed by $O_2$ addition. The RLSA data has only a (×5) increase, while ICP VUV intensity has a (×14) increase. In addition, the higher degree of $O_2$ dissociation can occur in the ICP plasma rather than in the RLSA plasma due to (i) more middle energy electron population affecting the EEDƒ data, and/or (ii) more Ar* and O* metastables in the ICP plasma which have VUV emissions being transparent in plasma.

When experiments were performed using Ar—$N_2$ plasma, the VUV data vs. the $N_2$ flow rate data showed that the ICP data is similar to the $O_2$ addition case, but the amount of increase is less (×7), and the decline at higher $N_2$ flow rate is slower. The RLSA data also had a (×4) increase in VUV intensity with $N_2$ addition at a middle position. For example, the VUV intensity increase much slower, and VUV intensity became saturated at 20% $N_2$ addition, which is actually the VUV intensity of pure $N_2$. Adding $N_2$ in the RLSA plasma may gradually modify the EEDƒ of the plasma even with small addition of $N_2$. Efficient ionization of $N_2$ ($N_2^+$) is more likely taken place in the RLSA plasma than to be dissociated into N radicals like that in the ICP plasma, and this can account for the different effects of the $N_2$ addition.

When experiments were performed using He—$O_2$ plasma, VUV vs. $O_2$ flow rate data shows that a trace-amount of $O_2$ addition (~1%) increases the VUV intensity significantly. With further increasing $O_2$ addition, VUV intensity starts decline with $O_2$ addition in the ICP plasma. This follows the general trend of VUV absorption by $O_2$ and EEDf should also be changed by $O_2$ addition. However, it appears that there is second peak near 30% $O_2$ addition in the RLSA plasma. With further increase of $O_2$, it starts to decrease as that in the ICP plasma but relatively slowly. One possible reason that may explain the second peak that can happen in the RLSA plasma; but less possible in the ICP plasma because the RLSA plasma has lower mean electron energy than the ICP plasma.

In some experiments, the RLSA data showed a (×5) increase, while ICP VUV intensity had a (×8) increase. Higher degree of $O_2$ dissociation would happen in the ICP plasma rather than in the RLSA plasma due to (i) more middle energy electron population affecting EEDƒ data; and/or (ii) more Ar* and O* metastables in the ICP plasma, which have VUV emissions being transparent in plasma. Ionization and dissociation of $O_2$ by VUV photons emitting (~21 eV) from He would mainly contribute to the reduction of VUV intensity. In addition, $N_e$ would increase dramatically, and the He EEDƒ data can also be cooled down using the $O_2$ addition in both the RLSA plasma and the ICP plasma.

In some plasma systems, the following mechanisms can contribute to the significant increase of Ar and He VUV intensity when trace-amounts of $O_2$ and/or $N_2$ are added within the process chamber: In some cases, the EEDƒ effect can be the mechanism. For example, the threshold energy ($O_{E-th}$, $A_{E-th}$, $He_{E-th}$) for exciting the ground state electrons to the first excited state, i.e. threshold energy for VUV emission can vary. For example, because the O atoms have lower $E_{th}$ thresholds, more electrons can be involved into VUV excitations, but this effect alone cannot match the much higher VUV intensity increase.

In other examples, the metastable state effects can be the mechanism. For example, Ar metastables (Ar*) interacting with $O_2$ moleculars can dissociate $O_2$. The O atoms can then be excited by Ar* again or by high energy electrons then decay to lower metastable or ground states with emission of VUV photons. In addition, the O atoms have more low energy metastables than Ar. Then, those emissions involving these metastables would be transparent in the plasma. Furthermore, these atomic physics processes and other similar processes can greatly increase the VUV intensity when trace-amounts of $O_2$ or $N_2$ are added.

In still other cases, excimer effects can be the mechanism. For example, the $Ar^{2*}$ excimer can have an energy state that is almost the same as an O atom's first excited state. Therefore, resonant energy can be transferred to O atom and excite O atom. The resonant energy can decay with VUV emission, and this can be an efficient process. In addition, this process relies on the $Ar^{2*}$ density, which would be quite few because the low pressure. However, it is a possible mechanism that can increase VUV efficiently by adding trace-amount of $O_2$ into Ar plasma if the amount of $Ar^{2*}$ is not negligible.

The plasma experiments demonstrated that the VUV absorption by neutral is very similar between the RLSA plasma and the ICP plasma. However, the normalized VUV current of the ICP plasma is >~6 times that of the RLSA plasma. For example, the normalization was done by roughly (×6) based on previous data. However, the ICP plasma density drops a little bit faster than the RLSA density with distance from the top of the process chamber. In order to compare the RLSA VUV and the ICP VUV, the VUV current was normalized to the same plasma density. The RLSA plasma has much lower VUV emission and one of the following can be the reason: (i) lower mean electron energy especially in the lower high-energy group; (ii) lower dissociation of molecule than in the ICP plasma.

The VUV intensity in the RLSA plasma continually decreases with the distance from the top of the process chamber, which is quite different from the ICP plasma. This may imply that in the ICP plasma there exist bulk plasma heating by a weak RF E-field that then results in higher mean electron energy and stronger VUV irradiations. For example, VUV irradiations are much stronger in the ICP plasma than in the RLSA plasma even without density normalization, implying that much higher ionization efficiency in the RLSA plasma. For the same chamber volume and quartz window thickness, the RLSA plasma has much lower mean electron energy at wafer level than the ICP plasma (~×0.5) at the same pressure and 2000 W source power.

In some examples, a diffusion plasma can have a quiescent, uniform, low temperature plasma near wafer region, and the wafer process region can be decoupled from the hot, non-uniform source of discharge.

These optical emission lines need high-energy electrons to first excite ground state of neutrals to highly excited states. Therefore, the intensity of these emission lines is related to the electron population that excites and emits VUV photons. The ICP plasma has much higher intensity of optical emission lines that involve high-energy electrons compared to that of the RLSA plasma, which then verified the EEDƒ and VUV sensor results.

VUV irradiation from one or more RLSA microwave plasmas and one or more RF-ICP plasmas have been investigated as a function of power, pressure, and distance from plasma source. In general, the RLSA microwave plasma has much lower VUV irradiation than the RF-ICP plasma while maintaining a higher plasma density. EEDƒ measurements of the RLSA microwave plasmas and the RF-ICP plasmas revealed that the RLSA microwave plasmas have higher ionization electron populations with a lower dissociation/VUV excitation electron populations as compared to the RF-ICP plasma. The RLSA microwave plasmas can provide a higher electron density while maintaining a constantly low bulk Te, rending a highly decoupled plasma source.

Strong VUV absorption by neutrals has been observed in the RLSA plasma for $N_2$, Ar, and $O_2$ plasma. Higher absorption is usually observed at higher pressure. Besides the VUV absorption by neutrals, the reduction of VUV current could also be related to the EEDƒ data changes in which high energy electrons are quickly thermalized with increasing distance from the top of the process chamber, and this effect is also more prominent at higher pressures.

For example, the VUV photons can be absorbed, quenched, and re-emitted, and this along with the EEDƒ data changes can make the understanding of the experimental data more difficult. However, the general trend shown in the experimental results has clearly indicated the dramatic reduction of the VUV current (or plasma-induced current) in the RLSA plasma with the increasing distance from the top of the process chamber (i.e., plasma generation region). In addition, the results from the VUV measurement can be used to reinforce the understanding on the decoupled nature of the RLSA plasma.

It is known in the art that vacuum ultraviolet (VUV) radiations generated in low temperature plasmas (e.g., CCP and ICP) can cause wafer damage, alteration of morphology of polymers and electrical properties of dielectrics. For example, electron-hole pairs generated in dielectric films by VUV radiations can be trapped in dielectrics and interfaces, and this can result in charge buildup and dielectric breakdown as well as the decrease of device reliability. In addition, synergistic effects of VUV exposure and energetic ion bombardment have been addressed to increase photoresist roughening.

The invention provides improved device and plasma process reliability by monitoring and evaluation of plasma generated VUV radiations. For example, RLSA plasma sources can operate within a wide power and pressure window and can be used to produce large area plasmas of high density. Due to its inherent diffusion characteristics, apart from the discharge source, quiescent, a uniform, and low-temperature Maxwellian plasma near wafer region can be obtained. Therefore, understanding the spatial evolution of VUV irradiations in the RLSA plasma can help the development of microwave surface-wave plasma based hardware and the design of process recipes.

In addition, some of the ICP (RF) plasma sources can produce a diffusion plasma. Therefore, understanding the spatial evolution of VUV irradiations in the ICP (RF) plasma sources can help the development of RF plasma sources based on the hardware and the design of process recipes.

DOEs can be run to model the process gain of each potential control knob and the interactions of the inputs and outputs associated with each layer, and the interactions and gains of process control loops layer to layer. A method of determining interaction between each control knob and output can be used to evaluate and optimize the model stability such as Relative Gain Array (RGA). This information can also drive setup of individual feedback loops that are non-interacting.

(VUV/EEDƒ) modeling is used to calculate the optimum inputs for a set of goals (or targeted outputs). Constraints can be ranges of process parameters such as time, gas flows, and temperature by layer. During (VUV/EEDƒ) model development, a set of weightings can be applied to guide the optimizer to prioritize the outputs with most value to the current process calculations at a given time. Target weightings can be used where an equation is applied to the weighting calculation given a target and gain constants that effectively penalize as the optimizer moves away from target in a linear or non-linear way. Targets can be a center target or and limit target (above a given value—for example with SWA).

Feedback can take the form of multiple loops, one for each targeted output with a calculation of the feedback error based on the actual less predicted error. When using a (VUV/EEDƒ) model, each predicted output error can be calculated and matched with the feedback measurements to determine the real error. Feedback filtering methods such as EWMA or Kalman filters can be used to filter noise. Outputs from a controller associated with a multi-step sequence can include a goodness of fit value, and this GOF value can then be used as the input to a cascaded controller.

Controllers can calculate (VUV/EEDƒ) data updates at different times as the processing steps are performed, and the controller to calculate new (VUV/EEDƒ) data updates based on past calculations, errors of calculations, changes in tool state, or material state, and then incorporate the updated (VUV/EEDƒ) data into the most recent (VUV/EEDƒ)-related procedures and/or models.

In some multi-step sequences, when the resist parameters are measured, they can be used for feed forward, and can be weighted based on previous substrates feedback and chamber state information. At the beginning of a Lot, the (VUV/EEDƒ) model can be configured to use the best-known values for the patterned soft mask layer, and these can be weighted to the center of the previous lot's distribution. During the lot processing, the parameters for the soft mask layers and/or the hard mask layers can be measured and filtered using a weighting method such as EWMA to smooth W2W variations and fed back to and translated to a resist SWA and used to update the current feed forward SWA value. The SWA pattern analysis function can group bimodal patterns so two threads can be managed to feedback and/or feed forward data. In one example, the SWA W2W variation is more commonly driven by scanner stage so two feed forward/feedback threads can be maintained to optimize performance. In a second example, the W2W CD variation from the lithography tool can be dominated by the hot plates, and a multi-variation pattern can be observed. When IM measurements are made after the lithography processes, the pattern across the substrate can be established before substrate processing and the substrate CD and SWA patterns can be established before the substrates are sent to the etcher. When more than one processing threads are used, the thread number can be added as a context item for the substrate. In addition, when the scanner and/or track cell number, scanner module number, and hot plate number are available, they can also be used to group substrates and establish feed forward threads from the Lithography tool to the Etch Tool. Alternatively, other combinations of coater/developers may also be used.

When the substrates are sorted based on context groups, the substrates can be processed based on their group or sequence. When processing order in the etch tool is the same as the processing order in the lithography tool, the current FB controller can be programmed to adjust for W2W for incoming drift inside the lithography tool and for drift inside the etch tool The invention provides apparatus and methods for processing substrates having a large number of semiconductor devices thereon and an even larger number of transistor gate and/or spacer structures. In various embodiments, apparatus and methods are provided for creating and/or using an (VUV/EEDƒ) evaluation library, for performing (VUV/EEDƒ)-related processing sequences that can include one or more measurement procedures, one or more deposition procedures, one or more (VUV/EEDƒ) procedures, and/or one or more verification procedures.

One or more periodic structures can be provided at various locations on a substrate and can be used to evaluate and/or verify (VUV/EEDƒ) procedures. Substrates can have substrate data associated with them, and the substrate data can include real-time and historical data. In addition, the substrate can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with (VUV/EEDƒ)-related substrates can include transfer sequence data that can be used to establish when and where to transfer the substrates, and transfer sequences can be change using operational state data.

The (VUV/EEDƒ) model can be subdivided into layers of a finite granularity based on the application need. Each layer can be a physical material, with layer separation denoted by material changes or dimensional layer boundaries. Layers can be combination of layers of layers, such as a gate stack and a subsequent spacer deposition and etching of the layer covering the gate layers.

Layers can be mapped to etch steps with time or End Point Data (EPD) being used to separate the steps. Additionally a continuous real-time controller can run with real-time updates from a combination of metrology data, sensors, and etch models.

An analytical device used in process control multivariable applications, based on the comparison of single-loop control to multivariable control; expressed as an array (for all possible input-output pairs) of the ratios of a measure of the single-loop behavior between an input-output variable pair, to a related measure of the behavior of the same input-output pair under some idealization of multivariable control When MIMO modeling is used to calculate the optimum inputs for a set of targeted outputs for (VUV/EEDƒ))-related procedures, constraints can be ranges of process parameters such as time, gas flows, and temperature by layer. During optimization, a set of weightings can be applied to guide the optimizer to prioritize the outputs with most value to the current process calculations at a given time. Target weightings can be used where an equation is applied to the weighting calculation given a target and gain constants that effectively penalize as the optimizer moves away from target in a linear or non-linear way. Targets' can be a center target or and limit target (above a given value—for example with SWA).

Feedback can take the form of multiple loops, one for each targeted output with a calculation of the feedback error based on the actual less predicted error. During optimization, each prediction output error needs to be calculated and matched with the feedback measurements to determine the real error. Feedback filtering methods such as Exponentially Weighted Moving Averages (EWMA) or Kalman filters can be used to filter noise. Outputs from one layer controller can include a goodness of fit and this GOF value can then be used as the input of a cascading layer controller.

Layer controllers can contain updates at different times as the processing steps are performed allowing for the controller to make new updates based on past calculations, errors of calculations, changes in tool state or material state then incorporated into the most recent update.

As feature sizes decrease below the 65 nm node, accurate processing and/or measurement data becomes more important and more difficult to obtain. MIMO models and associated (VUV/EEDƒ))-related procedures can be used to more accurately process and/or measure these ultra-small devices and features. The data from an (VUV/EEDƒ))-related procedures can be compared with the warning and/or control limits, when a run-rule is violated, an alarm can be generated indicating a processing problem, and correction procedures can be performed in real time.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used in (VUV/EEDƒ))-related procedures and associated MIMO models.

The system controller 190 can be coupled to the lithography subsystem 110, the scanner subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etch subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more substrates 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more substrates using procedures and/or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to develop, measure, and/or inspect one or more of the patterned masking layers on one or more of the substrates.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more substrates 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, trimming, and cleaning procedures. Evaluation procedures and/or inspection procedures can be used to measure and/or inspect one or more surfaces and/or layers of the substrates. The etch subsystem 130 can be configured as described herein in FIGS. 2A-2G and FIGS. 3A-3G.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled 151 to the transfer subsystem 170. The transfer subsystem 170 can be coupled 151 to the inspection subsystem 150, and one or more substrates 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the metrology subsystem 160, and one or more substrates 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165. The metrology subsystem 160 can comprise one or more processing elements 163 that can be used to perform real-time optical metrology procedures that can be used to measure target structures at one or more sites on a substrate using library-based or regression-based techniques. For example, the (VUV/EED$f$)-related sites on substrate can include MIMO sites, target sites, overlay sites, alignment sites, measurement sites, verification sites, inspection sites, or damage-assessment sites, or any combination thereof. For example, one or more "golden substrates" or reference chips can be stored and used periodically to verify the (VUV/EED$f$)-related procedures using one or more of the processing elements 163, and/or one or more of the evaluation elements 165.

In some embodiments, the metrology subsystem 160 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements.

The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175 and 176) that can be used to receive substrates, transfer substrates, align substrates, store substrates, and/or delay substrates. For example, the transfer elements 174 can support two or more substrates. Alternatively, other transferring means may be used. The transfer subsystem 170 can load, transfer, store, and/or unload substrates based on a (VUV/EEDƒ))-related model, a (VUV/EEDƒ))-related processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof.

In some examples, transfer subsystem 170 can use loading data to determine where and when to transfer a substrate. In other examples, a transfer system can use (VUV/EEDƒ))-related modeling data to determine where and when to transfer a substrate. Alternatively, other procedures may be used. For example, when the first number of substrates is less than or equal to the first number of available processing elements, the first number of substrates can be transferred to the first number of available processing elements in the one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, scanner-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by (VUV/EEDƒ))-related procedures. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by (VUV/EEDƒ))-related procedures. For example, the operational state data for the processing elements can include (VUV/EEDƒ))-related data, availability data, matching data for the processing elements, expected processing times for some process steps and/or sites, yield data, confidence data and/or risk data for the processing elements, or confidence data and/or risk data for one or more (VUV/EEDƒ))-related procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time (VUV/EEDƒ))-related procedures. A controller can receive real-time data from a MIMO optimizer/model (455, FIG. 4) to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the substrate and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed, In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a (VUV/EEDƒ)-related error condition occurs. The MES 180 can provide (VUV/EEDƒ)-related modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from MIMO optimization procedures can be used in subsequent procedures to optimize the process accuracy and precision. Data can be passed to (VUV/EEDƒ)-related procedures in real-time as real-time variable parameters, overriding current model values, and reducing DOE tables. Real-time data can be used with a library-based system, or regression-based system, or any combination thereof to optimize a (VUV/EEDƒ)-related procedure.

When a regression-based library creation procedure is used, measured (VUV/EEDƒ)-related data can be compared to simulated (VUV/EEDƒ))-related data. The simulated data can be iteratively generated, based on sets of (VUV/EEDƒ)-related parameters, to obtain a convergence value for the set of (VUV/EEDƒ)-related parameters that generates the closest match simulated (VUV/EEDƒ))-related data compared to the measured (VUV/EEDƒ))-related data. When a library-based process is used, a (VUV/EEDƒ))-related library can be generated and/or enhanced using (VUV/EEDƒ))-related procedures, recipes, profiles, and/or models. For example, a (VUV/EEDƒ))-related library can comprise simulated and/or measured (VUV/EEDƒ))-related data and corresponding sets of processing sequence data. The regression-based and/or the library-based processes can be performed in real-time. An alternative procedure for generating data for a (VUV/EEDƒ))-related library can include using a machine learning system (MLS). For example, prior to generating the (VUV/EEDƒ))-related library data, the MLS can be trained using known input and output data, and the MLS may be trained with a subset of the (VUV/EEDƒ))-related library data.

(VUV/EEDƒ))-related procedures and/or models can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful (VUV/EEDƒ))-related procedures or processing sequences can report a failure when a limit is exceeded, and successful procedures can create warning messages when limits are being approached. Pre-specified failure actions for procedures errors can be stored in a database, and can be retrieved from the database when an error occurs. For example, (VUV/EEDƒ))-related procedures can reject the data at one or more of the sites for a substrate when a measurement procedure fails.

MIMO models can be used to create, modify, and/or evaluate isolated and/or nested structures at different times and/or sites. For example, gate stack dimensions and substrate thickness data can be different near isolated and/or nested structures, and gate stack dimensions and substrate thickness data can be different near open areas and/or trench array areas. A MIMO model can create optimized data for isolated and/or nested structures to update and/or optimize a (VUV/EEDƒ))-related process recipe and/or process time.

MIMO models can use end-point detection (EPD) data and process time data to improve the accuracy. When EPD data is used to stop an etching procedure, the EPD time data and the process rate data can be used to estimate the amount of etch and/or to estimate a thickness.

In various examples, (VUV/EEDƒ))-related limits can be obtained by performing the (VUV/EEDƒ))-related procedure in a "golden" process chamber, can be historical data that is stored in a library, can be obtained by performing a verified (VUV/EEDƒ))-related procedure, can be obtained from the MES 180, can be simulation data, and can be predicted data. Partial-Etch procedure limits can be obtained by performing the partial-etch procedure in a "golden" processing chamber, can be historical data that is stored in a library, can be obtained by performing a verified partial-etch procedure, can be obtained from the MES 180, can be simulation data, and can be predicted data. partial-etch procedure limits can be obtained by performing the COR-etch procedure in "golden"

processing chambers, can be historical data that is stored in a library, can be obtained by performing a verified partial-etch procedure, can be obtained from the MES 180, can be simulation data, and can be predicted data.

FIGS. 2A-2G show exemplary block diagrams of etch systems in accordance with embodiments of the invention.

A first (VUV/EEDƒ)) etch system 200A is shown in FIG. 2A, and the illustrated (VUV/EEDƒ)) etch system 200A can be used to perform (VUV/EEDƒ))-related procedures. The (VUV/EEDƒ)) etch system 200A can include a process chamber 210, substrate holder 220, upon which a substrate 225 to be processed is affixed, gas supply system 240, and pressure control system 257. For example, substrate holder 220 can be coupled to and insulated from process chamber 210 using base 229. Substrate 225 can be, for example, a semiconductor substrate, a work piece, or a liquid crystal display (LCD). For example, process chamber 210 can be configured to facilitate the generation of plasma in processing region 245 adjacent a surface of substrate 225, where plasma is formed via collisions between heated electrons and an ionizable gas. In addition, gas supply system 240 can be coupled to gas distribution element 241, and the gas distribution elements 241 can be coupled to the gas injection elements (242a and 242b). An ionizable gas or mixture of gases can be introduced via the gas injection elements (242a and 242b), and process pressure is adjusted. Desirably, plasma is utilized to create materials specific to a predetermined material process, and to aid either the deposition of material to substrate 225 or the removal of material from the exposed surfaces of substrate 225. For example, controller 255 can be used to the control the pressure control system 257, the gas supply system 240, and the gas injection elements (242a and 242b).

Substrate 225 can be, for example, transferred into and out of process chamber 210 through a slot valve (not shown) and chamber feed-through (not shown) via robotic transfer system where it is received by substrate lift pins (not shown) housed within substrate holder 220 and mechanically translated by devices housed therein. After the substrate 225 is received from transfer system, it is lowered to an upper surface of substrate holder 220.

For example, substrate 225 can be affixed to the substrate holder 220 via an electrostatic clamping system (not shown). Furthermore, substrate holder 220 can further include temperature control elements 227 and temperature control system 228. Moreover, gas can be delivered to the backside of the substrate via a dual (center/edge) backside gas system 226 to improve the gas-gap thermal conductance between substrate 225 and substrate holder 220. A dual (center/edge) backside gas system can be utilized when additional temperature control of the substrate is required at elevated or reduced temperatures. For example, temperature control elements 227 can include cooling elements, resistive heating elements, or thermo-electric heaters/coolers.

As shown in FIG. 2A, substrate holder 220 includes a lower electrode 221 through which Radio Frequency (RF) power can be coupled to plasma in processing region 245. For example, lower electrode 221 can be electrically biased at an RF voltage via the transmission of RF power from RF generator 230 through impedance match network 232 to lower electrode 221. The RF bias can serve to heat electrons to form and maintain plasma. A typical frequency for the RF bias can range from 1 MHz to 100 MHz and is preferably 13.56 MHz.

Alternatively, RF power may be applied to the lower electrode 221 at multiple frequencies. Furthermore, impedance match network 232 serves to maximize the transfer of RF power to plasma in process chamber 210 by minimizing the reflected power. Various match network topologies and automatic control methods can be utilized.

With continuing reference to FIG. 2A, process gas can be introduced to one or more areas of the processing region 245 through gas injection elements (242a and 242b). Process gas can, for example, include a mixture of gases such as argon, Tetrafluoromethane ($CF_4$) and Oxygen ($O_2$), or argon (Ar), $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, hydrogen bromide (HBr). Gas injection elements (242a and 242b) can be configured to reduce or minimize the introduction of contaminants to substrate 225 and can be coupled to gas supply system 240 using gas distribution elements 241. For example, one or more process gases can be supplied from a gas supply system 240. Gas injection elements (242a and 242b) can provide different flow rates to different regions of the processing region 245. Alternatively, gas injection elements (242a and 242b) may provide different process gasses to different regions of the processing region 245.

For example, pressure control system 257 can include a turbo-molecular vacuum pump (TMP) 258 capable of a pumping speed up to 5000 liters per second (and greater) and a gate valve 259 for controlling the chamber pressure. In (VUV/EEDf)) etch systems utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, (VUV/EEDƒ)) etch system 200A can include one or more VUV/EEDƒ sensor subsystems 250 coupled to process chamber 210 to obtain VUV/EEDƒ-related performance data, and the controller 255 can be coupled to the VUV/EEDƒ sensor subsystems 250 to receive the VUV/EEDƒ-related performance data. For example, the VUV/EEDƒ sensor subsystems 250 can be temperature-controlled and can include dielectric films, such as $SiO_2$, SiN, and $SiN/SiO_2$. In addition, the VUV/EEDƒ sensor subsystems 250 can be silicon ($SiO_2$) p-n junction photodiodes and can include oxide windows.

Process sensors 236 can include those sensors pertaining to the functionality of process chamber 210 such as the measurement of the Helium backside gas pressure, Helium backside flow, electrostatic clamping (ESC) voltage, ESC current, substrate holder 220 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. For example, process sensors 236 can include one or more optical devices for monitoring the light emitted from the plasma in processing region 245 as shown in FIG. 2A. The optical devices can include an Optical Emissions Spectroscopy (OES) sensor that can be used as an End Point Detector (EPD) and can provide EPD data. In addition, one or more VUV/EEDƒ sensor subsystems 250 can be configured for obtaining, analyzing, updating, and/or optimizing VUV data and/or EEDƒ data.

In addition, (VUV/EEDf)) etch system 200A can include one or more process sensors 236 coupled to process chamber 210 to obtain additional performance data, and controller 255 coupled to the process sensors 236 to receive performance data. The process sensors 236 can include a Langmuir probe, current and/or voltage probe, a power meter, or spectrum analyzer. For example, process sensors 236 can include a RF Impedance analyzer. Furthermore, the measurement of an electrical signal, such as a time trace of voltage or current, permits the transformation of the signal into frequency domain using discrete Fourier series representation (assuming a periodic signal). Thereafter, the Fourier spectrum (or for a time varying signal, the frequency spectrum) can be monitored and analyzed to characterize the state of a plasma. One or more VUV/EEDf sensor subsystems 250 can be configured for obtaining, analyzing, updating, and/or optimizing VUV data and/or EEDf data.

Controller 255 includes a microprocessor, memory, and a digital I/O port (potentially including D/A and/or A/D converters) capable of generating control voltages sufficient to communicate and activate inputs to (VUV/EEDf)) etch system as well as monitor outputs from (VUV/EEDf)) etch system. As shown in FIG. 2A, controller 255 can be coupled to and exchange information with first RF generator 230, impedance match network 232, gas supply system 240, gas injection elements (242a and 242b), pressure control system 257, backside gas delivery system 226, temperature control system 228, process sensors 236, and VUV/EEDf sensor subsystems 250. A program stored in the memory is utilized to interact with the aforementioned components of an (VUV/EEDf)) etch system 200 according to a stored process recipe.

In the exemplary embodiment shown in FIG. 2B, the (VUV/EEDf)) etch system 200B can be similar to the embodiment of FIG. 2A and further comprise either a stationary, or mechanically or electrically rotating magnetic field system 260, in order to potentially increase plasma density and/or improve plasma processing uniformity, in addition to those components described with reference to FIG. 2A. Moreover, controller 255 can be coupled to magnetic field system 260 in order to regulate the speed of rotation and field strength. The design and implementation of a rotating magnetic field is well known to those skilled in the art.

Figure 2B:
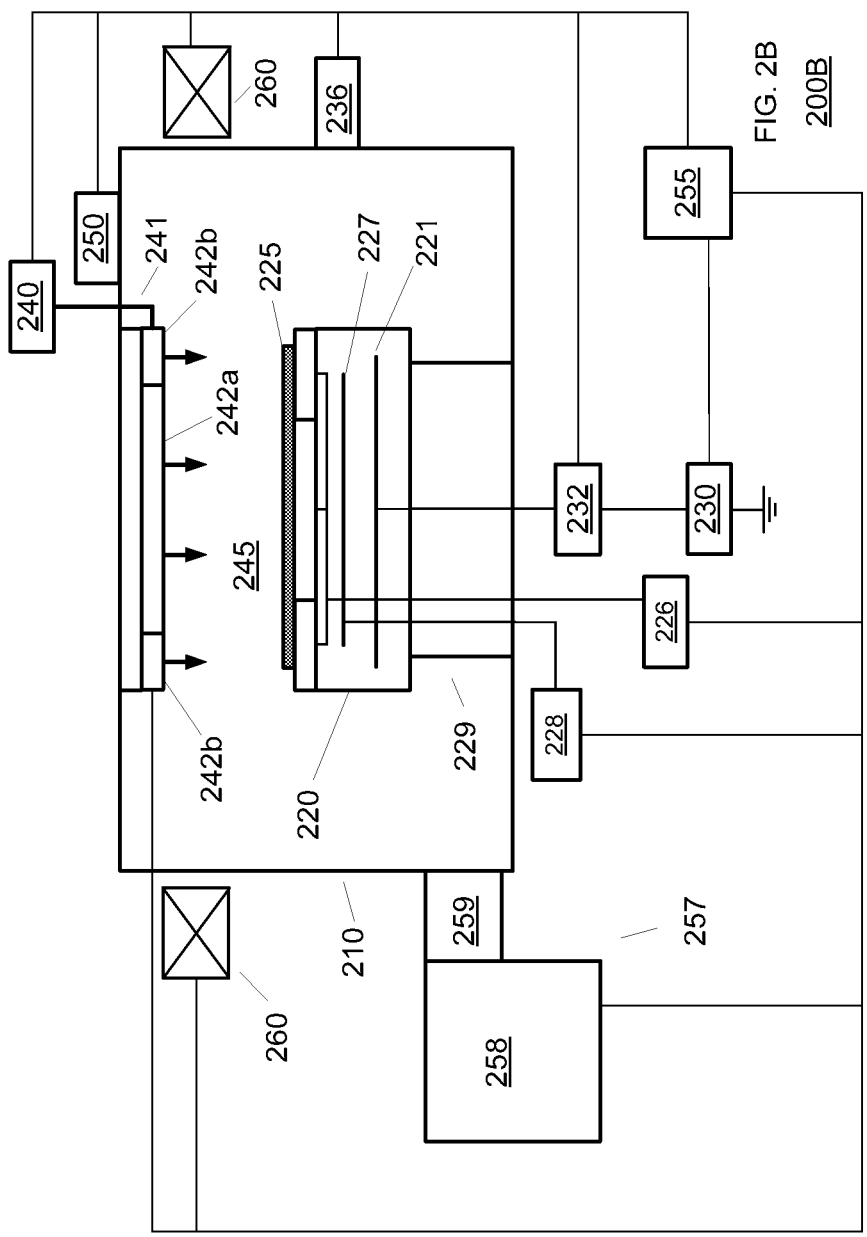
Figure 2C:
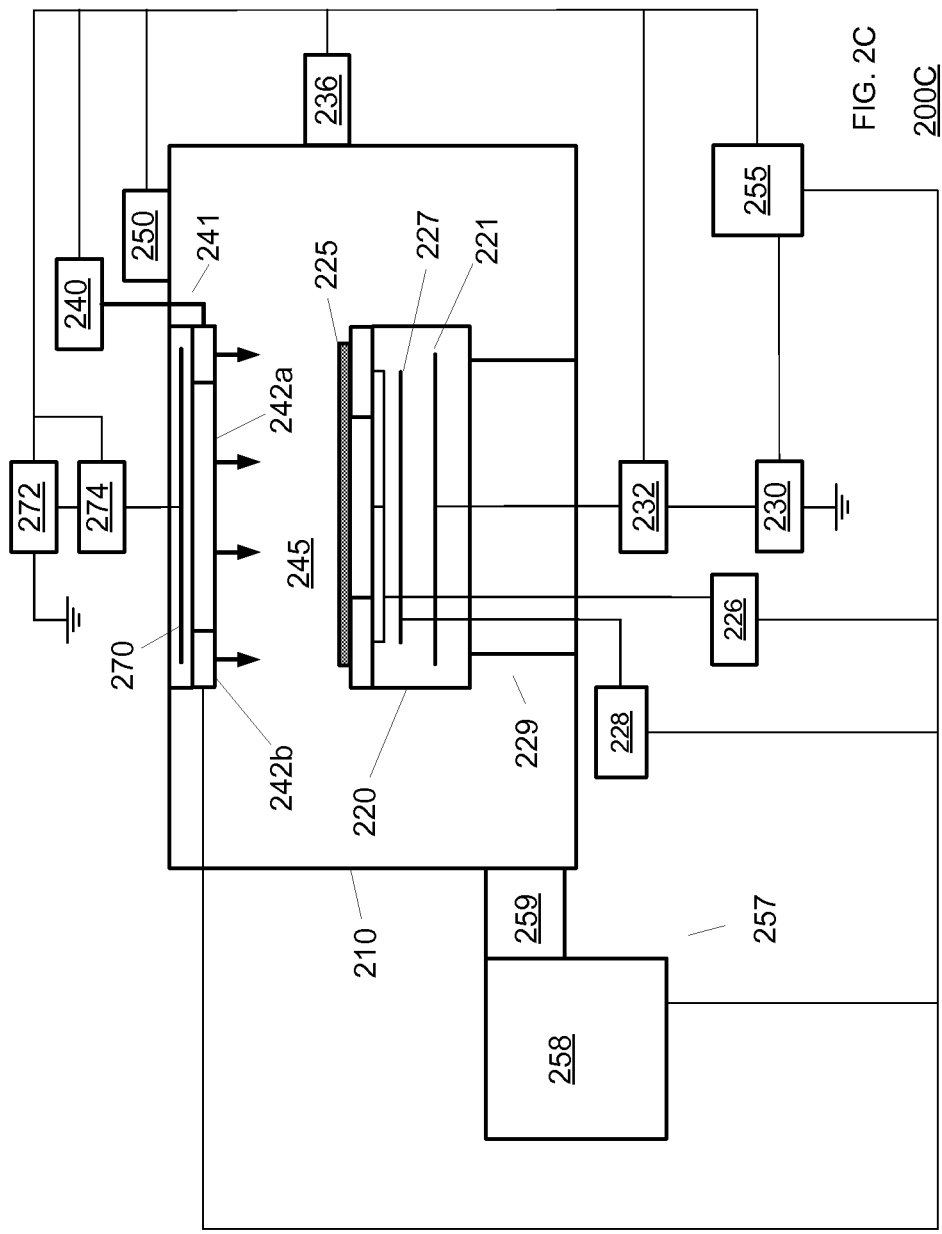
Figure 3E:
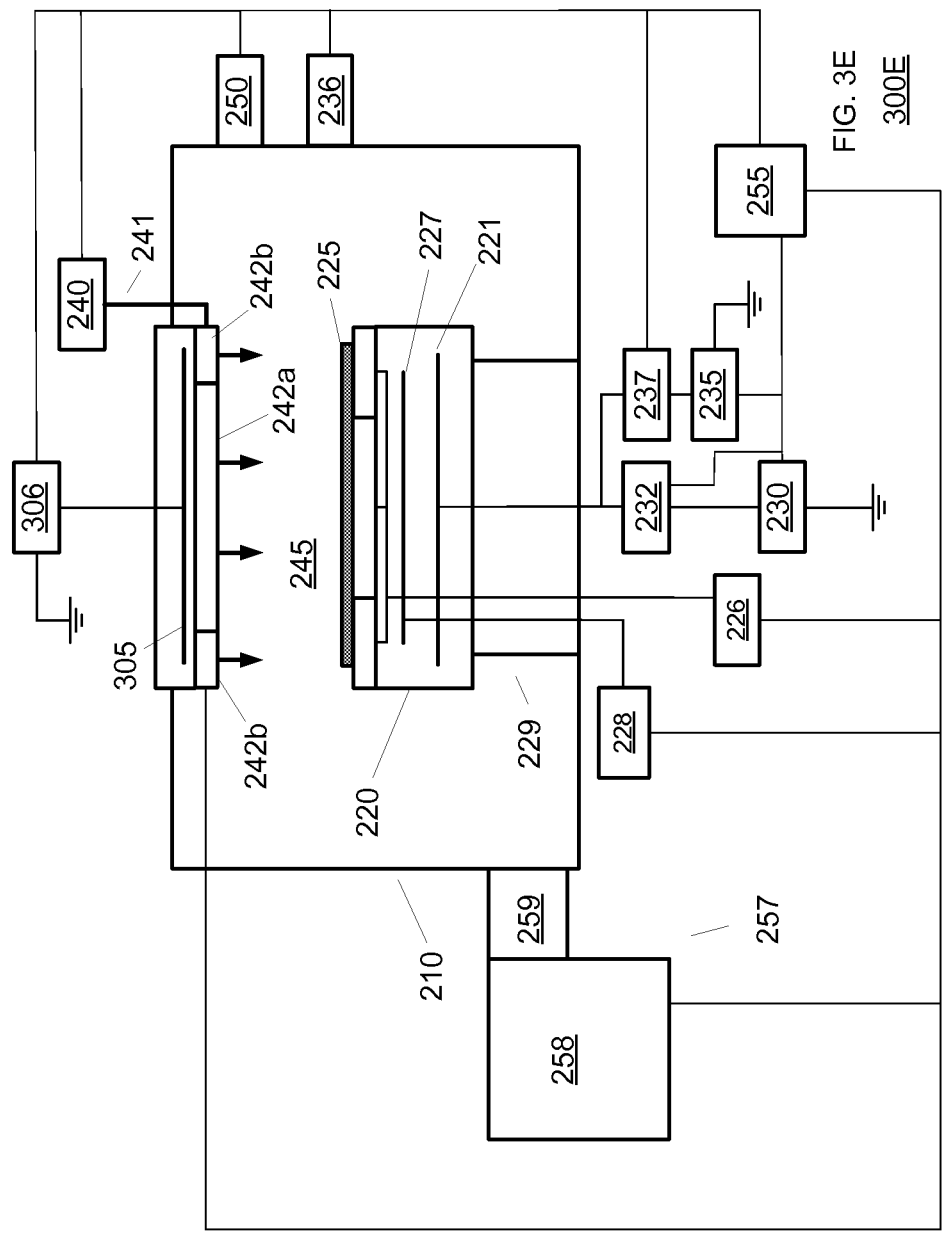

In the embodiment shown in FIG. 2C, the (VUV/EEDf)) etch system 200C can be similar to the embodiment of FIG. 2A or FIG. 2B, and can further comprise an upper electrode 270 to which RF power can be coupled from RF generator 272 through optional impedance match network 274. The design and implementation of capacitively-coupled (CCP) etch systems is well known to those skilled in the art. A frequency for the application of RF power to the upper electrode can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The design and implementation of an upper electrode is well known to those skilled in the art. The upper electrode 270 and the gas injection elements (242a and 242b) can be coupled to each other as shown.

In the embodiment shown in FIG. 2D, the (VUV/EEDf)) etch system 200D can be similar to the embodiments of FIGS. 2A and 2B, and can further comprise an inductive coil 280 ("spiral" coil or "pancake") to which RF power can be coupled via RF generator 282 through optional impedance match network 284. RF power is inductively coupled from inductive coil 280 through a dielectric window (not shown) to processing region 245. A frequency for the application of RF power to the inductive coil 280 can range from about 10 MHz to about 100 MHz. Similarly, a frequency for the application of power to the lower electrode 221 can range from about 0.1 MHz to about 100 MHz. In addition, a slotted Faraday shield (not shown) can be employed to reduce capacitive coupling between the inductive coil 280 and plasma. Moreover, controller 255 can be coupled to RF generator 282 and impedance match network 284 in order to control the application of power to inductive coil 280.

In an alternate embodiment (not shown), is a "side" coil configuration may be used for the inductive coil. The design and implementation of an inductively coupled plasma (ICP) source, or transformer coupled plasma (TCP) source, is well known to those skilled in the art.

In the embodiment shown in FIG. 2E, the (VUV/EEDf)) etch system 200E can, for example, be similar to the embodiments of FIGS. 2A, 2B, 2C, and 2D, and can further comprise a second RF generator 235 configured to couple RF power to substrate holder 220 through another optional impedance match network 237. A typical frequency for the application of RF power to substrate holder 220 can range from about 0.1 MHz to about 200 MHz for either the first RF generator 230 or the second RF generator 235 or both. The RF frequency for the second RF generator 235 can be relatively greater than the RF frequency for the first RF generator 230. Furthermore, the RF power to the substrate holder 220 from the first RF generator 230 can be amplitude modulated, the RF power to the substrate holder 220 from the second RF generator 235 can be amplitude modulated, or both RF powers can be amplitude modulated. Desirably, the RF power at the higher RF frequency is amplitude modulated. Moreover, controller 255 can be coupled to the second RF generator 235 and impedance match network 237 in order to control the application of RF power to substrate holder 220. The design and implementation of an RF system for a substrate holder is well known to those skilled in the art.

In the embodiment shown in FIG. 2F, the (VUV/EEDf)) etch system 200F can be similar to the embodiments of FIGS. 2A and 2E, and can further comprise a surface wave plasma (SWP) source 285. The SWP source 285 can comprise a slot antenna, such as a radial line slot antenna (RLSA), to which microwave power is coupled via microwave generator 286 through optional impedance match network 287.

In the embodiment shown in FIG. 2G, the (VUV/EEDf)) etch system 200G can be similar to the embodiment of FIG. 2C, and can further comprise a split upper electrode (270a, 270b) to which RF power can be coupled from RF generator 292 through an impedance match network 294 and a power splitter 290. A frequency for the application of RF power to the split upper electrode (270a, 270b) can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The power splitter and the split upper electrode can be designed and configured to provide different RF power levels to the center and the edge of the processing region 245 to facilitate the generation and control of a plasma in processing region 245 adjacent a surface of substrate 225. The split upper electrode (270a, 270b) and the gas injection elements (242a and 242b) can be coupled to each other as shown, or other configurations may be used.

FIGS. 3A-3G show additional embodiments for (VUV/EEDf)) etch systems in accordance with embodiments of the invention. FIGS. 3A-3G illustrate exemplary (VUV/EEDf))

etch systems 300A-300G that are similar to the exemplary (VUV/EEDf)) etch systems 200A-200G shown in FIGS. 2A-2G, but (VUV/EEDf)) etch systems 300A-300G include at least one DC electrode 305 and at least one DC source 306.

During patterned etching, a dry plasma etching process is often utilized, and the plasma is formed from a process gas by coupling electro-magnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power can be coupled to the (VUV/EEDf)) etch system in order to create an energetic (ballistic) electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US Patent Application No. 2006/0037701A1; the entire contents of which are herein incorporated by reference in their entirety. In general, the ballistic electron beam can be implemented within various types of (VUV/EEDf)) etch systems, as shown in FIGS. 3A-3G.

The DC electrode 305 may comprise a silicon-containing material and/or a doped silicon-containing material. The DC source 306 can include a variable DC power supply. Additionally, the DC source 306 can include a bipolar DC power supply. The DC source 306 can further include a system configured to perform at least one of monitoring, adjusting, or controlling the polarity, current, voltage, and/or on/off state of the DC source 306. Once plasma is formed, the DC source 306 facilitates the formation of a ballistic electron beam. An electrical filter may be utilized to de-couple RF power from the DC source 306.

For example, the DC voltage applied to DC electrode 305 by DC source 306 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage.

In alternate embodiments, a Chemical Oxide Removal (COR) subsystem (not shown) can be used to remove or trim oxidized poly-Si material. In addition, the COR subsystem may be used to remove or trim an oxide masking layer. For example, a COR subsystem can comprise a chemical treatment module (not shown) for chemically treating exposed surface layers, such as oxide surface layers, on a substrate, whereby adsorption of the process chemistry on the exposed surfaces affects chemical alteration of the surface layers. Additionally, the COR subsystem can comprise thermal treatment module (not shown) for thermally treating the substrate, whereby the substrate temperature is elevated in order to desorb (or evaporate) the chemically altered exposed surface layers on the substrate.

Figure 4:
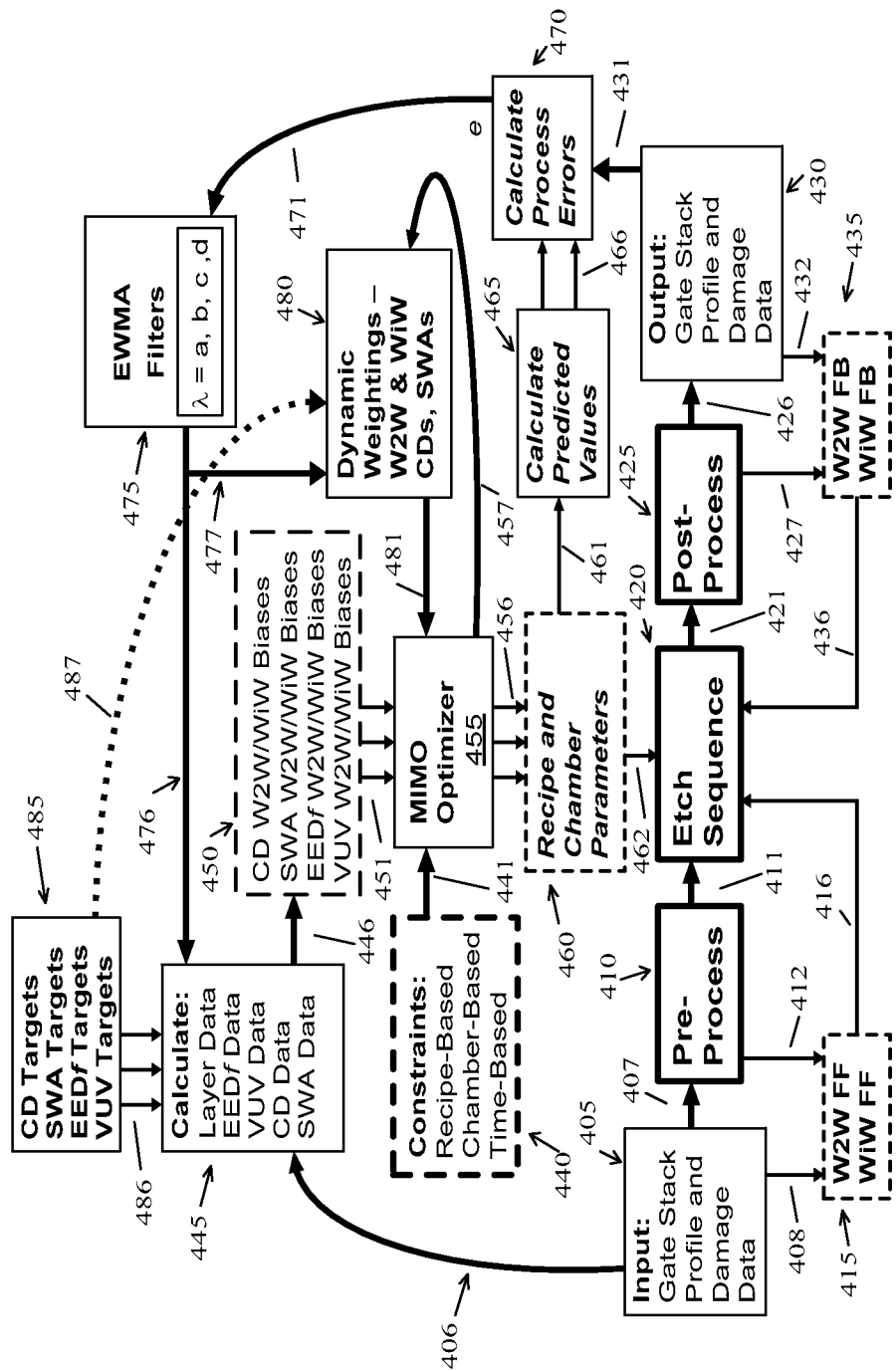
FIG. 4 shows a simplified block diagram of an exemplary (VUV/EEDƒ) model optimization and control methodology in accordance with embodiments of the invention.

FIG. 4 shows a simplified block diagram of an exemplary Multi-Input/Multi-Output (MIMO) model optimization and control methodology in accordance with embodiments of the invention. In the illustrated MIMO model methodology 400, an exemplary image of a portion of a VUV/EEDf-related etch procedure is shown.

The input data element 405 can be characterized using a first set of parameters that can include input gate stack profile data and input damage data. For example, the input data element 405 can include first center and edge (C/E) profile data items, first C/E thickness data items, first C/E CD data items, first C/E SWA data items, and first C/E damage data items. Alternatively, a different set of input data parameters may be used. The output data element 430 can be characterized using a second set of parameters that can include output gate stack profile data and output damage data. For example, output data element 430 can include second center and edge (C/E) profile data items, second C/E thickness data items, second C/E CD data items, second C/E SWA data items, and second C/E damage data items. Alternatively, a different set of output parameters may be used.

In the illustrated methodology, the first input data element 405 can be coupled to one or more of the first calculation elements 445 and can provide first input data items 406 to one or more of the first calculation elements 445. The first input data element 405 can also be coupled to one or more of the pre-processing models 410 and can provide second input data items 407 to one or more of the pre-processing models 410. In addition, the first input data element 405 can be coupled to one or more feed forward (FF) models 415 and can provide third input data items 408 to one or more of the FF models 415. For example, data items (406, 407, and 408) can include real-time measurement data that can include: wafer center (C) data, wafer edge (E) data, and bias (C/E) data for the wafer. In addition, data items (406, 407, and 408) can include layer data, CD data, SWA data, EEDf data, VUV data, and damage data for the wafer.

One or more of the pre-processing models 410 can be coupled to one or more of the etch sequence models 420 and can provide first pre-processing data items 411 to one or more of the etch sequence models 420. One or more of the pre-processing models 410 can also be coupled to one or more of the FF models 415 and can provide second pre-processing data items 412 to one or more of the FF models 415. In addition, one or more of the FF models 415 can be coupled to one or more of the etch sequence models 420 and can provide first FF data items 416 to one or more of the etch sequence models 420. One or more of the FF models 415 can provide wafer-to-wafer (W2W) FF data and/or Within-Wafer (WiW) FF data to one or more of the etch sequence models 420. For example, data items (411, 412, and 416) can include real-time measurement data that can include: wafer center (C) data, wafer edge (E) data, and bias (C/E) data for the wafer. In addition, data items (411, 412, and 416) can include additional real-time measurement data and/or simulation data that can include: layer data, CD data, SWA data, EEDf data, VUV data, and damage data for the wafer.

One or more of the etch sequence models 420 can be coupled to one or more of the post-processing models 425 and can provide etch sequence data items 421 to one or more of the post-processing models 425. For example, data items 421 can include real-time measurement data that can include: W2W data, WiW data, wafer center (C) data, wafer edge (E) data, and bias (C/E) data for the wafer. In addition, data items 421 can include additional real-time measurement data and/or simulation data that can include: layer data, CD data, SWA data, EEDf data, VUV data, and damage data for the wafer.

One or more of the post-processing models 425 can be coupled to one or more of the output data elements 430 and can provide first post-processing data items 426 to one or more of the output data elements 430. One or more of the post-processing models 425 can be coupled to one or more of the feedback (FB) models 435 and can provide second post-processing data items 427 to one or more of the FB models 435. For example, data items (426 and 427) can include real-time measurement data that can include: wafer center (C) data, wafer edge (E) data, and bias (C/E) data for the wafer. In addition, data items (426 and 427) can include additional real-time measurement data and/or simulation data that can include: layer data, CD data, SWA data, EED$f$ data, VUV data, and damage data for the wafer.

One or more of the output data elements 430 can be coupled to one or more of the process error calculation elements 470 and can provide first output data items 431 to one or more of the process error calculation elements 470. One or more of the output data elements 430 can be coupled to one or more of the FB models 435 and can provide second output data items 432 to one or more of the FB models 435. In addition, one or more of the FB models 435 can be coupled to one or more of the etch sequence models 420 and can provide first FB data items 436 to one or more of the etch sequence models 420. One or more of the FB models 435 can provide wafer-to-wafer (W2W) FB and/or Within-Wafer (WiW) FB data to one or more of the etch sequence models 420. For example, data items (431, 432, and 436) can include real-time measurement data that can include: wafer center (C) data, wafer edge (E) data, and bias (C/E) data for the wafer. In addition, data items (431, 432, and 436) can include additional real-time measurement data and/or simulation data that can include: layer data, CD data, SWA data, EED$f$ data, VUV data, and damage data for the wafer.

One or more of the first calculation elements 445 can be coupled to one or more of the bias error calculation elements 450 and can provide first biasing data items 446 to one or more of the bias error calculation elements 450. For example, data items 446 can include real-time measurement data that can include: W2W data, WiW data, wafer center (C) data, wafer edge (E) data, and bias (C/E) data for the wafer. In addition, data items 446 can include additional real-time measurement data and/or simulation data that can include: layer data, CD data, SWA data, EED$f$ data, VUV data, and damage data for the wafer.

One or more of the bias error calculation elements 450 can be coupled to one or more of the Multi-Input Multi-Output (MIMO) optimizers 455 and can provide calculated bias error data items 451 to one or more of the MIMO optimizers 455. For example, data items 451 can include real-time measurement data that can include: W2W data, WiW data, wafer center (C) data, wafer edge (E) data, and bias (C/E) data for the wafer. In addition, data items 451 can include additional real-time measurement data and/or simulation data that can include: layer data, CD data, SWA data, EED$f$ data, VUV data, and damage data for the wafer.

One or more of the constraint calculation elements 440 can be coupled to one or more of the MIMO optimizers 455 and can provide calculated constraint data items 441 to one or more of the MIMO optimizers 455. For example, data items 441 can include real-time measurement data that can include: W2W data, WiW data, wafer center (C) data, wafer edge (E) data, and bias (C/E) data for the wafer. In addition, data items 441 can include additional real-time measurement data and/or simulation data that can include: layer data, CD data, SWA data, EED$f$ data, VUV data, and damage data for the wafer.

In some embodiments, one or more of the MIMO optimizers 455 can be provided calculated constraint data items 441 that can include tool limits, recipe limits, and/or time limits. For example, the calculated constraint data items 441 can include step-based wafer limits that can include EED$f$ limits, VUV limits, temperature limits, and/or process gas limits. One or more of the MIMO optimizers 455 can determine one or more sets of optimized recipe/chamber parameters 456 that can be sent to one or more of the models (410, 420, and 425).

One or more of the MIMO optimizers 455 can be coupled to one or more of the optimized data elements 460 and can provide first optimized data items 456 to one or more of the optimized data elements 460. One or more of the MIMO optimizers 455 can also be coupled to one or more of the dynamic weighting calculation data elements 480 and can provide second optimized data items 457 to one or more of the dynamic weighting calculation data elements 480. For example, data items (456 and 457) can include real-time modeling data that can include: W2W data, WiW data, wafer center (C) data, wafer edge (E) data, and bias (C/E) data for the wafer. In addition, data items (456 and 457) can include additional real-time measurement data and/or simulation data that can include: layer data, CD data, SWA data, EED$f$ data, VUV data, and damage data for the wafer.

One or more of the optimized data elements 460 can be coupled to one or more of the predicted data calculation elements 465 and can provide first optimized recipe and/or chamber data items 461 to one or more of the predicted data calculation elements 465. One or more of the optimized data elements 460 can be coupled to one or more of the etch sequence models 420 and can provide second optimized recipe and/or chamber data items 462 to one or more of the etch sequence models 420. For example, data items (461 and 462) can include real-time measurement data that can include: W2W data, WiW data, wafer center (C) data, wafer edge (E) data, and bias (C/E) data for the wafer. In addition, data items (461 and 462) can include additional real-time measurement data and/or simulation data that can include: layer data, CD data, SWA data, EED$f$ data, VUV data, and damage data for the wafer.

One or more of the predicted data calculation elements 465 can be coupled to one or more of the process error calculation elements 470 and can provide predicted and/or simulated data items 466 to one or more of the process error calculation elements 470. For example, data items 466 can include real-time prediction data that can include: W2W data, WiW data, wafer center (C) data, wafer edge (E) data, and bias (C/E) data for the wafer. In addition, data items 466 can include predicted layer data, predicted CD data, predicted SWA data, predicted EED$f$ data, predicted VUV data, and predicted damage data for the wafer. Furthermore, data items 466 can include one or more predicted etch biases, one or more predicted SWA biases, one or more predicted step times for one or more etch recipes, and one or more predicted process gas flows for one or more etch recipes.

In some examples, one or more of the output data elements 430 can provide one or more actual data items 431 to one or more of the process error calculation elements 470, and one or more of the data items 431 can be compared to one of more of the predicted data items 466. One or more of the error values 471 from one or more of the process error calculation elements 470 can be provided to one or more of the EWMA filters 475.

One or more of the process error calculation elements 470 can be coupled to one or more of the Exponentially Weighted Moving Average (EWMA) filters 475 and can provide process error data items 471 to one or more of the EWMA filters 475. For example, data items 471 can include real-time measurement data that can include: W2W data, WiW data, wafer center (C) data, wafer edge (E) data, and bias (C/E) data for the wafer. In addition, data items 471 can include additional real-time measurement data and/or simulation data that can include: layer data, CD data, SWA data, EEDƒ data, VUV data, and damage data for the wafer.

One or more of the EWMA filters 475 can be coupled to one or more of the constraint calculation elements 440 and can provide first filtered process error data items 476 to one or more of the constraint calculation elements 440. In addition, one or more of the EWMA filters 475 can be coupled to one or more of the dynamic weighting calculation data elements 480 and can provide second filtered process error data items 477 to one or more of the dynamic weighting calculation data elements 480. For example, data items (476 and 477) can include real-time filtered data that can include: W2W data, WiW data, wafer center (C) data, wafer edge (E) data, and bias (C/E) data for the wafer. In addition, data items (476 and 477) can include filtered layer data, filtered CD data, filtered SWA data, filtered EEDƒ data, filtered VUV data, and filtered damage data for the wafer. Furthermore, data items (476 and 477) can include simulated and/or modeling data that can include: layer data, CD data, SWA data, EEDƒ data, VUV data, and damage data for the wafer.

Each of the EWMA filters 475 can filter and provide feedback data for a single parameter or error value. Alternatively, each of the EWMA filters 475 can filter and provide feedback data for a multiple parameters or error values.

One or more of the dynamic weighting calculation data elements 480 can be coupled to one or more of the MIMO optimizers 455 and can provide calculated dynamic weighting data items 481 to one or more of the MIMO optimizers 455. For example, data items 481 can include real-time weighting data that can include: W2W data, WiW data, wafer center (C) data, wafer edge (E) data, and bias (C/E) data for the wafer. In addition, data items 481 can include additional real-time weighting data and/or simulation data that can include: layer data, CD data, SWA data, EEDƒ data, VUV data, and damage data for the wafer.

One or more of the first input target data elements 485 can be coupled to one or more of the first calculation elements 445 and can provide first target data items 486 to one or more of the calculation elements 445. In addition, one or more of the first input target data elements 485 can be coupled to one or more of the dynamic weighting calculation data elements 480 and can provide second target data items 487 to one or more of the dynamic weighting calculation data elements 480. For example, data items (486 and 487) can include real-time target data that can include: W2W data, WiW data, wafer center (C) data, wafer edge (E) data, and bias (C/E) data for the wafer. In addition, data items (486 and 487) can include additional real-time target and/or simulated target data that can include: layer data, CD data, SWA data, EEDƒ data, VUV data, and damage data for the wafer.

The concept of using dynamic weightings based on the feedback error is to force the MIMO optimizer 455 to prioritize the weightings (rebalance) with a goal of better control of the most important control variables (CVs)—automation of a manual tuning of a control system in runtime.

One or more of the dynamic weighting calculation data elements 480 can receive one or more target data items 487 and one or more feedback data items 457 from one or more of the MIMO optimizers 455. In addition, one or more of the dynamic weighting calculation data elements 480 can provide one or more dynamically varying weighting data items 481 to one or more of the MIMO optimizers 455.

In some embodiments, one or more controlled variables (CVs) and the ranges associated with the CVs can be determined. One or more of the CVs can be specified by an end user or a customer. The CVs can include: layer data, CD data, SWA data, EEDƒ data, VUV data, and damage data for the wafer. One or more manipulated variables (MVs) can be determined for candidate recipes for the etch sequence model 420. The MVs can include WiW manipulated variables (WiW-MVs), and the WiW-MVs can include "fast" MVs that can be controlled while a wafer is being processed. The MVs can include W2W manipulated variables (W2W-MVs), and the W2W-MVs can include "slow" MVs that can be controlled when a wafer lot is being processed. The ranges for the MVs can be examined for each step in a candidate recipe.

Design of Experiment (DOE) procedures can be performed to analyze the etch sequence and/or the MIMO model associated with the etch sequence model 420. Using VUV-sensor data from DOE wafers, VUV-related experiments can be performed to establish statistical models that can connect one or more of the MVs with each CV. A critical factor for DOE procedures is the format of the predicted model. One or more model types can be selected, ranges can be provided for the CVs and/or MVs, and statistical software, such as JMP® statistical software from the SAS Institute) can be used to establish one or more of the DOE tables). For example, the chamber state data for the etching chambers and the measurement chambers can be used as manipulated variables (MVs). Alternatively, the process modeling may assume that the chamber state is stable between wafers and/or lots. Nonlinear models with quadratic and interaction terms can be created from the DOE tables by using a least squares technique and statistical software. Furthermore, the manipulated variables (MVs) and/or the disturbance variables (DVs) used for control can include a calculated value that can be dynamically modeled and updated during the runtime processing.

In some embodiments, Relative Gain Array (RGA) techniques can be used to investigate the best combinations of MVs and CVs. For example, RGA techniques can be used for measured model parameter selection, and CV-MV pairs can be selected such that their sum is closest to one. In addition, the RGA techniques can be used to determine a number of candidate models and to identify the best case solution. When there are more CVs than MVs, RGA techniques can be used for selecting the most controllable CV (sensitivity analysis of CVs to MVs). For example, the modeling procedure can start with a basic model relationship that "pairs" VUV sensor data to a controlled variable (CV).

The RGA method can be used at run-time with production patterned wafers to evaluate when to use the VUV sensor data vs. CV feedback in place of just calculating a value. For example, the etch sequence model 420 can be associated with a poly-etch (P-E) sequence or a metal-gate-etch (MGE) sequence, and the CVs associated with one or more of the features created by the (P-E) sequence or the (MGE) sequence can include center VUV values, middle VUV values, and/or edge VUV values. The pre- and post-damage measurements can be performed using dynamic sampling.

In other embodiments, the manipulated variables can include back-side gas flows to one or more zones in the wafer holder, and the back-side gas flows can be dynamically controlled during processing to provide dynamic backside gas temperature control for improved within-wafer process uniformity by adjusting wafer areas that are non-radial in nature based on incoming CV requirements.

In still other embodiments, the manipulated variables can include flow rates for edge gas injection flow rates. This approach could also be used to reduce the starvation problem at the wafer edge, and make the edge starvation a controllable variable based on the incoming signature and chamber state.

In some MIMO models, the interaction terms can be updated between lots during an offline triggered calculation update procedure. For example, the cross term calculation update can be triggered by checking the sensitivity of the current system to changes in the cross terms, and by running a set of pre-defined delta offsets to see if adjusting the cross terms would have improved the average control. RGA could also be used in this calculation, and the trigger events can be used to perform adaptive feedback updates for the MIMO model. For example, adaptive feedback can be used when copying a MIMO model from chamber to chamber and allowing the MIMO model to adapt to the new chamber behavior. Another use arises when a new product is release and the old product equation can be used to start the model, then after so many wafers the model update is triggered and a new model is adjusted, and the resulting model can them be used and monitored for performance.

FIG. 5 illustrates an exemplary view of a multi-step processing sequence for a creating a metal gate structure in accordance with embodiments of the invention. In the illustrated embodiment, six exemplary gate stacks (501-506) are shown, but this is not required for the invention. Alternatively, a different number of gates stacks with different configurations may be used.

In some embodiments, the multi-layer metal-gate stacks (501, 502, 503, 504, 505, and 506, FIG. 5) can be created using a Poly-Etch (PE) processing sequence and a metal-gate etch (MGE) processing sequence. For example, the P-E processing sequence can include a Si-ARC layer etching procedure, an etch-control layer (ECL) etching procedure, a TEOS layer etching procedure, a TEOS Over-Etch (OE) etching procedure, and an Ashing procedure. In addition, the metal-gate etch (MGE) processing sequence can include a "Break-Though" (BT) etching procedure, a main etch (ME) etching procedure, an Over-Etch (OE) etching procedure, a Titanium-Nitride (TiN) etching procedure, and a HK etching procedure.

A first gate stack 501 is shown that includes a substrate layer 510, a metal gate layer 515, a third hard mask layer 520, a first silicon-containing layer 525, a second silicon-containing layer 530, a second hard mask layer 535, a gate-width control layer 540, a first hard mask layer 545, and a pattern of soft mask features 550. For example, the substrate layer 510 can include a semiconductor material; the metal gate layer 515 can include $HfO_2$; the third hard mask layer 520 can include TiN: the first silicon-containing layer 525 can include amorphous silicon (a-Si): the second silicon-containing layer 530 can include SiN; the second hard mask layer 535 can include Tetraethyl Orthosilicate, (TEOS) $[Si(OC_2H_5)_4]$; the gate-width control layer 540 can include ODL; the first hard mask layer 545 can include Si-ARC material, and the soft mask features 550 can include photoresist material.

The first MLMS processing sequence can be modeled using models (560-570), and the models (560-570) can exchange Measured Variable (MV) data using transfer means 575, can exchange Disturbance Variable (DV) data using transfer means 580, and can exchange Controlled Variable (CV) data using transfer means 585. The models (560-570) can receive, process, and/or send MV data, DV data, and CV associated with the etching procedures described herein.

The first model 560 can be a first integrated metrology (IM) model for the first gate stack 501, and can include a first ODP model. The first model 560 can be used to determine profile data for the soft-mask (photoresist) features 550.

A second gate stack 502 is shown that includes a substrate layer 510, a metal gate layer 515, a third hard mask layer 520, a first silicon-containing layer 525, a second silicon-containing layer 530, a second hard mask layer 535, a gate-width control layer 540, first hard mask features 545a, and the etched soft mask features 550a. For example, the substrate layer 510 can include a semiconductor material; the metal gate layer 515 can include HfO2; the third hard mask layer 520 can include TiN: the first silicon-containing layer 525 can include amorphous silicon (a-Si): the second silicon-containing layer 530 can include SiN; the second hard mask layer 535 can include TEOS; the gate-width control layer 540 can include etch control material; the first hard mask features 545a can include etched Si-ARC material, and the etched soft mask features 550a can include etched photoresist material. During a first etch procedure, the pattern of soft mask features 550 can be used to create a pattern of first hard mask features 545a.

The patterned substrates having the first gate stacks 501 thereon can be etched using a first etch procedure to create patterned substrates having the second gate stacks 502 thereon. In some embodiments, a Si-ARC layer etching procedure can be used. Alternatively, other etching procedures may be used. One or more first etch models 561 can be created for the first etch procedure.

During the Si-ARC layer etching procedure, the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

The third model 562 can be a second integrated metrology (IM) model for the second gate stack 502, and can include a second ODP model. The second ODP model 562 can be used to determine profile data for the etched photoresist features 550a and the first hard mask features 545a.

A third gate stack 503 is shown that includes a substrate layer 510, a metal gate layer 515, a third hard mask layer 520, a first silicon-containing layer 525, a second silicon-containing layer 530, a second hard mask layer 535, gate-width control features 540b, and etched first hard mask features 545b. For example, the substrate layer 510 can include a semiconductor material; the metal gate layer 515 can include $HfO_2$; the third hard mask layer 520 can include TiN: the first silicon-containing layer 525 can include amorphous silicon (a-Si): the second silicon-containing layer 530 can include SiN; the second hard mask layer 535 can include TEOS; the gate-width control features 540b can include etched ODL; and the etched first hard mask features 545b can include etched Si-ARC material. During a second etch procedure, the pattern of etched first hard mask features 545a can be used to create a pattern of etched gate-width control features 540b.

The patterned substrates having the second gate stacks 502 thereon can be etched using a second etch procedure to create patterned substrates having the third gate stacks 503 thereon. In some embodiments, an etch-control layer (ECL) etching procedure can be used. Alternatively, other etching procedures may be used. One or more second etch models 563 can be created for the second etch procedure.

During the etch-control layer (ECL) etching procedure, the chamber pressure can range from approximately 15 mT to approximately 25 mT; the top power can vary from approximately 450 watts to approximately 550 watts; the lower power can vary from approximately 90 watts to approximately 110 watts; the ESC voltage can be set at approximately 2500 V; the $O_2$ flow rate can vary between approximately 30 sccm and approximately 50 sccm; the $CO_2$ flow rate can vary between approximately 70 sccm and approximately 90 sccm; the HBr flow rate can vary between approximately 25 sccm and approximately 35 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 90 seconds to approximately 130 seconds.

The fifth model 564 can be a third integrated metrology (IM) model for the third gate stack 503, and can include a third ODP model. The third ODP model 564 can be used to determine profile data for the gate-width control features 540b, and etched first hard mask features 545b.

A fourth gate stack 504 is shown that includes a substrate layer 510, a metal gate layer 515, third hard mask layer 520, first silicon-containing layer 525, second silicon-containing layer 530, and second hard mask features 535c. For example, the substrate layer 510 can include a semiconductor material; the metal gate layer 515 can include $HfO_2$; the third hard mask layer 520 can include TiN: the first silicon-containing layer 525 can include amorphous silicon (a-Si): the second silicon-containing layer 530 can include SiN; the second hard mask features 535c can include TEOS material. During a third etch procedure, the pattern of gate-width control layer features 540b can be used to create the second hard mask features 535c.

The seventh model 566 can be a fourth integrated metrology (IM) model for the fourth gate stack 504, and can include a fourth ODP model. The fourth ODP model 566 can be used to determine profile data for the second hard mask features 535c.

The patterned substrates having the third gate stacks 503 thereon can be etched using a third etch sequence to create patterned substrates having the fourth gate stacks 504 thereon. In some embodiments, a TEOS etch sequence can be used that can include a TEOS layer etching procedure, a TEOS OE etching procedure, and an ashing procedure. Alternatively, other etching, ashing, or cleaning procedures may be used. One or more third etch models 565 can be created for the TEOS etch sequence.

During the TEOS layer etching procedure, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the substrate holder can vary from approximately 25 degrees Celsius to approximately 35 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 50 seconds to approximately 90 seconds.

During the TEOS OE etching procedure, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the substrate holder can vary from approximately 25 degrees Celsius to approximately 35 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 5 seconds to approximately 10 seconds.

During the Ashing procedure, the chamber pressure can range from approximately 125 mT to approximately 175 mT; the top power can vary from approximately 350 watts to approximately 450 watts; the lower power can vary from approximately 20 watts to approximately 30 watts; the ESC voltage can be set at approximately 2500 V; the $O_2$ flow rate can vary between approximately 430 sccm and approximately 470 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 70 degrees Celsius to approximately 80 degrees Celsius; the temperature at the center of the substrate holder can vary from approximately 70 degrees Celsius to approximately 80 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 150 seconds to approximately 210 seconds.

A fifth gate stack 505 is shown that includes a substrate layer 510, a metal gate layer 515, etched third hard mask layer features 520*d*, etched first silicon-containing layer features 525*d*, etched second silicon-containing layer features 530*d*, and etched second hard mask layer features 535*d*. For example, the substrate layer 510 can include a semiconductor material; the metal gate layer 515 can include $HfO_2$; the etched third hard mask layer features 520*d* can include TiN: the etched first silicon-containing layer features 525*d* can include amorphous silicon (a-Si): the etched second silicon-containing layer features 530*d* can include SiN; and the etched second hard mask layer features 535*d* can include TEOS. During a fourth etch procedure a cleaning procedure can be performed and the remaining gate-width control layer material 540*c* can be removed.

The patterned substrates having the fourth gate stacks 504 thereon can be etched using a fourth etch sequence to create patterned substrates having the fifth gate stacks 505 thereon. In some embodiments, a first hard-mask etch sequence can be used that can include a "break-through (BT) etching procedure, a Main-Etch (ME) etching procedure, an Over-Etch (OE) etching procedure, and a Titanium-Nitride (TiN) etching procedure. Alternatively, other etching, ashing, or cleaning procedures may be used. One or more fourth etch models 567 can be created for the first hard-mask etch sequence.

During the BT etching procedure, the chamber pressure can range from approximately 8 mT to approximately 12 mT; the top power can vary from approximately 600 watts to approximately 700 watts; the lower power can vary from approximately 175 watts to approximately 200 watts; the ESC voltage can be set at approximately 2500 V; the $CF_4$ flow rate can vary between approximately 120 sccm and approximately 150 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the substrate holder temperature can vary from approximately 60 degrees Celsius to approximately 70 degrees Celsius; the center backside pressure for the substrate holder can vary from approximately 8 Torr to approximately 12 Torr; the edge backside pressure for the substrate holder can vary from approximately 8 Torr to approximately 12 Torr; and the processing time can vary from approximately 5 seconds to approximately 15 seconds.

During the ME etching procedure, the chamber pressure can range from approximately 8 mT to approximately 12 mT; the top power can vary from approximately 120 watts to approximately 150 watts; the ESC voltage can be set at approximately 2500 V; the $O_2$ flow rate can vary between approximately 2 sccm and approximately 6 sccm; the HBr flow rate can vary between approximately 220 sccm and approximately 280 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the substrate holder temperature can vary from approximately 60 degrees Celsius to approximately 70 degrees Celsius; the center backside pressure for the substrate holder can vary from approximately 8 Torr to approximately 12 Torr; the edge backside pressure for the substrate holder can vary from approximately 8 Torr to approximately 12 Torr; and the processing time can vary from approximately 50 seconds to approximately 70 seconds.

During the OE etching procedure, the chamber pressure can range from approximately 8 mT to approximately 12 mT; the top power can vary from approximately 120 watts to approximately 150 watts; the lower power can vary from approximately 20 watts to approximately 40 watts; the ESC voltage can be set at approximately 2500 V; the $O_2$ flow rate can vary between approximately 2 sccm and approximately 6 sccm; the HBr flow rate can vary between approximately 220 sccm and approximately 280 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 60 degrees Celsius to approximately 80 degrees Celsius; the substrate holder temperature can vary from approximately 60 degrees Celsius to approximately 70 degrees Celsius; the center backside pressure for the substrate holder can vary from approximately 8 Torr to approximately 12 Torr; the edge backside pressure for the substrate holder can vary from approximately 8 Torr to approximately 12 Torr; and the processing time can vary from approximately 20 seconds to approximately 30 seconds.

During the TiN etching procedure, the chamber pressure can range from approximately 8 mT to approximately 12 mT; the top power can vary from approximately 180 watts to approximately 220 watts; the lower power can vary from approximately 40 watts to approximately 60 watts; the ESC voltage can be set at approximately 2500 V; the chlorine ($Cl_2$) flow rate can vary between approximately 12 sccm and approximately 18 sccm; the Ar flow rate can vary between approximately 180 sccm and approximately 220 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 60 degrees Celsius to approximately 80 degrees Celsius; the substrate holder temperature can vary from approximately 60 degrees Celsius to approximately 70 degrees Celsius; the center backside pressure for the substrate holder can vary from approximately 8 Torr to approximately 12 Torr; the edge backside pressure for the substrate holder can vary from approximately 8 Torr to approximately 12 Torr; and the processing time can vary from approximately 50 seconds to approximately 80 seconds.

The ninth model 568 can be a fifth integrated metrology (IM) model for the fifth gate stack 505, and can include a fifth ODP model. The fifth ODP model 568 can be used to determine profile data for the cleaned third hard mask features 520*d*, the cleaned first silicon-containing layer features 525*d*, the cleaned second silicon-containing layer features 530*d*, the cleaned second hard mask features 535*d*.

A sixth gate stack 506 is shown that includes a substrate layer 510 and metal gate layer features 515*e*. During a fifth etch procedure, the first third mask layer features 520*d*, the first silicon-containing layer features 525*d*, the second silicon-containing layer features 530d, and the second hard mask layer features 535d can be etched to create a pattern of metal gate layer features 515e.

The patterned substrates having the fifth gate stacks 504 thereon can be etched using a fifth etch sequence to create patterned substrates having the sixth gate stacks 506 thereon. In some embodiments, a second hard-mask etch sequence can be used that can include a metal layer (HK) etching procedure. Alternatively, other etching, ashing, or cleaning procedures may be used. One or more fifth etch models 569 can be created for the second hard-mask etch sequence.

During the HK etching procedure, the HK chamber pressure can range from approximately 8 mT to approximately 12 mT; the top power can vary from approximately 550 watts to approximately 650 watts; the ESC voltage can be set at approximately 500 V; the Boron Trichloride ($BCl_3$) flow rate can vary between approximately 120 sccm and approximately 180 sccm; the top chamber temperature can vary from approximately 70 degrees Celsius to approximately 90 degrees Celsius; the chamber wall temperature can vary from approximately 40 degrees Celsius to approximately 60 degrees Celsius; the bottom chamber temperature can vary from approximately 60 degrees Celsius to approximately 80 degrees Celsius; and the processing time can vary from approximately 30 seconds to approximately 40 seconds.

The eleventh model 570 can be a sixth integrated metrology (IM) model for the sixth gate stack 505, and can include a sixth ODP model. The sixth ODP model 570 can be used to determine profile data for the metal gate layer features 515e.

During process development, Design of Experiment (DOE) techniques can be used to examine the preliminary set of models (560-570) and to develop a reduced set of MIMO models.

FIG. 6 illustrates an exemplary view of a second multi-step processing sequence for a creating a metal gate structure in accordance with embodiments of the invention. In the illustrated embodiment, three exemplary gate stacks (601-603) are shown, but this is not required for the invention. Alternatively, a different number of gates stacks, a different number of models, and different configurations may be used.

In some embodiments, the multi-layer metal-gate stacks (601, 602, and 603, FIG. 6) can be created using a first Multi-Layer-Multi-Step (MLMS) processing sequence and a second Multi-Layer-Multi-Step (MLMS) processing sequence. For example, the first MLMS processing sequence can include a Si-ARC layer etching procedure, as described above, and an etch-control layer (ECL) etching procedure, as described above. In addition, the second MLMS processing sequence can include a TEOS layer etching procedure, as described above, a TEOS Over-Etch (OE) etching procedure, as described above, an Ashing procedure, a "Break-Though" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

A first gate stack 601 is shown that includes a substrate layer 610, a metal gate layer 615, a third hard mask layer 620, a first silicon-containing layer 625, a second silicon-containing layer 630, a second hard mask layer 635, a gate-width control layer 640, a first hard mask layer 645, and a pattern of soft mask features 650. For example, the substrate layer 610 can include a semiconductor material; the metal gate layer 615 can include $HfO_2$; the third hard mask layer 620 can include TiN: the first silicon-containing layer 625 can include amorphous silicon (a-Si): the second silicon-containing layer 630 can include SiN; the second hard mask layer 635 can include TEOS; the gate-width control layer 640 can include ODL; the first hard mask layer 645 can include Si-ARC material, and the soft mask features 650 can include photoresist material.

The first ODP model 660 can be established for the first gate stack 601, and the first ODP model 660 can be used to determine profile data for the photoresist features 650 and other layer-related data. The first ODP model 660 can provide DV data to the MIMO Model 661.

The patterned substrates having the first gate stacks 601 thereon can be etched using first MLMS processing sequence to create patterned substrates having the second gate stacks 602 thereon. For example, the first MLMS processing sequence can include a Si-ARC layer etching procedure, as described above, and an etch-control layer (ECL) etching procedure, as described above.

The first MLMS processing sequence can be modeled using a MIMO Model 661, and the MIMO Model 661 can exchange Measured Variable (MV) data using transfer means 675, can exchange Disturbance Variable (DV) data using transfer means 680, and can exchange Controlled Variable (CV) data using transfer means 685. MIMO Model 661 can include MV data, DV data, and CV associated with the Si-ARC layer etching procedure, and with the etch-control layer (ECL) etching procedure, as described above. The models (660-664) can receive, process, create, and/or send MV data, DV data, and CV associated with the procedures described herein.

A second gate stack 602 is shown that includes a substrate layer 610, a metal gate layer 615, a third hard mask layer 620, a first silicon-containing layer 625, a second silicon-containing layer 630, a second hard mask layer 635, etched gate-width control features 640a, and etched first hard mask features 645a. For example, the substrate layer 610 can include a semiconductor material; the metal gate layer 615 can include $HfO_2$; the third hard mask layer 620 can include TiN: the first silicon-containing layer 625 can include amorphous silicon (a-Si): the second silicon-containing layer 630 can include SiN; the second hard mask layer 635 can include TEOS; the gate-width control features 640a can include etched ECL material; and the etched first hard mask features 645b can include etched Si-ARC material. During a first MLMS processing sequence, the pattern of soft mask feature 650 can be used to create the pattern of etched first hard mask features 645a and the pattern of etched gate-width control features 640a.

The second ODP model 662 can be established for the second gate stack 602, and the second ODP model 662 can be used to determine profile data for the gate-width control features 640a, the etched first hard mask features 645b, and other layer-related data.

The patterned substrates having the second gate stacks 602 thereon can be etched using a second MLMS processing sequence to create patterned substrates having the third gate stacks 603 thereon. For example, the second MLMS processing sequence can include a TEOS layer etching procedure, as described above, a TEOS Over-Etch (OE) etching procedure, as described above, an Ashing procedure, a "Break-Though" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

The second MLMS processing sequence can be modeled using a second MIMO Model 663, and the MIMO Model 663 can exchange Measured Variable (MV) data using transfer means 675, can exchange Disturbance Variable (DV) data using transfer means 680, and can exchange Controlled Variable (CV) data using transfer means 685. MIMO Model 663 can include MV data, DV data, and CV associated with the TEOS layer etching procedure, as described above, a TEOS Over-Etch (OE) etching procedure, as described above, an Ashing procedure, a "Break-Though" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

A third gate stack 603 is shown that includes a substrate layer 610 and a pattern of metal gate layer features 615b. For example, the substrate layer 610 can include a semiconductor material; the metal gate layer features 615b can include $HfO_2$. During a second MLMS processing sequence, the pattern of etched first hard mask features 645a and the pattern of etched gate-width control features 640a can be used to create the pattern of metal gate layer features 615b.

The third ODP model 664 can be established for the third gate stack 603, and the third ODP model 664 can be used to determine profile data for the metal gate layer features 615b and other layer-related data.

During MIMO model development, manipulated variables (MVs) can be established and can be fed forward and/or fed back using various paths 675; disturbance variables (DVs) can be established and can be fed forward and/or fed back using various paths 680; and controlled variables (CVs) can be established and can be fed forward and/or fed back using various paths 685. In addition, the number of feed forward and feed back paths (675, 680, and 685) actually used in the MIMO model can be optimized. DOE techniques can be used to examine the set of models (660-664) and to develop a reduced set of feed forward and feedback paths/variables. One or more of the three exemplary gate stacks (601-603) and one or more of the models (660-664) can be used during model development and DOE procedures. Recipe data and/or process data for one or more of the three exemplary gate stacks (601-603) and modeling data for one or more of the models (660-664) can be stored in libraries and used during MIMO modeling procedures. In addition, the first and second, MLMS processing sequences can be performed using one or more of the etch subsystems described herein in FIGS. 2A-2G and FIGS. 3A-3G.

FIG. 7 illustrates an exemplary view of a third multi-step modeling sequence for a creating a metal gate structure in accordance with embodiments of the invention. In other embodiments, the multi-layer metal-gate structures (701, 702, and 703, FIG. 7) can be created using a first Multi-Layer-Multi-Step (MLMS) processing sequence and a second Multi-Layer-Multi-Step (MLMS) processing sequence. For example, the first MLMS processing sequence can include a Si-ARC layer etching procedure, as described above, an etch-control layer (ECL) etching procedure, as described above, a TEOS layer etching procedure, as described above, a TEOS Over-Etch (OE) etching procedure, as described above, an Ashing procedure as described above. In addition, the second MLMS processing sequence can include, a "Break-Though" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

A first gate stack 701 is shown that includes a substrate layer 710, a metal gate layer 715, a third hard mask layer 720, a first silicon-containing layer 725, a second silicon-containing layer 730, a second hard mask layer 735, a gate-width control layer 740, a first hard mask layer 745, and a pattern of soft mask features 750. For example, the substrate layer 710 can include a semiconductor material; the metal gate layer 715 can include $HfO_2$; the third hard mask layer 720 can include TiN: the first silicon-containing layer 725 can include amorphous silicon (a-Si): the second silicon-containing layer 730 can include SiN; the second hard mask layer 735 can include TEOS; the gate-width control layer 740 can include Etch Control material; the first hard mask layer 745 can include Si-ARC material, and the soft mask features 750 can include photoresist material.

The first ODP model 760 can be established for the first gate stack 701, and the first ODP model 760 can be used to determine profile data for the photoresist features 750 and other layer-related data.

The patterned substrates having the first gate stacks 701 thereon can be processed using first MLMS processing sequence to create patterned substrates having the second gate stacks 702 thereon. For example, the first MLMS processing sequence can include a Si-ARC layer etching procedure, as described above, an etch-control layer (ECL) etching procedure, as described above, a TEOS layer etching procedure, as described above, a TEOS Over-Etch (OE) etching procedure, as described above, an Ashing procedure, as described above.

The third MLMS processing sequence can be modeled using models (760-764), and the models (760-764) can exchange Measured Variable (MV) data using transfer means 775, can exchange Disturbance Variable (DV) data using transfer means 780, and can exchange Controlled Variable (CV) data using transfer means 785. The models (760-764) can receive, create, process, and/or send MV data, DV data, and CV associated with the procedures described herein.

A second gate stack 702 is shown that includes a substrate layer 710, a metal gate layer 715, a third hard mask layer 720, a first silicon-containing layer 725, a second silicon-containing layer 730, a etched second hard mask features 735a. For example, the substrate layer 710 can include a semiconductor material; the metal gate layer 715 can include $HfO_2$; the third hard mask layer 720 can include TiN: the first silicon-containing layer 725 can include amorphous silicon (a-Si): the second silicon-containing layer 730 can include SiN; and the second hard mask features 735a can include TEOS. During a first MLMS processing sequence, the pattern of soft mask feature 750 can be used to create the pattern of etched hard mask features 735a.

The second ODP model 762 can be established for the second gate stack 702, and the second ODP model 762 can be used to determine profile data for the etched hard mask features 735a and other layer-related data.

The patterned substrates having the second gate stacks 702 thereon can be etched using a second MLMS processing sequence to create patterned substrates having the third gate stacks 703 thereon. For example, the second MLMS processing sequence can include a "Break-Though" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

The second MLMS processing sequence can be modeled using a second MIMO Model 763, and the MIMO Model 763 can exchange Measured Variable (MV) data using transfer means 775, can exchange Disturbance Variable (DV) data using transfer means 780, and can exchange Controlled Variable (CV) data using transfer means 785. MIMO Model 763 can include MV data, DV data, and CV associated with a "Break-Though" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

The second ODP model 762 can be established for the second gate stack 702, and the second ODP model 762 can be used to determine profile data for the gate-width control features 740a, the etched first hard mask features 745b, and other layer-related data.

During MIMO model development, manipulated variables (MVs) can be established and can be fed forward and/or fed back using various paths 775; disturbance variables (DVs) can be established and can be fed forward and/or fed back using various paths 780; and controlled variables (CVs) can be established and can be fed forward and/or fed back using various paths 785. In addition, DOE techniques can be used to examine the set of models (760-764) and to develop an optimum set of MIMO models. One or more of the three exemplary gate stacks (701-703) and one or more of the models (760-764) can be used during model development and DOE procedures. Recipe data and/or process data for one or more of the three exemplary gate stacks (701-703) and modeling data for one or more of the models (760-764) can be stored in libraries and used during MIMO modeling procedures. In addition, the first and second, MLMS processing sequences can be performed using one or more of the etch subsystems described herein in FIGS. 2A-2G and FIGS. 3A-3G.

Figure 8:
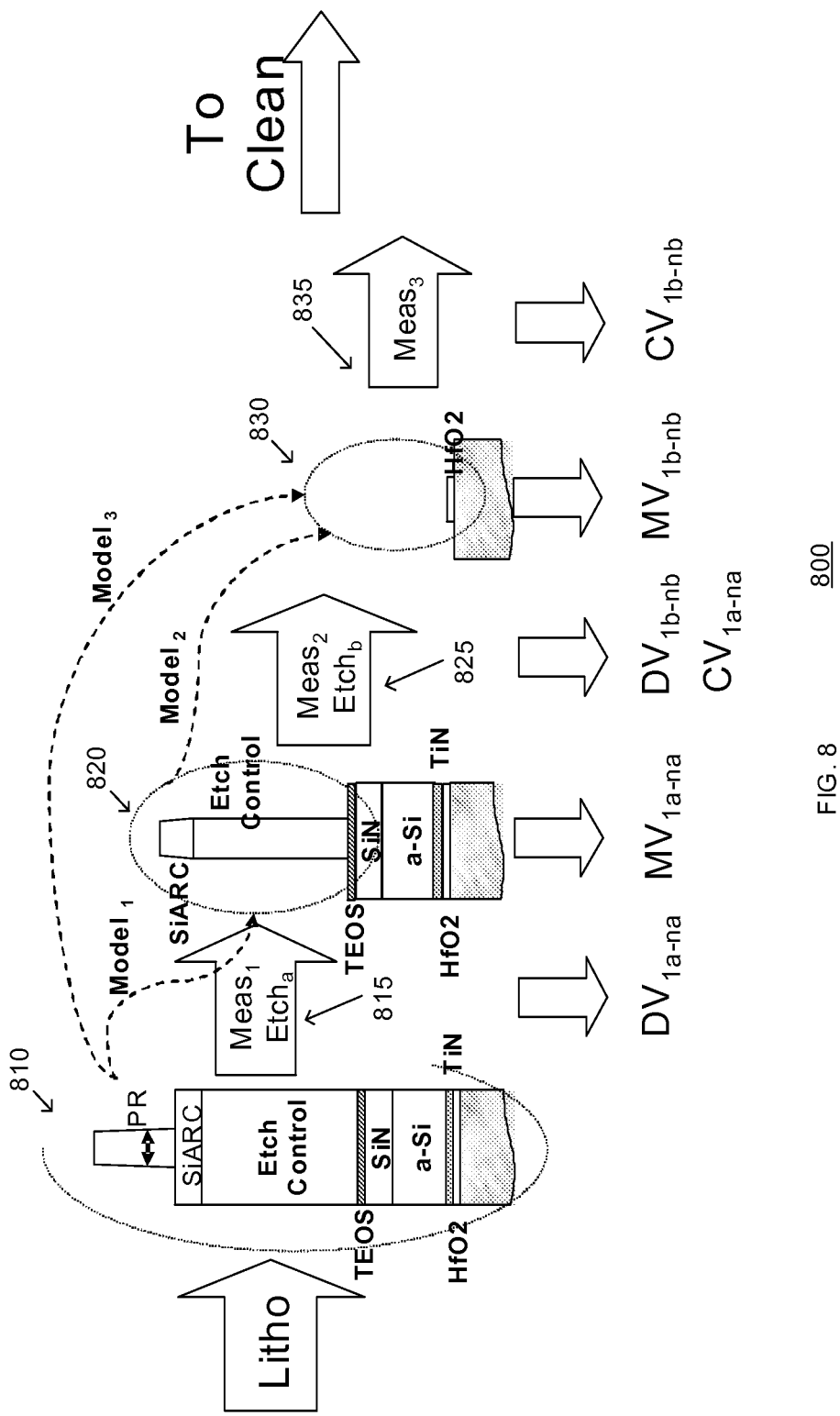
FIG. 8 shows an exemplary schematic view of a (VUV/EEDƒ) model in accordance with embodiments of the invention.

FIG. 8 shows an exemplary schematic view of a Multi-Input/Multi-Output (MIMO) model in accordance with embodiments of the invention. The exemplary schematic view 800 includes a first gate stack 810, a second gate stack 820, and a third gate stack 830. A first processing sequence 815 that can be used to create the second gate stack 820 from the first gate stack 810; a second processing sequence 825 that can be used to create the third gate stack 830 from the second gate stack 820; and a third processing sequence 835 that can be used to measure the third gate stack 830.

The first processing sequence 815 can include a first measurement procedure (Meas$_1$) and a first etch procedure Etch$_a$; the second processing sequence 825 can include a second measurement procedure (Meas$_2$) and a second etch procedure Etch$_b$; and the third processing sequence 835 can include a third measurement procedure (Meas$_3$).

The first model$_1$ can be used to model the first processing sequence 815 and can include a first set of disturbance variables DV$_{1a-na}$, a first set of manipulated variables MV$_{1a-na}$, and a first set of controlled variables CV$_{1a-na}$. The second model$_2$ can be used to model the second processing sequence 825 and can include a second set of disturbance variables DV$_{1b-nb}$, a second set of manipulated variables MV$_{1b-nb}$, and a second set of controlled variables CV$_{1b-nb}$.

Figure 9:
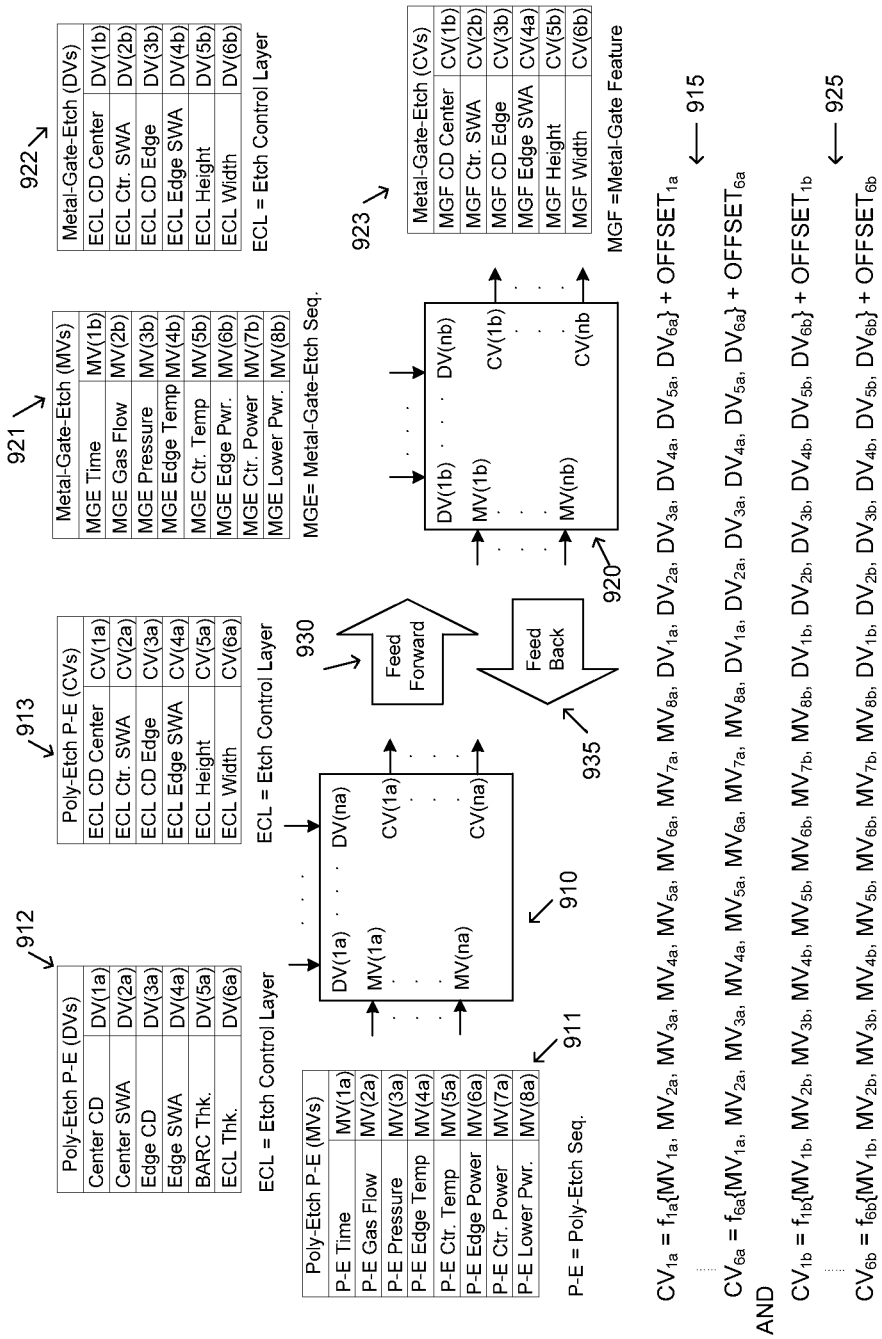
FIG. 9 illustrates exemplary block diagram for a two-part (VUV/EEDƒ) model in accordance with embodiments of the invention.

FIG. 9 illustrates exemplary block diagram for a two-part Multi-Input/Multi-Output (MIMO) model in accordance with embodiments of the invention.

A first generalized model 910 is shown that can be associated with a poly-etch (P-E) sequence and that includes a first set of MVs(1a-na), a first set of DVs(1a-na), and a first set of CVs(1a-na). A first set of exemplary MVs 911 is shown that includes eight manipulated variables {(MV(1a)-MV(8a)) that can be associated with the model 910. Alternatively, a different number of different manipulated variables may be associated with the first model 910. A first set of exemplary DVs 912 is shown that includes six disturbance variables {(DV(1a)-DV(6a)) that can be associated with the model 910. Alternatively, a different number of different disturbance variables may be associated with the first model 910. A first set of exemplary CVs 913 is shown that includes six controlled variables {(CV(1a)-CV(6a)) that can be associated with the model 910. Alternatively, a different number of different controlled variables may be associated with the first model 910. In addition, a first set of exemplary equations 915 is shown that can be associated with the model 910. Alternatively, other equations may be associated with the first model 910.

A second generalized model 920 is shown that can be associated with a metal-gate-etch (MGE) sequence and that includes a second set of MVs(1b-nb), a second set of DVs(1b-nb), and a second set of CVs(1b-nb). A second set of exemplary MVs 921 is shown that includes eight manipulated variables {(MV(1b)-MV(8b)) that can be associated with the second model 920. Alternatively, a different number of different manipulated variables may be associated with the second model 920. A second set of exemplary DVs 922 is shown that includes six disturbance variables {(DV(1b)-DV(6b)) that can be associated with the second model 920. Alternatively, a different number of different disturbance variables may be associated with the second model 920. A second set of exemplary CVs 923 is shown that includes six controlled variables {(CV(1b)-CV(6b)) that can be associated with the second model 920. Alternatively, a different number of different controlled variables may be associated with the second model 920. In addition, a second set of exemplary equations 925 is shown that can be associated with the second model 920. Alternatively, other equations may be associated with the second model 920.

One or more of the variables (911, 912, or 913) associated with the first model 910 can be fed forward 930 to the second model 920, and one or more of the variables (921, 922, or 923) associated with the second model 920 can be fed back 935 to the first model 910.

Figure 10:
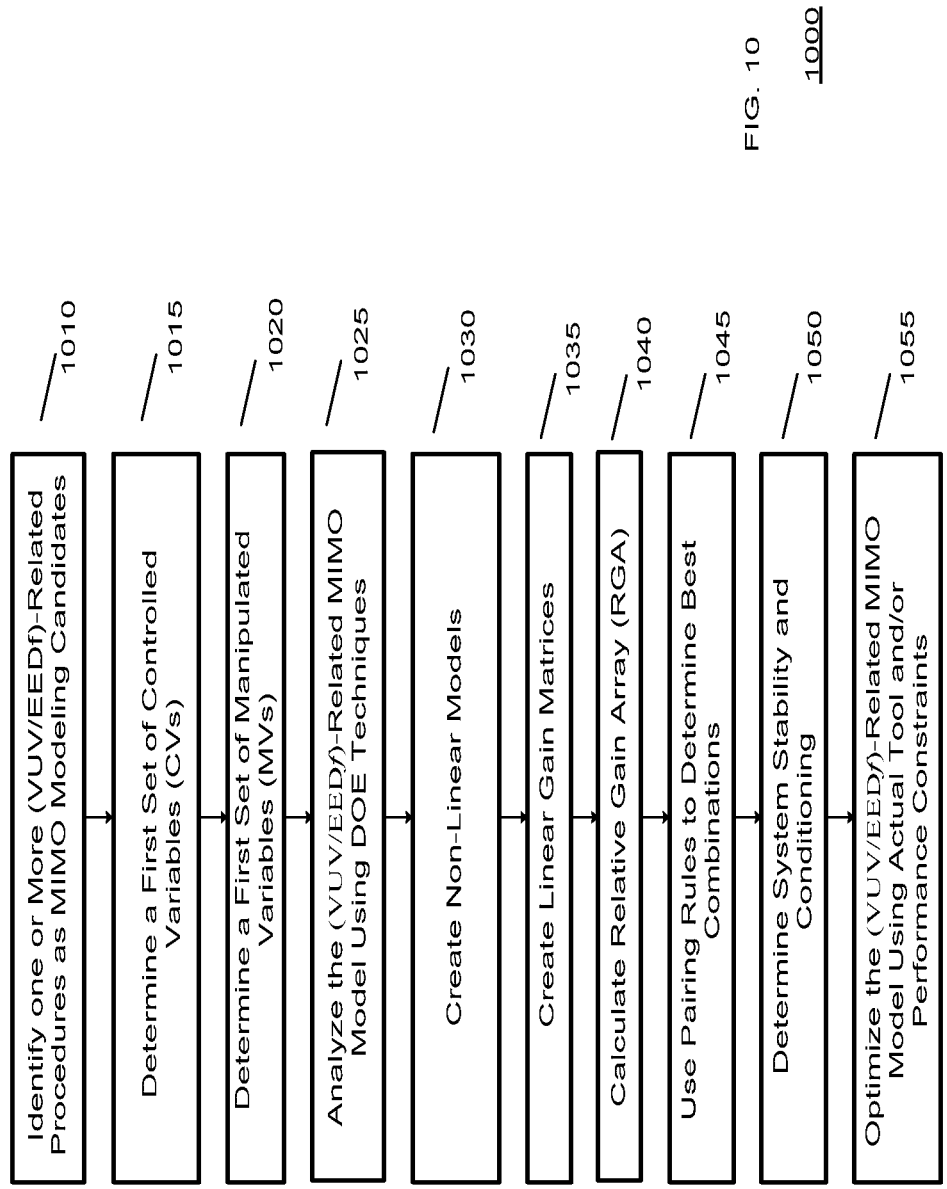
FIG. 10 illustrates an exemplary flow diagram for a procedure for developing a (VUV/EEDƒ) model in accordance with embodiments of the invention.

FIG. 10 illustrates an exemplary flow diagram for a procedure for developing a (VUV/EEDƒ) model in accordance with embodiments of the invention. In the illustrated embodiment, a procedure 1000 is shown having a number of steps. Alternatively, a different number of alternate steps may be used.

In 1010, one or more (VUV/EEDƒ)-related procedures or processing sequences can be identified as candidates for a MIMO modeling analysis procedure. In some examples, one or more MIMO models can be established to create one or more multi-layer metal-gate structures (601, 602, and 603, FIG. 6) and (701, 702, and 703, FIG. 7).

In 1015, a first set of controlled outputs variables (CVs) and the ranges associated with the CVs can be determined. One or more of the CVs can be specified by an end user or a customer. The CVs can include one or more critical dimensions (CDs) and/or one or more side wall angles associated with one or more of the multi-layer metal-gate structures (601, 602, and 603, FIG. 6) and (701, 702, and 703, FIG. 7). In some example, the multi-layer metal-gate structures (601, 602, and 603, FIG. 6) and (701, 702, and 703, FIG. 7) can be created using a Poly-Etch (PE) processing sequence and a metal-gate etch (MGE) processing sequence. For example, a metal-gate etch (MGE) sequence can be performed to create one or more metal-gate features in the gate stack, and different metal-gate etch sequences can be performed for pFET devices, nFET devices, Tri-gate devices, and FinFET devices.

In 1020, a first set of candidates can be determined for the manipulated variables (MVs) associated with the (VUV/EEDƒ)-related MIMO model using one or more candidate recipes. The MVs can include WiW manipulated variables (WiW-MVs), and the WiW-MVs can include "fast" MVs that can be controlled while a substrate is being processed. The MVs can include W2W manipulated variables (W2W-MVs), and the W2W-MVs can include "slow" MVs that can be controlled when a substrate lot is being processed. The ranges for the MVs can be examined for each step in a candidate recipe.

When a two-zone substrate holder with a fast response time is used, the center temperature and the edge temperature for the substrate holder can be used as (WiW-MVs) and can be changed on a step by step basis. When a RF source with a fast response time is used with a split upper electrode and power splitter, the center RF power and the edge RF power for the plasma can be used as (WiW-MVs) and can be changed on a step by step basis. When a low temperature chiller (−10 degrees C.) is used, there can be a larger temperature delta center to edge. In addition, pressure, time, and gas flows can be used as MVs.

The disturbance variables (DVs) can include resist CD and SWA at the center and edge, the etch control layer CD and SWA at the center and edge, the layer thicknesses at the center and edge, the chemical and etch rate properties of the different layers, the maintenance events on chamber, the chamber-to-chamber data, and IM-to-IM data.

In 1025, Design of Experiment (DOE) procedures can be performed to analyze the (VUV/EEDƒ)-related MIMO model. Using physical analysis and engineering experience, DOE procedures can be performed to establish statistical models that can connect MVs with each CV. When the number of experiments increases, a more accurate model can be obtained, but at the expense of additional materials and time. Therefore, cost and availability can limit the number of DOE substrates. In order to reduce them as much as possible but also prevent inaccuracy, a well designed DOE is of key importance. The most critical factor for such a DOE is the format of the predicted model. One or more model types can be selected, ranges can be provided for the CVs and/or MVs, and statistical software, such as JMP® statistical software from the SAS Institute) can be used to establish one or more of the DOE tables). The DOE data can be used to establish a candidate MVs, CVs, and DVs that can be associated with a first poly-etch (P-E) sequence, and a metal-gate etch (MGE) sequence. In other analysis procedures, other MVs, DVs, and CVs can be used. In some embodiments, the chamber state data for the etching chambers and the IM chambers can be used as manipulated variables, Alternatively, the process modeling may assume that the chamber state is stable between substrates and/or lots.

In some embodiments, the PE processing sequence can include a Si-ARC layer etching procedure, an etch-control layer (ECL) etching procedure, a TEOS layer etching procedure, a TEOS Over-Etch (OE) etching procedure, and an Ashing procedure. In addition, the metal-gate etch (MGE) processing sequence can include a "Break-Though" (BT) etching procedure, a main etch (ME) etching procedure, an Over-Etch (OE) etching procedure, a Titanium-Nitride (TiN) etching procedure, and a HK etching procedure. DOE data can be obtained for the P-E processing sequence and for the metal-gate etch (MGE) processing sequences.

In 1030, after performing the P-E sequences and the metal-gate etch sequences required to populate one or more DOE tables, nonlinear models with quadratic and interaction terms can be created by using a least squares technique and statistical software. In some models, terms can be deleted that have extremely small coefficients associated with them.

In 1035, one or more linear gain matrices (G) can be created using the DOE data. For example, $$\lambda ij = \frac{\left[\frac{\partial CV_i}{\partial MV_j}\right]_{MV_{k,k\neq j}}}{\left[\frac{\partial CV_i}{\partial MV_j}\right]_{CV_{k,k\neq j}}} = \frac{\text{Gain(open} - \text{loop)}}{\text{Gain(closed} - \text{loop)}}$$

for i=1, 2, ..., n and j=1, 2, ..., n. The symbol $(\partial CV_i/\partial MV_j)_{MV}$ denotes a partial derivative that is evaluated with all of the manipulated variables except $MV_j$ held constant, and this term is the open-loop gain between $CV_i$ and $MV_j$. In addition, the symbol $(\partial CV_i/\partial MV_j)_{CV}$ can be interpreted as a closed loop gain that indicates the effect of $MV_j$ and $CV_i$ when all of the control loops are closed.

When a non-square matrix is obtained, some of the MVs or CVs may be eliminated to create a square matrix. In addition, when there are more MV's than CVs, the non-square matrix can be analyzed using a non-square RGA (NRGA). For example, $$\text{NRGA} = G(x) \ (G^+)^T$$

and the pseudo-inverse, $G^+$, is used instead of the normal inverse, $G^{-1}$. NRGA provides several criteria for the selection of a square system, but their criteria are not always valid in some non-square systems, so all combinations of square pairing of subsystems might need considered. To compare one subsystem with others RGA pairing rules can be used as a metric. This creates sub combinations that can then be compared for best square matrix.

In 1040, one or more Relative Gain Arrays (RGA) can be calculated using one or more of the linear gain matrices (G). For example, when square matrices are used, $$\text{RGA} = G(x) \ (G^{-1})^T$$

where G is the gain matrix and $G^{-1}$ is the inverse gain matrix.

In 1045, pairing rules in the RGA can be used to investigate the best combinations of MVs and CVs. RGA analysis can be used for measured model parameter selection, and CV-MV pairs can be selected such that their sum is closest to one. In addition, paring on negative elements can be avoided. In addition, the RGA analysis can be used to determine a number of candidate models and to identify the best case solution. When there are more CVs than MVs, RGA analysis can be used for selecting the most controllable CV (sensitivity analysis of CVs to MVs).

In 1050, the system stability and conditioning can be determined. For example, the Niederlinski Stability Theorem states that a closed loop system resulting from diagonal pairing is unstable if:

$$NST = \frac{\det(G)}{\prod_{i=1}^{n} g_{ii}} < 0$$

where G is the gain matrix and $g_{ii}$ is the diagonal elements of the gain matrix. The condition of the gain matrix (G) can be determined using the following:

$$G = USV^T$$

where G, U, S, and V are matrices determined using singular value decomposition (SVD). In addition, a condition number (CN) can be determined using the ratio of the larger value to the smaller value in the S matrix. Additional information concerning the Niederlinski Theorem may be found in a book (ISBN 1852337761) entitled "Process Control: Theory and Applications" by Jean-Pierre Corriou which is incorporated herein in its entirety. For example, when CN is greater than fifty, the system is nearly singular and will have poor control performance.

In 1055, the MIMO model can be optimized using actual equipment and/or performance constraints. In some examples, the measurement locations can be examined and selected to optimize performance, the number of pre- and/or post measurement procedure can be established to optimize performance, the multi-chamber sequences can be examined to optimize throughput. The feedback can be optimized by tuning the EWMA filters. The time constants for the MVs can be determined, and their update frequency can be based on Lot-to-Lot (L2L), W2W, WiW, and process step values. In addition, process center points, CV center points, and MV center points can be examined to optimize performance. Historical data can be used to perform simulations.

The substrates can include one or more layers that can include semiconductor material, carbon material, dielectric material, glass material, ceramic material, metallic material, oxidized material, mask material, or planarization material, or a combination thereof.

In other embodiments, one or more substrates can be processed using a verified MIMO model and a verified processing sequence. When a verified MIMO model is used, one or more verified metal-gate structures can be created on a test substrate, and when the test substrate is examined, a test reference periodic structure can be used. During the examination, examination data can be obtained from the test reference periodic structure. A best estimate structure and associated best estimate data can be selected from the MIMO library that includes verified metal-gate structures and associated data. One or more differences can be calculated between the test reference periodic structure and the best estimate structure from the library, the differences can be compared to matching criteria, creation criteria, or product requirements, or any combination thereof. When matching criteria are used, the test reference periodic structure can be identified as a member of the MIMO library, and the test substrate can be identified as a reference "golden" substrate if the matching criteria are met or exceeded. When creation criteria are used, the test reference periodic structure can be identified as a new member of the MIMO library, and the test substrate can be identified as a verified reference substrate if the creation criteria are met. When product requirement data is used, the test reference periodic structure can be identified as a verified structure, and the test substrate can be identified as verified production substrate if one or more product requirements are met. Corrective actions can be applied if one or more of the criteria or product requirements are not met. MIMO-related confidence data and/or risk data can be established for the test reference structure using the test reference structure data and the best estimate structure data. For example, the MIMO evaluation library data can include goodness of fit (GOF) data, creation rules data, measurement data, inspection data, verification data, map data, confidence data, accuracy data, process data, or uniformity data, or any combination thereof.

When metal-gate-related structures are produced and/or examined, accuracy and/or tolerance limits can be used. When these limits are not correct, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

Figure 11:
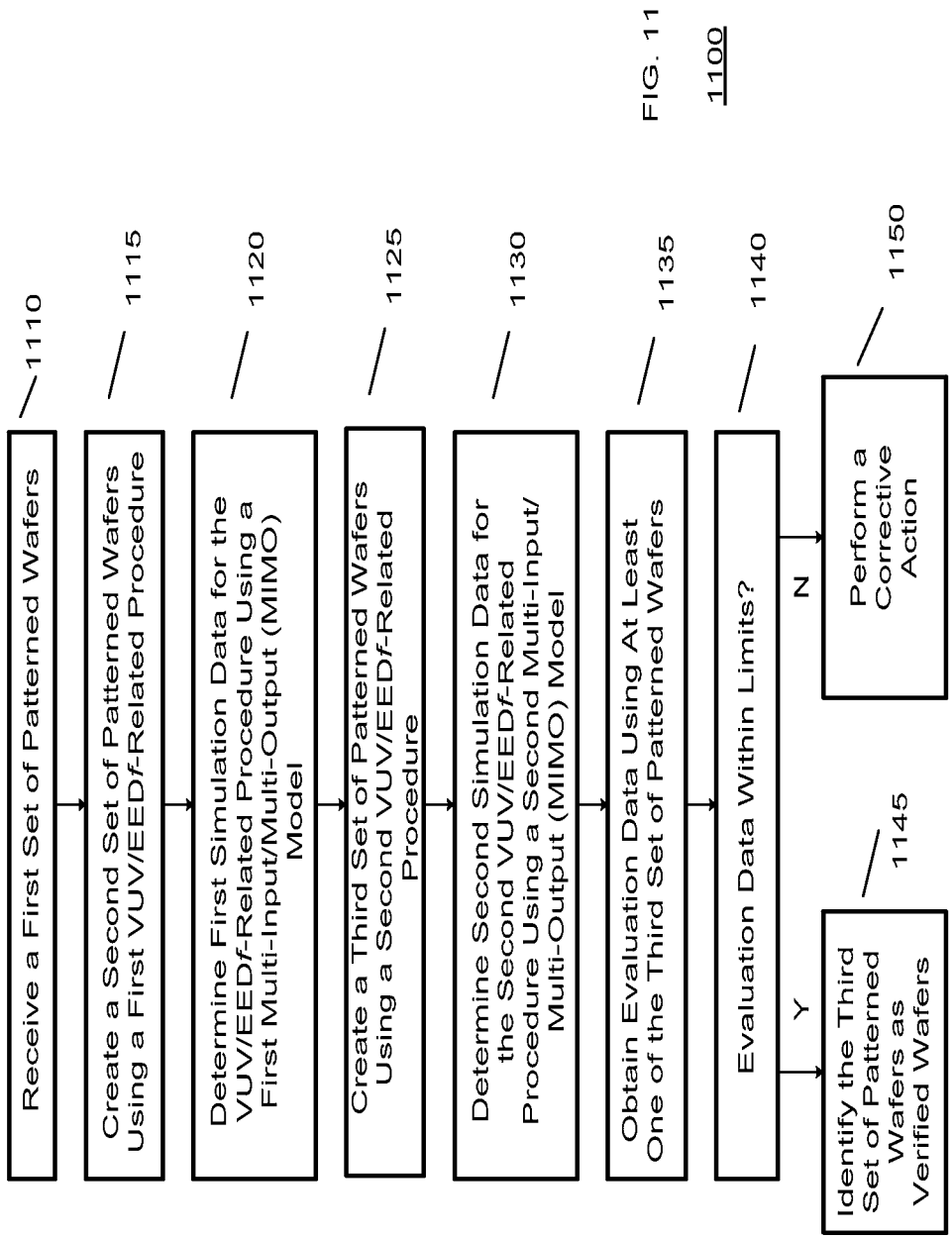
FIG. 11 illustrates a simplified flow diagram of a procedure for using a (VUV/EEDƒ)-related MIMO model in accordance with embodiments of the invention.

FIG. 11 illustrates a simplified flow diagram of a procedure for using a (VUV/EEDf)-related MIMO model in accordance with embodiments of the invention.

In 1110, a first set of patterned substrates and associated substrate data can be received by a processing system, and each patterned substrate can include a first patterned soft-mask layer and a plurality of additional layers. The first patterned soft-mask layer can include a plurality of gate-related soft-mask features and at least one first periodic evaluation structure. The substrate data can include real-time integrated metrology (IM) data for the at least one periodic structure in the first patterned soft-mask layer.

In 1115, a second set of patterned substrates can be created using a first (VUV-EEDf)-related procedure, and the first (VUV-EEDf)-related procedure can be configured to create a first intermediate pattern in a controlled masking layer by patterning a first set of the additional layers using the first patterned soft-mask layer.

In 1120, first simulation data can be determined for the first (VUV-EEDf)-related procedure using a first Multi-Input/Multi-Output (MIMO) model for the first (VUV-EEDf)-related procedure. The first MIMO model can include a first number ($N_a$) of first Controlled Variables ($CV_{1a}, CV_{2a}, \ldots CV_{Na}$), a first number ($M_a$) of first Manipulated Variables ($MV_{1a}, MV_{2a}, \ldots MV_{Ma}$), and a first number ($L_a$) of first Disturbance Variables ($DV_{1a}, DV_{2a}, \ldots DV_{La}$), where ($L_a$, $M_a$, and $N_a$) are integers greater than one.

In 1125, a third set of patterned substrates can be created using a second (VUV-EEDf)-related procedure, and the second (VUV-EEDf)-related procedure can be configured to create a first pattern of metal-gate structures by patterning a second set of the additional layers using the first intermediate pattern in the controlled masking layer.

In 1130, second simulation data can be created for the second (VUV-EEDf)-related procedure using a second MIMO model for the second (VUV-EEDf)-related procedure. The second MIMO model can include a second number ($N_b$) of second Controlled Variables ($CV_{1b}, CV_{2b}, \ldots CV_{Nb}$), a second number ($M_b$) of second Manipulated Variables ($MV_{1b}, MV_{2b}, \ldots MV_{Mb}$), and a second number ($L_b$) of second Disturbance Variables ($DV_{1b}, DV_{2b}, \ldots DV_{Lb}$), where ($L_b$, $M_b$, and $N_b$) are integers greater than one.

In 1135, evaluation data can be obtained for at least one of the third set of patterned substrates.

In 1140, a query can be performed to determine if the evaluation data is within one or more limits. When the evaluation data is within one or more of the limits, procedure 1100 can branch to 1145. When the evaluation data is not within one or more of the limits, procedure 1100 can branch to 1150.

In 1145, the third set of patterned substrates can be identified as verified substrates when the evaluation data is less than a first gate limit.

In 1150, a corrective action can be performed when the evaluation data is not less than the first gate limit.

Figure 12:
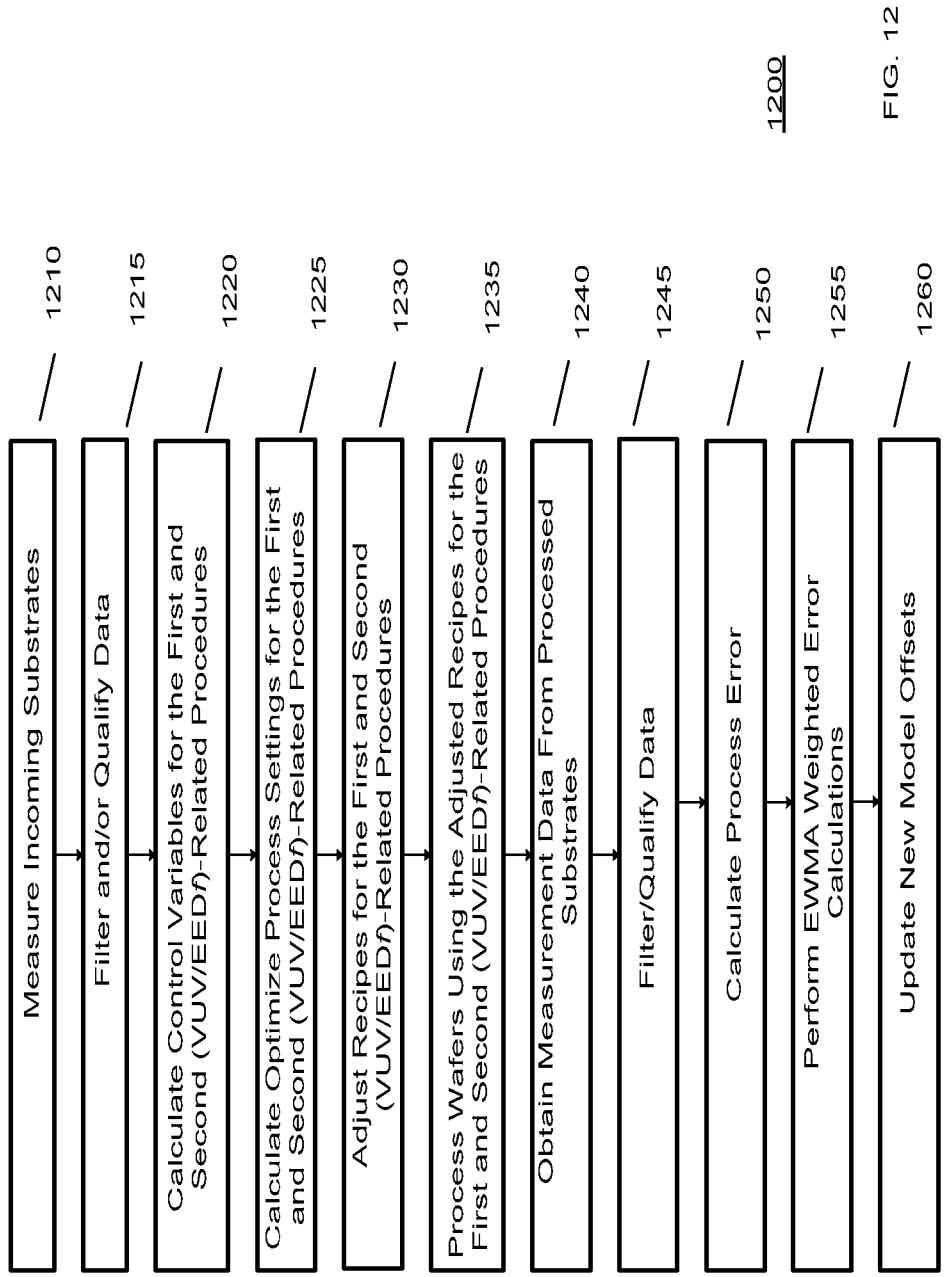
FIG. 12 illustrates a runtime flow diagram of a procedure for using a MIMO in accordance with embodiments of the invention.

FIG. 12 illustrates a runtime flow diagram of a procedure for using a MIMO in accordance with embodiments of the invention. When data is collected, a number of substrates can be used and candidate disturbance variables can be identified. During data collection, the variations associated with one or more CVs can be minimized, and the collected data can be used for a simulation. The simulation can execute the same sequence as the gate etch process used in production.

In 1210, one or more substrates can be measured in an integrated metrology chamber and values for a first number (1) of disturbance variables D(1) can be obtained. In addition, other sensor data can be received and analyzed. The IM data can include CD and SWA data from multiple sites in a patterned masking layer on each incoming substrate. A second number (m) of manipulated variables MV(m) can be established.

In some embodiments, the incoming disturbance variables related to substrate state can be measured by using an IM tool, and the IM data can include profile data, CD data, SWA data, and BARC film thickness data at multiple sites across the substrate. For example, 8-10 center sites can be selected that can represent the center of the substrate, and 8-10 edge sites at the same radius can be selected that represent the edge radial signature and that can be optimum for etch control. The same number of sites can be selected for each area of the substrate to give the same weighting of accuracy to all areas. Grating density and transistor type should be selected to correlate to the most critical chip level performance metric (such as P or N channel transistor type) because each of the transistor structures can have some variations that can be related to the etch profile control needs.

The CD DV can be a critical DV and can have associated DVs that modify the measurement due to the mechanisms at work during the Poly-Etch (P-E) procedures. SWA can be a primary modifier that increases in sensitivity as the angle become less than ninety degrees, In addition, the middle CD can be used if it gives the most accurate correlation to the final CD. Middle CD performs the best in simple terms because it averages the variation of the top and bottom CD measurements.

A second modifier of CD can be the BARC thickness variation across the substrate and water-to-substrate. BARC thickness can affect CD if the thickness is non-uniform because during the BARC etch the resist is continuing to be etched. A thinner BARC can give a shorter etch time, and thicker BARC can give a longer etch time, and a longer etch time will result in a smaller CD. Therefore, BARC non-uniformity can directly result in increased center to edge CD variation that will need to be modeled for control during the partial and final etch.

The IM data can be obtained after a development procedure, and the IM data can be obtained using as IM unit in a Lithography subsystem, an IM unit in an Etch subsystem, or a standalone IM unit.

In addition, sensor and state data can be used for DVs indicating a predicted plasma chamber state. For example, when lots (substrates) are being processed without using conditioning substrates, the chamber state can be affected by drift. Variations that contribute to chamber state feed forward DV can include events such as chamber cleans, parts replacements, chemical changes, idle time, conditioning substrates, chamber pause, manual adjustments, substrate material changes, and product density changes.

In 1215, the received data can be filtered and/or qualified. For example, the measurement DVs can be filtered using a box and whisker algorithm that eliminates sites that do not statically appear to be of the same population, and the remaining site can be averaged to represent the physical area of the substrate.

In 1220, one or more of the CVs can be calculated and CDs, SWAs, uniformity values, and/or profile changes can be determined for the poly-etch sequence. In some examples, a third number ($N_a$) of control variables can be established using the following:

$$CV(N_a) = f_{Na}\{MV(1a), \ldots MV(Ma-1), MV(Ma), DV(1a), \ldots DV(La-1), DV(La)\} + \text{offset}_{Na}$$

where $L_a$, $M_a$, and $N_a$ are integers that are greater than two.

For example, when four CVs, six MVs, and four DVs have been identified, four non-linear models with higher order and interaction terms can be defined as:

$$CV(1a) = f_{1a}\{MV(1a), MV(2a), MV(3a), MV(4a), MV(5a), MV(6a), DV(1a), DV(2a), DV(3a), DV(4a)\} + \text{offset}_{1a}$$

$$CV(2a) = f_{2a}\{MV(1a), MV(2a), MV(3a), MV(4a), MV(5a), MV(6a), DV(1a), DV(2a), DV(3a), DV(4a)\} + \text{offset}_{2a}$$

$$CV(3a) = f_{3a}\{MV(1a), MV(2a), MV(3a), MV(4a), MV(5a), MV(6a), DV(1a), DV(2a), DV(3a), DV(4a)\} + \text{offset}_{3a}$$

$$CV(4a) = f_{4a}\{MV(1a), MV(2a), MV(3a), MV(4a), MV(5a), MV(6a), DV(1a), DV(2a), DV(3a), DV(4a)\} + \text{offset}_{4a}$$

In addition, optimized process settings can be calculated using a quadratic objective function, and target deviation CVs can be defined as:

$$t(N_a) = \{DV(La) - \text{target } CV(N_a)\}$$

when Na=4 and La=4 the following equations can be obtained:

$$t(1a) = \{DV(1a) - \text{target } CV(1a)\}$$

$$t(2a) = \{DV(2a) - \text{target } CV(2a)\}$$

$$t(3a) = \{DV(3a) - \text{target } CV(3a)\}$$

$$t(4a) = \{DV(4a) - \text{target } CV(4a)\}.$$

Using the models and the target terms, a first quadratic objective function that can be used for the nonlinear programming associated with the poly-etch sequence can be defined as:

$$\min_{MV(1a), MV(2a), MV(Ma-1), MV(Ma)} \left\{ \left(\frac{t(1a) - CV(1a)}{t(1a)}\right)^2 w_{1a} + \left(\frac{t(2a) - CV(2a)}{t(2a)}\right)^2 w_{2a} \ldots + \left(\frac{t(Ma-1) - CV(Ma-1)}{t(Ma-1)}\right)^2 w_{ja-1} + \left(\frac{t(Ma) - CV(Ma)}{t(Ma)}\right)^2 w_{ja} \right\} \quad \text{Eq. 1}$$

and when Na=4 the following simplified equation can be obtained $$\min_{MV(1a), MV(2a), MV(3a), MV(4a)} \left\{ \left(\frac{t(1a) - CV(1a)}{t(1a)}\right)^2 w_{1a} + \left(\frac{t(2a) - CV(2a)}{t(2a)}\right)^2 w_{2a} + \left(\frac{t(3a) - CV(3a)}{t(3a)}\right)^2 w_{3a} + \left(\frac{t(4a) - CV(4a)}{t(4a)}\right)^2 w_{4a} \right\} \quad \text{Eq. 1a}$$

and the $w_{ja}$ are weighting factors. In addition, the manipulated variables MV(la) can have upper and lower limits that can be included as inequality constraints and when (la=4) the following can be established:

$$a1 \leq MV(1a) \leq b1$$

$$c1 \leq MV(2a) \leq d1$$

$$e1 \leq MV(3a) \leq f1$$

$$g1 \leq MV(4a) \leq h1 \quad \text{Eq. 2}$$

where a1-h1 are constants that depend on the equipment constraints. The measured CD and SWA values can be used by the optimizer unit to calculate the MV, and the optimizer can determine the poly-etch recipe by minimizing Eq. (1a) with Eq. (2) using nonlinear programming. For example, the MATLAB optimization toolbox can be used for this simulation.

In addition, one or more of the CVs can be calculated, and CDs, SWAs, uniformity values, and/or profile changes can be determined for the metal-gate-etch sequence. In some examples, a third number (Nb) of control variables can be established using the following:

$$CV(Nb) = f_{Nb}\{MV(1b), \ldots MV(Mb-1), MV(Mb), DV(1b), \ldots DV(Lb-1), DV(Lb)\} + \text{offset}_{Nb}$$

where Lb, Mb, and Nb are integers that are greater than two.

For example, when four CVs, six MVs, and four DVs have been identified, four non-linear models with higher order and interaction terms can be defined as:

$$CV(1b) = f_{1b}\{MV(1b), MV(2b), MV(3b), MV(4b), MV(5b), MV(6b), DV(1b), DV(2b), DV(3b), DV(4b)\} + \text{offset}_{1b}$$

$$CV(2b) = f_{2b}\{MV(1b), MV(2b), MV(3b), MV(4b), MV(5b), MV(6b), DV(1b), DV(2b), DV(3b), DV(4b)\} + \text{offset}_{2b}$$

$$CV(3b) = f_{3b}\{MV(1b), MV(2b), MV(3b), MV(4b), MV(5b), MV(6b), DV(1b), DV(2b), DV(3b), DV(4b)\} + \text{offset}_{3b}$$

$$CV(4b) = f_{4b}\{MV(1b), MV(2b), MV(3b), MV(4b), MV(5b), MV(6b), DV(1b), DV(2b), DV(3b), DV(4b)\} + \text{offset}_{4b}$$

In 1225, optimized process settings can be calculated using a quadratic objective function, and target deviation CVs can be defined as:

$$t(Nb) = \{DV(Lb) - \text{target } CV(Nb)\}$$

when Nb=4 and Lb=4 the following equations can be obtained:

$$t(1b) = \{DV(1b) - \text{target } CV(1b)\}$$

$$t(2b) = \{DV(2b) - \text{target } CV(2b)\}$$

$$t(3b) = \{DV(3b) - \text{target } CV(3b)\}$$

$$t(4b) = \{DV(4b) - \text{target } CV(4b)\}.$$

Using the models and the target terms, a second quadratic objective function that can be used for the nonlinear programming associated with the metal-gate-etch sequence can be defined as:

$$\min_{MV(1b), MV(2b), MV(Mb-1), MV(Mb)} \left\{ \left(\frac{t(1b) - CV(1b)}{t(1b)}\right)^2 w_{1b} + \left(\frac{t(2b) - CV(2b)}{t(2b)}\right)^2 w_{2b} \ldots + \left(\frac{t(Mb-1) - CV(Mb-1)}{t(Mb-1)}\right)^2 w_{jb-1} + \left(\frac{t(Mb) - CV(Mb)}{t(Mb)}\right)^2 w_{jb} \right\} \quad \text{Eq. 3}$$

and when Nb=4 the following simplified equation can be obtained $$\min_{MV(1b), MV(2b), MV(3b), MV(4b)} \left\{ \left(\frac{t(1b) - CV(1b)}{t(1b)}\right)^2 w_{1b} + \left(\frac{t(2b) - CV(2b)}{t(2b)}\right)^2 w_{2b} + \right. \quad \text{Eq. 3a}$$

-continued
$$\left. \left(\frac{t(3b) - CV(3b)}{t(3b)}\right)^2 w_{3b} + \left(\frac{t(4b) - CV(4b)}{t(4b)}\right)^2 w_{4b} \right\}$$

and the $w_{jb}$ are weighting factors. In addition, the manipulated variables MV(lb) can have upper and lower limits that can be included as inequality constraints and when (lb=4) the following can be established:

$$a2 \leq MV(1b) \leq b2$$

$$c2 \leq MV(2b) \leq d2$$

$$e2 \leq MV(3b) \leq f2$$

$$g2 \leq MV(4b) \leq h2 \quad \text{Eq. 4}$$

where a2-h2 are constants that depend on the equipment constraints. The measured CD and SWA values can be used by the optimizer unit to calculate the MV, and the optimizer can determine the metal-gate-etch recipe by minimizing Eq. (3a) with Eq. (4) using nonlinear programming. For example, the MATLAB optimization toolbox can be used for this simulation.

In 1230, process recipes can be defined for the first (VUV/EEDƒ)-related procedure (poly-etch sequence) and the second (VUV/EEDƒ)-related procedure (metal-gate-etch sequence) using one or more of the MVs established by the optimizer, and the process recipes can be adjusted using the new values for the MVs. Nonlinear optimization can be used to treat nonlinear relationships and constraints associated with (VUV/EEDƒ)-related procedures (etch processes) to maximize performance of first (VUV/EEDƒ)-related procedure (poly-etch sequence) and the second (VUV/EEDƒ)-related procedure (metal-gate-etch sequence) by adjusting the recipes after each run.

The IM data can be fed forward to the optimizer to calculate the value of manipulated variables (MV). The nonlinear model formulas associated with each controlled variable (CV) can be used with each CV target value. A quadratic objective function can utilize weighting factors to prioritize each CV term in the objective function, and an optimizer in the MIMO can be used to determine etch recipe by minimizing or maximizing the objective function with the constraints of MVs using nonlinear programming.

In 1235, one or more of the substrates can be processed using the adjusted recipes. For example, the adjusted recipes can include optimized MVs from the optimizer for the first (VUV/EEDƒ)-related procedure (poly-etch sequence) and the second (VUV/EEDƒ)-related procedure (metal-gate-etch sequence).

In 1240, measurement data can be obtained for one or more of the processed substrates. For example, measurements can be made at one or more sites on the substrate. The output CVs can be measured using the IM tool after the first (VUV/EEDƒ)-related procedure (poly-etch sequence) is performed and/or after the second (VUV/EEDƒ)-related procedure (metal-gate-etch sequence) is performed.

In 1245, the data obtained from the first (VUV/EEDƒ)-related procedure (poly-etch sequence) and the second (VUV/EEDƒ)-related procedure (metal-gate-etch sequence) can be filtered and/or qualified.

In 1250, a process error can be calculated for the first (VUV/EEDƒ)-related procedure (poly-etch sequence) and the second (VUV/EEDƒ)-related procedure (metal-gate-etch sequence). For example, errors (actual outputs minus model outputs) can be calculated for each CV.

In 1255, feedback data items can be calculated for the first (VUV/EED$f$)-related procedure (poly-etch sequence) and the second (VUV/EED$f$)-related procedure (metal-gate-etch sequence). For example, errors can be used to update the MIMO model CVs offsets using an exponentially weighted moving average (EWMA) filter.

In 1260, new model offsets can be updated for the first (VUV/EED$f$)-related procedure (poly-etch sequence) and the second (VUV/EED$f$)-related procedure (metal-gate-etch sequence). These offset values can be provided to the optimizer unit to be used for compensating the disturbance for next run. This offset is used until a new update comes out. This procedure can be performed until the final substrate is processed.

When send-ahead substrate are used, IM data can be obtained at intermediate points in the first (VUV/EED$f$)-related procedure (poly-etch sequence) and the second (VUV/EED$f$)-related procedure (metal-gate-etch sequence). When new and/or additional measurement data, inspection data, and/or evaluation data is required, additional MIMO data can be obtained from one or more sites on the substrate. For example, measurement structures, such as periodic gratings, periodic arrays, and/or other periodic structures, on a substrate can be measured at one or more sites.

In a first alternate embodiment, the first (VUV/EED$f$)-related procedure (poly-etch sequence) can further include: a1) transferring a first patterned to a first multi-zone temperature-controlled substrate holder in a first etching chamber using a transfer subsystem coupled to the first etching chamber, wherein the transfer subsystem is configured to prevent an oxide layer from forming on the first patterned during the transferring; a2) performing a first etch procedure in the first multi-layer etch sequence wherein the first etch procedure is configured to create a first set of patterned layers using the first patterned soft-mask layer, the first set of patterned layers including an etched first hard mask layer having a plurality of first hard mask features, and an etched soft-mask layer having a plurality of etched soft mask features, wherein the first hard-mask layer comprises a silicone-containing anti-reflective coating (ARC) material; a3) performing a second etch procedure in the first multi-layer etch sequence wherein the second etch procedure is configured to create a first intermediate pattern in a second set of patterned layers using the etched first hard mask layer, the second set of patterned layers including a re-etched first hard mask layer having a plurality of etched first hard mask features, and an etched gate-width control layer having a plurality of gate-width control features, wherein the first intermediate pattern includes at least one second periodic evaluation structure, wherein the gate-width control layer comprises a modified photoresist material; a4) obtaining first evaluation data for the first patterned using the at least one second periodic evaluation structure.

In a second alternate embodiment, the first (VUV/EED$f$)-related procedure (poly-etch sequence) can further include: b1) transferring the first patterned to a second temperature-controlled substrate holder in a second etching chamber using the transfer subsystem coupled to the second etching chamber, wherein the transfer subsystem is configured to prevent an oxide layer from forming on the first patterned during the transferring, the first patterned being transferred after the first multi-layer etch sequence is identified as a verified multi-layer etch sequence; b2) performing a third etch procedure, wherein the third etch procedure is configured to create a second intermediate pattern in a third set of patterned layers using the re-etched first hard mask layer and/or the etched gate-width control layer, the third set of patterned layers including a re-etched gate-width control layer having a plurality of etched gate-width control features, an etched second hard-mask layer (titanium-nitride (TiN)) layer having a plurality of second hard mask features, an etched silicone-nitride (SiN) layer having a plurality of silicone-nitride (SiN) features, an etched amorphous silicone (a-Si) layer having a plurality of amorphous silicone (a-Si) features, and an etched second hard-mask (TEOS) layer having a plurality of second hard-mask features; b3) transferring the first patterned to a third temperature-controlled substrate holder in a first cleaning chamber using the transfer subsystem coupled to the first cleaning chamber, wherein the transfer subsystem is configured to prevent an oxide layer from forming on the first patterned during the transferring; b4) performing a first cleaning procedure in the second multi-layer etch sequence wherein a fourth set of patterned masking layers is created, wherein the fourth set of patterned masking layers comprises a cleaned second hard-mask (TEOS) layer having a plurality of cleaned second hard-mask features, a cleaned silicone-nitride (SiN) layer having a plurality of cleaned silicone-nitride (SiN) features, a cleaned amorphous silicone (a-Si) layer having a plurality of cleaned amorphous silicone (a-Si) features, a cleaned first hard-mask layer (titanium-nitride (TiN)) layer having a plurality of cleaned third hard mask features; b5) transferring the first patterned to a fourth temperature-controlled substrate holder in a fourth etching chamber using the transfer subsystem coupled to the fourth etching chamber, wherein the transfer subsystem is configured to prevent an oxide layer from forming on the first patterned during the transferring; b6) performing a fourth etch procedure in the second multi-layer etch sequence wherein the fourth etch procedure is configured to create a fourth intermediate pattern in a fourth set of patterned layers using the cleaned second hard-mask (TEOS) layer, the cleaned silicone-nitride (SiN) layer, the cleaned amorphous silicone (a-Si) layer, or the cleaned third hard-mask layer (titanium-nitride (TiN)) layer, or any combination thereof, the fourth set of patterned layers including a plurality of gate stacks, each gate stack comprising a metal-containing feature, a titanium-nitride (TiN) feature, an amorphous silicon feature, a silicone-nitride (SiN) feature and a TEOS feature; b7) obtaining additional evaluation data for the first patterned using at least one additional periodic evaluation structure, wherein the fourth intermediate pattern comprising the at least one additional periodic evaluation structure; b8) identifying the second multi-layer etch sequence as a second verified multi-layer etch sequence when the additional evaluation data is less than a first additional multi-etch limit; and b9) performing an additional corrective action when the additional evaluation data is not less than the first additional multi-etch limit.

In a third alternate embodiment, the second (VUV/EED$f$)-related procedure (metal-gate-etch sequence) can include: c1) transferring a first patterned in the second set of patterned substrates to a second temperature-controlled substrate holder in a second etching chamber using the transfer subsystem coupled to the second etching chamber, wherein the transfer subsystem is configured to prevent an oxide layer from forming on the first patterned during the transferring, the second multi-layer etch sequence being performed after the first multi-layer etch sequence is verified, the third etch procedure in the second multi-layer etch sequence, wherein the second set of patterned substrates comprises a plurality of partially-etched substrates; c2) performing a third etch procedure in the second multi-layer etch sequence etching a second set of the additional layers on the first partially-etched substrate using a third etch procedure in the second multi-layer etch sequence, the third etch procedure creating a third set of patterned masking layers by using the intermediate pattern in the second set of masking layers, wherein the second set of the additional layers comprise a TEOS layer, a silicone-nitride (SiN) layer, an amorphous silicon layer and a titanium-nitride (TiN) layer; c3) transferring the first patterned to a third temperature-controlled substrate holder in a first cleaning chamber using the transfer subsystem coupled to the first cleaning chamber, wherein the transfer subsystem is configured to prevent an oxide layer from forming on the first patterned during the transferring; c4) performing a first cleaning procedure wherein a fourth set of patterned masking layers is created; c5) transferring the first patterned to a fourth temperature-controlled substrate holder in a fourth etching chamber using the transfer subsystem coupled to the fourth etching chamber, wherein the transfer subsystem is configured to prevent an oxide layer from forming on the first patterned during the transferring; c6) performing a fourth etch procedure in the second multi-layer etch sequence, wherein the fourth etch procedure is configured to create a fifth set of patterned masking layers using the fourth set of patterned masking layers, the fifth set of patterned masking layers including a plurality of gate stacks, each gate stack comprising a metal-containing feature, a titanium-nitride (TiN) feature, an amorphous silicon feature, a silicone-nitride (SiN) feature and a TEOS feature; c7) obtaining additional evaluation data for the first patterned using at least one additional periodic evaluation structure; c8) identifying the second multi-layer etch sequence as a second verified multi-layer etch sequence when the additional evaluation data is less than a first additional multi-etch limit; and c9) performing an additional corrective action when the additional evaluation data is not less than the first additional multi-etch limit.

Figure 13:
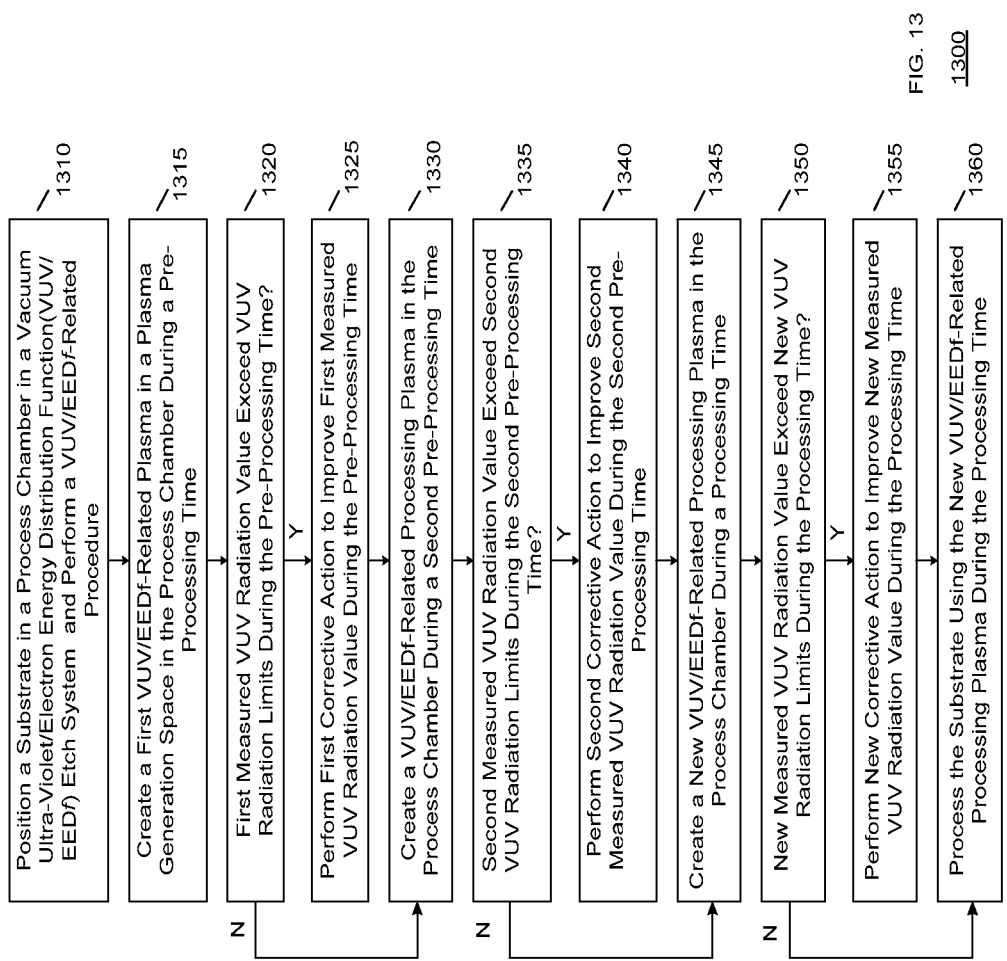
FIG. 13 illustrates an exemplary flow diagram of a method for processing a wafer using VUV/EEDƒ-related procedures in accordance with embodiments of the invention.

FIG. 13 illustrates an exemplary flow diagram of a method for processing a wafer using VUV/EED$f$-related procedures in accordance with embodiments of the invention. FIG. 13 illustrates a procedure 1300 for processing a substrate using the processing system (100, FIG. 1). Procedure 1300 can include a number of processing steps that can be performed by one or more of the subsystems (110, 120, 130, 140, 150, 160, and 170). During some VUV/EEDf)-related procedures, one or more exemplary (VUV/EEDf)) etch systems 200A can be used to perform (VUV/EEDf))-related procedures. One or more of the pressure control systems {(257, FIGS. 2A-2G) or (257, FIGS. 3A-3G)} can be coupled to the process chamber (210, FIG. 2A) and different chamber pressures can be established using One or more of the pressure control systems {(257, FIGS. 2A-2G) or (257, FIGS. 3A-3G)}. For example, the chamber pressures can vary from about one mTorr to about 1000 mTorr. In addition, different substrate temperatures can be established using the one or more of the temperature control systems {(228, FIGS. 2A-2G) or (228, FIGS. 3A-3G)} and one or more of the temperature control elements {(229, FIGS. 2A-2G) or (229, FIGS. 3A-3G)}. For example, the substrate temperatures can vary from about −10° C. to about 250° C.

In 1310, one or more of the substrates {(225, FIGS. 2A-2G) or (225, FIGS. 3A-3G)} can be positioned on one or more of the substrate holders {(220, FIGS. 2A-2G) or (220, FIGS. 3A-3G)} in one or more of the process chambers {(210, FIGS. 2A-2G) or (210, FIGS. 3A-3G)} that is configured to create a VUV/EED$f$-related plasma during a VUV/EED$f$-related procedure, and the processing time for the VUV/EED$f$-related procedures can vary from about 2 seconds to about 2 minutes. One or more of the RF sources {(230, FIGS. 2A-2G) or (230, FIGS. 3A-3G)} can be configured at the bottom of one or more of the process chambers {(210, FIGS. 2A-2G) or (210, FIGS. 3A-3G)}, and one or more of the RF sources {(230, FIGS. 2A-2G) or (230, FIGS. 3A-3G)} can be coupled to one or more of the RF electrodes {(221, FIGS. 2A-2G) or (221, FIGS. 3A-3G)}.

In 1315, initial VUV/EED$f$-related pre-processing plasma can be created during a first pre-processing time associated with the VUV/EED$f$-related procedure. In some embodiments, an initial gas mixture can be provided to the top portion of one or more of the process chambers {(210, FIGS. 2A-2G) or (210, FIGS. 3A-3G)} during the first pre-processing time associated with the VUV/EED$f$-related procedure, and the initial gas mixture can include an initial plasma stabilization gas and/or an initial process gas. One or more of the gas injection elements {(242$a$ and 242$b$, FIGS. 2A-2G) or (242$a$ and 242$b$, FIGS. 3A-3G)} can be configured to provide the initial gas mixture to one or more of the process chambers {(210, FIGS. 2A-2G) or (210, FIGS. 3A-3G)}, can provide different flow rates and/or different process gasses to different regions of one or more of the processing regions {(245, FIGS. 2A-2G) or (245, FIGS. 3A-3G)} during the VUV/EED$f$-related procedure. For example, process gas can be supplied from a gas supply system {(240, FIGS. 2A-2G) or (240, FIGS. 3A-3G)}. In addition, one or more of the gas injection elements {(242$a$ and 242$b$, FIGS. 2A-2G) or (242$a$ and 242$b$, FIGS. 3A-3G)} can be configured to provide the initial gas mixture, can be configured to control the initial gas mixture components, the initial gas mixture flow rates and the initial gas mixture flow directions.

In other embodiments, one or more initial plasma stabilization gases can be used during the first pre-processing time associated with the VUV/EED$f$-related procedure. For example, the initial plasma stabilization gas can be provided to the top portion of the one or more of the processing regions {(245, FIGS. 2A-2G) or (245, FIGS. 3A-3G)} during the first pre-processing time.

In addition, one or more of the RF sources {(230, FIGS. 2A-2G) or (230, FIGS. 3A-3G)} can be configured to provide a first pre-processing power to one or more of the RF electrodes {(221, FIGS. 2A-2G) or (221, FIGS. 3A-3G)} during the first pre-processing time, thereby creating the initial VUV/EED$f$-related pre-processing plasma in the one or more of the processing regions {(245, FIGS. 2A-2G) or (245, FIGS. 3A-3G)} proximate to one or more of the substrates {(225, FIGS. 2A-2G) or (225, FIGS. 3A-3G)} during the first pre-processing time. In various embodiments, the first pre-processing power can be provided by a radio frequency (RF) source, and the first pre-processing power can vary from about 100 watts to about 10000 watts. For example, the first pre-processing time can vary from about 10 microseconds to about 10 seconds.

In various embodiments, the (VUV/EEDf)) etch systems can also be configured as shown in (200B, FIG. 2B), (200C, FIG. 2C), (200D, FIG. 2D), (200E, FIG. 2E), (200F, FIG. 2F), (200G, FIG. 2G), (300A, FIG. 3A), (300B, FIG. 3B), (300C, FIG. 3C), (300D, FIG. 3D), (300E, FIG. 3E), (300F, FIG. 3F), or (300G, FIG. 3G), and the first pre-processing power can be provided, during the first pre-processing time, by one or more of the RF sources associated with these (VUV/EEDf)) etch systems.

In 1320, a first measured VUV radiation value can be measured and/or determined for the initial VUV/EED$f$-related pre-processing plasma and can be compared to first VUV radiation limits during the first pre-processing time. A first query can be performed to determine if the first VUV radiation value exceeds the first VUV radiation limits. When the first VUV radiation value exceeds one or more of the first VUV radiation limits, procedure 1300 can branch to 1325 and continue as shown in FIG. 13. When the first VUV radiation value does not exceed at least one of the first VUV radiation limits, procedure 1300 can branch to 1330 and continue as shown in FIG. 13. One or more of the process sensors {(236, FIGS. 2A-2G) or (236, FIGS. 3A-3G)} or the VUV/EEDƒ sensor subsystems {(250, FIGS. 2A-2G) or (250, FIGS. 3A-3G)} that can be coupled to one or more of the process chambers {(210, FIGS. 2A-2G) or (210, FIGS. 3A-3G)} and can be used to determine the first VUV radiation values during the first pre-processing time. The intensity and intermittency of EM radiation and/or VUV radiation intensity emanating from the initial pre-processing plasma may be used to evaluate the stability of the plasma. For example, unstable plasma can create intermittent EM radiation and/or VUV radiation signals. In addition, the initial pre-processing plasma can be stopped to prevent damage to the substrate if the first VUV radiation value exceeds a first limit and/or if the EEDƒ data is not correct.

In 1325, at least one first corrective action can be performed to improve the first VUV radiation value during the first pre-processing time. The RF power, the RF voltage, the RF bias, the DC electrical power, the initial gas mixture components, the initial gas mixture flow rates, the initial gas mixture directions, the number of initial pre-processing gases, the initial pre-processing gas flow rates, the initial pre-processing gas flow directions, the chamber pressure, the chamber temperature, the initial pre-processing power, or the substrate temperature, or any combination thereof can be updated during corrective actions.

In 1330, one or more first VUV/EEDƒ-related plasmas can be created in one or more of the process chambers {(210, FIGS. 2A-2G) or (210, FIGS. 3A-3G)} during a second pre-processing time associated with the VUV/EEDƒ-related procedure. In some embodiments, a first gas mixture can be provided to the one or more of the processing regions {(245, FIGS. 2A-2G) or (245, FIGS. 3A-3G)} in one or more of the process chambers {(210, FIGS. 2A-2G) or (210, FIGS. 3A-3G)} during the second pre-processing time associated with the VUV/EEDƒ-related procedure, and the first gas mixture can include a first plasma stabilization gas and/or a first plasma process gas. The first plasma stabilization gas, when used, can move (diffuse) into the top portion of the one or more of the processing regions {(245, FIGS. 2A-2G) or (245, FIGS. 3A-3G)}, and can be used to create a first stabilization plasma during the second pre-processing time. The first plasma process gas, when used, can move (diffuse) into the bottom portion of one or more of the process chambers {(210, FIGS. 2A-2G) or (210, FIGS. 3A-3G)}, and can be used to create a first process plasma during the second pre-processing time. Alternatively, the first plasma stabilization gas and/or the first plasma process gas may be present throughout the one or more of the processing regions {(245, FIGS. 2A-2G) or (245, FIGS. 3A-3G)} in one or more of the process chambers {(210, FIGS. 2A-2G) or (210, FIGS. 3A-3G)}. In other embodiments, one or more first plasma stabilization gases can flow into a one or more of the processing regions {(245, FIGS. 2A-2G) or (245, FIGS. 3A-3G)} in one or more of the process chambers {(210, FIGS. 2A-2G) or (210, FIGS. 3A-3G)} during the second pre-processing time associated with the VUV/EEDƒ-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the first plasma stabilization gas to the one or more of the processing regions {(245, FIGS. 2A-2G) or (245, FIGS. 3A-3G)} during the second pre-processing time. In other embodiments, one or more of the first plasma stabilization gases can flow into the one or more of the processing regions {(245, FIGS. 2A-2G) or (245, FIGS. 3A-3G)} in one or more of the process chambers {(210, FIGS. 2A-2G) or (210, FIGS. 3A-3G)} during the second pre-processing time associated with the VUV/EEDƒ-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the first plasma stabilization gas to the top portion of the one or more of the processing regions {(245, FIGS. 2A-2G) or (245, FIGS. 3A-3G)} during the second pre-processing time.

In addition, one or more of the RF sources {(230, FIGS. 2A-2G) or (230, FIGS. 3A-3G)} can be configured to provide an second pre-processing power to one or more of the RF electrodes {(221, FIGS. 2A-2G) or (221, FIGS. 3A-3G)} during the second pre-processing time, thereby creating the first VUV/EEDƒ-related pre-processing plasma in the one or more of the processing regions {(245, FIGS. 2A-2G) or (245, FIGS. 3A-3G)} proximate to one or more of the substrates {(225, FIGS. 2A-2G) or (225, FIGS. 3A-3G)} during the second pre-processing time. In various embodiments, the second pre-processing power can be provided by a radio frequency (RF) source, and the second pre-processing power can vary from about 100 watts to about 10000 watts. For example, the second pre-processing time can vary from about one millisecond to about 10 seconds.

In various embodiments, the (VUV/EEDf)) etch systems can also be configured as shown in (200B, FIG. 2B), (200C, FIG. 2C), (200D, FIG. 2D), (200E, FIG. 2E), (200F, FIG. 2F), (300A, FIG. 3A), (300B, FIG. 3B), (300C, FIG. 3C), (300D, FIG. 3D), (300E, FIG. 3E), or (300E, FIG. 3E), and the second pre-processing power can be provided, during the second pre-processing time, by one or more of the RF sources associated with these (VUV/EEDf)) etch systems.

In 1335, a second measured VUV radiation value can be measured and/or determined when one or more of the VUV/EEDƒ-related plasmas are created during the second pre-processing time and can be compared to second VUV radiation limits during the second pre-processing time. A second query can be performed to determine if the second VUV radiation value exceeds the second VUV radiation limits. When the second VUV radiation value exceeds one or more of the second VUV radiation limits, procedure 1300 can branch to 1340 and continue as shown in FIG. 13. When the second VUV radiation value does not exceed at least one of the second VUV radiation limits, procedure 1300 can branch to 1345 and continue as shown in FIG. 13. One or more of the process sensors {(236, FIGS. 2A-2G) or (236, FIGS. 3A-3G)} or the VUV/EEDƒ sensor subsystems {(250, FIGS. 2A-2G) or (250, FIGS. 3A-3G)} that can be coupled to one or more of the process chambers {(210, FIGS. 2A-2G) or (210, FIGS. 3A-3G)} and can be used to determine the second VUV radiation values during the second pre-processing time. The intensity and intermittency of EM radiation and/or VUV radiation intensity emanating from the first pre-processing plasma may be used to evaluate the stability of the plasma. For example, unstable plasma can create intermittent EM radiation and/or VUV radiation signals. In addition, the first pre-processing plasma can be stopped to prevent damage to the substrate if the first VUV radiation value exceeds a first limit and/or if the EEDƒ data is not correct.

In 1340, at least one second corrective action can be performed to improve the second VUV radiation value during the second pre-processing time. The RF power, the RF voltage, the RF bias, the DC electrical power, first gas mixture components, the first gas mixture flow rates, the first gas mixture directions, the number of first pre-processing gases, the first pre-processing gas flow rates, the first pre-processing gas flow directions, the chamber pressure, the chamber temperature, the second pre-processing power, or the substrate temperature, or any combination thereof can be updated during the second corrective actions.

In 1345, one or more new VUV/EED$f$-related plasmas can be created in the processing chamber during a new processing time associated with the VUV/EED$f$-related procedure. In some embodiments, a new gas mixture can be provided to the one or more of the processing regions {(245, FIGS. 2A-2G) or (245, FIGS. 3A-3G)} in one or more of the process chambers {(210, FIGS. 2A-2G) or (210, FIGS. 3A-3G)} during the new processing time associated with the VUV/EED$f$-related procedure, and the new gas mixture can include a new plasma stabilization gas and/or a new plasma process gas. The new plasma stabilization gas, when used, can move (diffuse) into the top portion of one or more of the process chambers {(210, FIGS. 2A-2G) or (210, FIGS. 3A-3G)}, and can be used to create a new stabilization plasma during the new processing time. The new plasma process gas, when used, can move (diffuse) into the bottom portion of one or more of the process chambers {(210, FIGS. 2A-2G) or (210, FIGS. 3A-3G)}, and can be used to create a new process plasma during the new processing time. Alternatively, the new plasma stabilization gas and/or the new plasma process gas may be present through-out the one or more of the processing regions {(245, FIGS. 2A-2G) or (245, FIGS. 3A-3G)} in one or more of the process chambers {(210, FIGS. 2A-2G) or (210, FIGS. 3A-3G)}. In other embodiments, one or more new plasma process gases can flow into a one or more of the processing regions {(245, FIGS. 2A-2G) or (245, FIGS. 3A-3G)} in one or more of the process chambers {(210, FIGS. 2A-2G) or (210, FIGS. 3A-3G)} during the new processing time associated with the VUV/EED$f$-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the new plasma process gas to the one or more of the processing regions {(245, FIGS. 2A-2G) or (245, FIGS. 3A-3G)} during the new processing time. In other embodiments, one or more of the new plasma stabilization gases can flow into the one or more of the processing regions {(245, FIGS. 2A-2G) or (245, FIGS. 3A-3G)} in one or more of the process chambers {(210, FIGS. 2A-2G) or (210, FIGS. 3A-3G)} during the new processing time associated with the VUV/EED$f$-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the new plasma stabilization gas to the top portion of the one or more of the processing regions {(245, FIGS. 2A-2G) or (245, FIGS. 3A-3G)} during the new processing time.

In addition, one or more of the RF sources {(230, FIGS. 2A-2G) or (230, FIGS. 3A-3G)} can be configured to provide a new processing power to One or more of the RF electrodes {(221, FIGS. 2A-2G) or (221, FIGS. 3A-3G)} during the new processing time, thereby creating the new VUV/EED$f$-related processing plasma in the one or more of the processing regions {(245, FIGS. 2A-2G) or (245, FIGS. 3A-3G)} proximate to one or more of the substrates {(225, FIGS. 2A-2G) or (225, FIGS. 3A-3G)} during the new processing time. In various embodiments, the new processing power can be provided by a radio frequency (RF) source, and the new processing power can vary from about 100 watts to about 10000 watts. For example, the new processing time can vary from about ten seconds to about 10 minutes.

In various embodiments, the (VUV/EEDf)) etch systems can also be configured as shown in (200A, FIG. 2A), (200B, FIG. 2B), (200C, FIG. 2C), (200D, FIG. 2D), (200E, FIG. 2E), (200F, FIG. 2F), (300A, FIG. 3A), (300B, FIG. 3B), (300C, FIG. 3C), (300D, FIG. 3D), (300E, FIG. 3E), or (300E, FIG. 3E), and the new processing power can be provided, during the new processing time, by one or more of the RF sources associated with these (VUV/EEDf)) etch systems.

In 1350, one or more new measured VUV radiation values can be measured and/or determined when one or more of the VUV/EED$f$-related plasmas are created during the new processing time and can be compared to new VUV radiation limits during the new processing time. At least one new query can be performed to determine if the new VUV radiation value exceeds any of the new VUV radiation limits. When the new VUV radiation value exceeds one or more of the new VUV radiation limits, procedure 1300 can branch to 1355 and continue as shown in FIG. 13. When the new VUV radiation value does not exceed at least one of the new VUV radiation limits, procedure 1300 can branch to 1360 and continue as shown in FIG. 13. One or more of the process sensors (236, FIG. 2A) or one or more of the VUV/EED$f$ sensor subsystems {(250, FIGS. 2A-2G) or (250, FIGS. 3A-3G)} can be coupled to one or more of the process chambers {(210, FIGS. 2A-2G) or (210, FIGS. 3A-3G)} and can be used to determine the new VUV radiation values during the new processing time. The intensity and intermittency of EM radiation and/or VUV radiation intensity emanating from the new processing plasma may be used to evaluate the stability of the plasma. For example, unstable plasma can create intermittent EM radiation and/or VUV radiation signals. In addition, the new processing plasma can be stopped to prevent damage to the substrate if the new VUV radiation value exceeds a new limit and/or if the new EEDf data is not correct during the new processing time.

In 1355, at least one new corrective action can be performed to improve the new VUV radiation value during the new processing time. The new RF power, the new RF voltage, the new RF bias, the new DC electrical power, new gas mixture components, the new gas mixture flow rates, the new gas mixture directions, the number of new processing gases, the new processing gas flow rates, the new processing gas flow directions, the chamber pressure, the chamber temperature, the new processing power, or the substrate temperature, or any combination thereof can be updated during the new corrective actions.

In 1360, the VUV/EED$f$-related procedure can continue and the substrate can be processed using one or more of the new VUV/EED$f$-related plasmas created in the processing chamber during a new processing time associated with the VUV/EED$f$-related procedure. For example, one or more new measured VUV radiation values can be measured and/or determined when one or more of the VUV/EEDƒ-related plasmas are used to process the substrate during the new processing time and can be compared to new VUV radiation limits during the new processing time. For example, the flow rates for the new plasma stabilization gas and/or to the new plasma process gas can vary from about zero sccm to about 400 sccm during the pre-processing times and/or during the new processing time.

Figure 14:
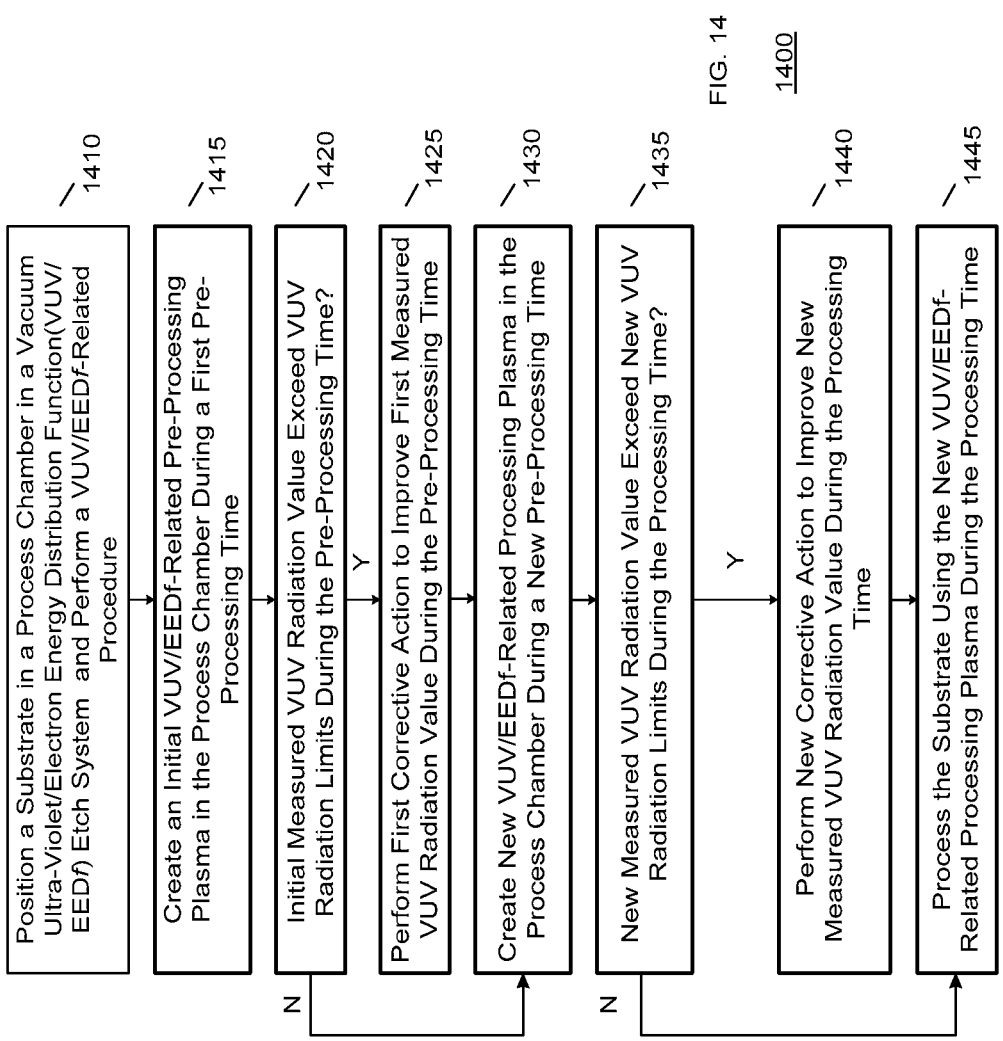
FIG. 14 illustrates another exemplary flow diagram of a method for processing a wafer using VUV/EEDƒ-related procedures in accordance with embodiments of the invention.

FIG. 14 illustrates another exemplary flow diagram of a method for processing a wafer using VUV/EEDƒ-related procedures in accordance with embodiments of the invention. FIG. 14 illustrates a procedure 1400 for processing a substrate using the processing system (100, FIG. 1). Procedure 1400 can include a number of processing steps that can be performed by one or more of the subsystems (110, 120, 130, 140, 150, 160, and 170). During some VUV/EEDƒ-related procedures, one or more exemplary (VUV/EEDf)) etch systems 200A can be used to perform (VUV/EEDƒ))-related procedures. One or more of the pressure control systems {(257, FIGS. 2A-2G) or (257, FIGS. 3A-3G)} can be coupled to one or more of the process chambers {(210, FIGS. 2A-2G) or (210, FIGS. 3A-3G)}, and different chamber pressures can be established using one or more of the pressure control systems {(257, FIGS. 2A-2G) or (257, FIGS. 3A-3G)}. For example, the chamber pressures can vary from about one mTorr to about 1000 mTorr. In addition, different substrate temperatures can be established using one or more of the temperature control systems {(228, FIGS. 2A-2G) or (228, FIGS. 3A-3G)} and one or more of the temperature control elements {(229, FIGS. 2A-2G) or (229, FIGS. 3A-3G)}. For example, the substrate temperatures can vary from about −10° C. to about 250° C.

In 1410, one or more of the substrates {(225, FIGS. 2A-2G) or (225, FIGS. 3A-3G)} can be positioned on one or more of the substrate holders {(220, FIGS. 2A-2G) or (220, FIGS. 3A-3G)} in one or more of the process chambers {(210, FIGS. 2A-2G) or (210, FIGS. 3A-3G)} that is configured to create a VUV/EEDƒ-related plasma during a VUV/EEDƒ-related procedure, and the processing time for the VUV/EEDƒ-related procedures can vary from about 2 seconds to about 2 minutes. One or more of the RF sources {(230, FIGS. 2A-2G) or (230, FIGS. 3A-3G)} can be configured at the bottom of one or more of the process chambers {(210, FIGS. 2A-2G) or (210, FIGS. 3A-3G)}, and one or more of the RF sources {(230, FIGS. 2A-2G) or (230, FIGS. 3A-3G)} can be coupled to One or more of the RF electrodes {(221, FIGS. 2A-2G) or (221, FIGS. 3A-3G)}.

In 1415, initial VUV/EEDƒ-related pre-processing plasma can be created during a first pre-processing time associated with the VUV/EEDƒ-related procedure. In some embodiments, an initial gas mixture can be provided to the top portion of one or more of the process chambers {(210, FIGS. 2A-2G) or (210, FIGS. 3A-3G)} during the first pre-processing time associated with the VUV/EEDƒ-related procedure, and the initial gas mixture can include an initial plasma stabilization gas and/or an initial process gas. One or more of the gas injection elements {(242a and 242b, FIGS. 2A-2G) or (242a and 242b, FIGS. 3A-3G)} can be configured to provide the initial gas mixture to one or more of the process chambers {(210, FIGS. 2A-2G) or (210, FIGS. 3A-3G)}. For example, process gas can be supplied from a gas delivery system {(240, FIGS. 2A-2G) or (240, FIGS. 3A-3G)}. One or more of the gas injection elements {(242a and 242b, FIGS. 2A-2G) or (242a and 242b, FIGS. 3A-3G)} can provide different flow rates to different regions of the one or more of the processing regions {(245, FIGS. 2A-2G) or (245, FIGS. 3A-3G)} during the VUV/EEDƒ-related procedure. The one or more of the gas injection elements {(242a and 242b, FIGS. 2A-2G) or (242a and 242b, FIGS. 3A-3G)} may provide different process gasses to one or more of the processing regions {(245, FIGS. 2A-2G) or (245, FIGS. 3A-3G)}. In addition, one or more of the gas injection elements {(242a and 242b, FIGS. 2A-2G) or (242a and 242b, FIGS. 3A-3G)} can be configured to provide the initial gas mixture, can be configured to control the initial gas mixture components, the initial gas mixture flow rates and the initial gas mixture flow directions. In other embodiments, one or more initial plasma stabilization gases can flow into the one or more of the processing regions {(245, FIGS. 2A-2G) or (245, FIGS. 3A-3G)} in one or more of the process chambers {(210, FIGS. 2A-2G) or (210, FIGS. 3A-3G)} during the first pre-processing time associated with the VUV/EEDƒ-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the initial plasma stabilization gas to the top portion of the one or more of the processing regions {(245, FIGS. 2A-2G) or (245, FIGS. 3A-3G)} during the first pre-processing time.

In addition, one or more of the RF sources {(230, FIGS. 2A-2G) or (230, FIGS. 3A-3G)} can be configured to provide a first pre-processing power to One or more of the RF electrodes {(221, FIGS. 2A-2G) or (221, FIGS. 3A-3G)} during the first pre-processing time, thereby creating the initial VUV/EEDƒ-related pre-processing plasma in the one or more of the processing regions {(245, FIGS. 2A-2G) or (245, FIGS. 3A-3G)} proximate to the one or more of the substrates {(225, FIGS. 2A-2G) or (225, FIGS. 3A-3G)} during the first pre-processing time. In various embodiments, the first pre-processing power can be provided by a radio frequency (RF) source, and the first pre-processing power can vary from about 100 watts to about 10000 watts. For example, the first pre-processing time can vary from about 10 microseconds to about 10 seconds.

In various embodiments, the (VUV/EEDf)) etch systems can also be configured as shown in (200B, FIG. 2B), (200C, FIG. 2C), (200D, FIG. 2D), (200E, FIG. 2E), (200F, FIG. 2F), (300A, FIG. 3A), (300B, FIG. 3B), (300C, FIG. 3C), (300D, FIG. 3D), (300E, FIG. 3E), or (300E, FIG. 3E), and the first pre-processing power can be provided, during the first pre-processing time, by one or more of the RF sources associated with these (VUV/EEDf)) etch systems.

In 1420, a first (initial) measured VUV radiation value can be measured and/or determined for the initial VUV/EEDƒ-related pre-processing plasma and can be compared to first VUV radiation limits during the first pre-processing time. A first query can be performed to determine if the first VUV radiation value exceeds the first VUV radiation limits. When the first VUV radiation value exceeds one or more of the first VUV radiation limits, procedure 1400 can branch to 1425 and continue as shown in FIG. 14. When the first VUV radiation value does not exceed at least one of the first VUV radiation limits, procedure 1400 can branch to 1430 and continue as shown in FIG. 14. One or more of the process sensors {(236, FIGS. 2A-2G) or (236, FIGS. 3A-3G)} or one or more of the VUV/EEDf sensor subsystems {(250, FIGS. 2A-2G) or (250, FIGS. 3A-3G)} can be coupled to one or more of the process chambers {(210, FIGS. 2A-2G) or (210, FIGS. 3A-3G)} and can be used to determine the first VUV radiation values during the first pre-processing time. The intensity and intermittency of EM radiation and/or VUV radiation intensity emanating from the initial pre-processing plasma may be used to evaluate the stability of the plasma. For example, unstable plasma can create intermittent EM radiation and/or VUV radiation signals. In addition, the initial pre-processing plasma can be stopped to prevent damage to the substrate if the first VUV radiation value exceeds a first limit and/or if the EEDƒ data is not correct.

In 1425, at least one first corrective action can be performed to improve the first VUV radiation value during the first pre-processing time. The RF power, the RF voltage, the RF bias, the DC electrical power, initial gas mixture components, the initial gas mixture flow rates, the initial gas mixture directions, the number of initial pre-processing gases, the initial pre-processing gas flow rates, the initial pre-processing gas flow directions, the chamber pressure, the chamber temperature, the initial pre-processing power, or the substrate temperature, or any combination thereof can be updated during corrective actions.

In 1430, one or more new VUV/EEDƒ-related plasmas can be created in the processing chamber during a new processing time associated with the VUV/EEDƒ-related procedure. In some embodiments, a new gas mixture can be provided to the one or more of the processing regions {(245, FIGS. 2A-2G) or (245, FIGS. 3A-3G)} in one or more of the process chambers {(210, FIGS. 2A-2G) or (210, FIGS. 3A-3G)} during the new processing time associated with the VUV/EEDƒ-related procedure, and the new gas mixture can include a new plasma stabilization gas and/or a new plasma process gas. The new plasma stabilization gas, when used, can move (diffuse) into the top portion of one or more of the process chambers {(210, FIGS. 2A-2G) or (210, FIGS. 3A-3G)}, and can be used to create a new stabilization plasma during the new processing time. The new plasma process gas, when used, can move (diffuse) into the bottom portion of one or more of the process chambers {(210, FIGS. 2A-2G) or (210, FIGS. 3A-3G)}, and can be used to create a new process plasma during the new processing time. Alternatively, the new plasma stabilization gas and/or the new plasma process gas may be present through-out the one or more of the processing regions {(245, FIGS. 2A-2G) or (245, FIGS. 3A-3G)} in one or more of the process chambers {(210, FIGS. 2A-2G) or (210, FIGS. 3A-3G)}. In other embodiments, one or more new plasma process gases can flow into a one or more of the processing regions {(245, FIGS. 2A-2G) or (245, FIGS. 3A-3G)} in one or more of the process chambers {(210, FIGS. 2A-2G) or (210, FIGS. 3A-3G)} during the new processing time associated with the VUV/EEDƒ-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the new plasma process gas to the one or more of the processing regions {(245, FIGS. 2A-2G) or (245, FIGS. 3A-3G)} during the new processing time. In other embodiments, one or more of the new plasma stabilization gases can flow into the one or more of the processing regions {(245, FIGS. 2A-2G) or (245, FIGS. 3A-3G)} in one or more of the process chambers {(210, FIGS. 2A-2G) or (210, FIGS. 3A-3G)} during the new processing time associated with the VUV/EEDƒ-related procedure. For example, one or more of the gas injection elements {(242a and 242b, FIGS. 2A-2G) or (242a and 242b, FIGS. 3A-3G)} can be coupled to one or more of the process chambers {(210, FIGS. 2A-2G) or (210, FIGS. 3A-3G)} proximate to the top portion of the process chamber, and one or more of the gas injection elements {(242a and 242b, FIGS. 2A-2G) or (242a and 242b, FIGS. 3A-3G)} be configured to provide the new plasma stabilization gas to the top portion of the one or more of the processing regions {(245, FIGS. 2A-2G) or (245, FIGS. 3A-3G)} during the new processing time.

In addition, one or more of the RF sources {(230, FIGS. 2A-2G) or (230, FIGS. 3A-3G)} can be configured to provide a new processing power to one or more of the RF electrodes {(221, FIGS. 2A-2G) or (221, FIGS. 3A-3G)} during the new processing time, thereby creating the new VUV/EEDƒ-related processing plasma in the one or more of the processing regions {(245, FIGS. 2A-2G) or (245, FIGS. 3A-3G)} proximate to one or more of the substrates {(225, FIGS. 2A-2G) or (225, FIGS. 3A-3G)} during the new processing time. In various embodiments, the new processing power can be provided by a radio frequency (RF) source, and the new processing power can vary from about 100 watts to about 10000 watts. For example, the new processing time can vary from about ten seconds to about 10 minutes.

In various embodiments, the (VUV/EEDƒ)) etch systems can also be configured as shown in (200B, FIG. 2B), (200C, FIG. 2C), (200D, FIG. 2D), (200E, FIG. 2E), (200F, FIG. 2F), (300A, FIG. 3A), (300B, FIG. 3B), (300C, FIG. 3C), (300D, FIG. 3D), (300E, FIG. 3E), or (300E, FIG. 3E), and the new processing power can be provided, during the new processing time, by one or more of the RF sources associated with these (VUV/EEDƒ)) etch systems.

In 1435, one or more new measured VUV radiation values can be measured and/or determined when one or more of the VUV/EEDƒ-related plasmas are created during the new processing time and can be compared to new VUV radiation limits during the new processing time. At least one new query can be performed to determine if the new VUV radiation value exceeds any of the new VUV radiation limits. When the new VUV radiation value exceeds one or more of the new VUV radiation limits, procedure 1400 can branch to 1440 and continue as shown in FIG. 14. When the new VUV radiation value does not exceed at least one of the new VUV radiation limits, procedure 1400 can branch to 1445 and continue as shown in FIG. 14. One or more of the process sensors {(236, FIGS. 2A-2G) or (236, FIGS. 3A-3G)} or the VUV/EEDƒ sensor subsystems {(250, FIGS. 2A-2G) or (250, FIGS. 3A-3G)} that can be coupled to one or more of the process chambers {(210, FIGS. 2A-2G) or (210, FIGS. 3A-3G)} and can be used to determine the new VUV radiation values during the new processing time. The intensity and intermittency of EM radiation and/or VUV radiation intensity emanating from the new processing plasma may be used to evaluate the stability of the plasma. For example, unstable plasma can create intermittent EM radiation and/or VUV radiation signals. In addition, the new processing plasma can be stopped to prevent damage to the substrate if the new VUV radiation value exceeds a new limit and/or if the new EEDƒ data is not correct during the new processing time.

In 1440, at least one new corrective action can be performed to improve the new VUV radiation value during the new processing time. The new RF power, the new RF voltage, the new RF bias, the new DC electrical power, new gas mixture components, the new gas mixture flow rates, the new gas mixture directions, the number of new processing gases, the new processing gas flow rates, the new processing gas flow directions, the chamber pressure, the chamber temperature, the new processing power, or the substrate temperature, or any combination thereof can be updated during the new corrective actions.

In 1445, the VUV/EED*f*-related procedure can continue and the substrate can be processed using one or more of the new VUV/EED*f*-related plasmas created in the processing chamber during a new processing time associated with the VUV/EED*f*-related procedure. For example, one or more new measured VUV radiation values can be measured and/or determined when one or more of the VUV/EED*f*-related plasmas are used to process the substrate during the new processing time and can be compared to new VUV radiation limits during the new processing time. For example, the flow rates for the new plasma stabilization gas and/or to the new plasma process gas can vary from about zero sccm to about 400 sccm during the pre-processing times and/or during the new processing time.

In some embodiments, the historical and/or real-time data can include MIMO maps, substrate-related maps, process-related maps, damage-assessment maps, reference maps, measurement maps, prediction maps, risk maps, inspection maps, verification maps, evaluation maps, particle maps, and/or confidence map(s) for one or more substrates. In addition, some MIMO procedures may use substrate maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When substrate maps are created and/or modified, values may not be calculated and/or required for the entire substrate, and a substrate map may include data for one or more sites, one or more chip/dies, one or more different areas, and/or one or more differently shaped areas. For example, a processing chamber may have unique characteristics that may affect the quality of the processing results in certain areas of the substrate. In addition, a manufacturer may allow less accurate process and/or evaluation data for chips/dies in one or more regions of the substrate to maximize yield. When a value in a map is close to a limit, the confidence value may be lower than when the value in a map is not close to a limit. In addition, the accuracy values can be weighted for different chips/dies and/or different areas of the substrate. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a substrate. For example, values from another map may be used as weighting factors.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for processing a substrate using a Vacuum Ultra-Violet and Electron Energy Distribution Function (VUV and EED*f*) etch system, the method comprising:
   positioning a substrate on a substrate holder in a process chamber configured to perform the VUV and EED*f*-related procedure;
   creating an initial VUV and EEDf-related pre-processing plasma in a processing region during a first pre-processing time associated with the VUV and EED*f*-related procedure using a Radio Frequency (RF) generator;
   determining a first measured VUV radiation value for the initial VUV and EED*f*-related pre-processing plasma;
   comparing the first measured VUV radiation value to first VUV radiation limits during the first pre-processing time;
   performing at least one first corrective action to improve the first measured VUV radiation value when the first measured VUV radiation value exceeds one or more of the first VUV radiation limits during the first pre-processing time; and
   creating one or more first VUV and EED*f*-related plasmas in the process chamber during a second pre-processing time associated with the VUV and EEDf-related procedure using the RF generator.

2. The method of claim 1, further comprising:
   determining a second measured VUV radiation value for at least one of the first VUV and EEDf-related plasmas during the second pre-processing time;
   comparing the second measured VUV radiation value to second VUV radiation limits during the second pre-processing time;
   performing at least one second corrective action to improve the second measured VUV radiation value when the second measured VUV radiation value exceeds one or more of the second VUV radiation limits during the second pre-processing time; and
   creating one or more new VUV and EEDf-related plasmas in the process chamber during a new processing time associated with the VUV and EEDf-related procedure using the RF generator.

3. The method of claim 2, further comprising:
   determining a new measured VUV radiation value for at least one of the new VUV and EEDf-related plasmas during the new processing time;
   comparing the new measured VUV radiation value to new VUV radiation limits during the new processing time;
   performing at least one new corrective action to improve the new measured VUV radiation value when the new measured VUV radiation value exceeds one or more of the new VUV radiation limits during the new processing time; and
   processing the substrate using one or more of the new VUV and EEDf-related plasmas created in the process chamber during the new processing time associated with the VUV and EEDf-related procedure.

4. The method of claim 2, wherein the new VUV and EEDf-related plasmas comprise a new stabilization plasma, or a new process plasma, or any combination thereof.

5. The method of claim 1, wherein the (VUV and EED*f*)) etch system comprises a capacitively-coupled (CCP) etch system, an inductively coupled plasma (ICP) etch system, or a transformer coupled plasma (TCP) etch system, or any combination thereof.

6. The method of claim 1, wherein one or more initial gas mixtures are flowed into a top portion of the process chamber during the first pre-processing time associated with the VUV and EEDf-related procedure.

7. The method of claim 1, wherein the (VUV and EEDƒ)) etch system comprises at least one RF generator coupled to the process chamber, the at least one RF generator being configured to provide an initial pre-processing power to a plasma generation gas during the first pre-processing time, thereby creating the initial VUV and EEDf-related pre-processing plasma in the processing region proximate to the substrate during the first pre-processing time.

8. The method of claim 1, wherein one or more VUV and EEDf sensor subsystems are coupled to the process chamber and are used to determine the first measured VUV radiation value during the first pre-processing time.

9. The method of claim 1, wherein performing at least one first corrective action comprises updating at least one of: an RF power, an RF voltage, an RF bias, a DC electrical power, an initial gas mixture component, an initial gas mixture flow rate, an initial gas mixture direction, a number of initial pre-processing gases, an initial pre-processing gas flow rates, an initial pre-processing gas flow direction, chamber pressure, chamber temperature, an initial pre-processing power, and a substrate temperature.

10. The method of claim 1, wherein a high voltage direct current (DC) electrical power is coupled to the (VUV and EEDƒ)-related etch system thereby creating an energetic (ballistic) electron beam that strikes the substrate during the first pre-processing time.

11. A method for processing a substrate using a Vacuum Ultra-Violet and Electron Energy Distribution Function (VUV and EEDƒ) etch system, the method comprising:
positioning a substrate on a substrate holder in a process chamber configured to perform the VUV and EEDƒ-related procedure;
creating an initial VUV and EEDf-related pre-processing plasma in a processing region during a first pre-processing time associated with the VUV and EEDƒ-related procedure using a Radio Frequency (RF) generator;
determining a first measured VUV radiation value for the initial VUV and EEDf-related pre-processing plasma;
comparing the first measured VUV radiation value to first VUV radiation limits during the first pre-processing time;
performing at least one first corrective action to improve the first measured VUV radiation value when the first measured VUV radiation value exceeds one or more of the first VUV radiation limits during the first pre-processing time; and
creating one or more new VUV and EEDƒ-related plasmas in the process chamber during a new processing time associated with the VUV and EEDf-related procedure using the RF generator.

12. The method of claim 11, further comprising:
determining a new measured VUV radiation value for at least one of the new VUV and EEDf-related plasmas during the new processing time;
comparing the new measured VUV radiation value to new VUV radiation limits during the new processing time;
performing at least one new corrective action to improve the new measured VUV radiation value when the new measured VUV radiation value exceeds one or more of the new VUV radiation limits during the new processing time; and
processing the substrate using one or more of the new VUV and EEDf-related plasmas created in the process chamber using the RF generator during the new processing time associated with the VUV and EEDf-related procedure.

13. The method of claim 11, wherein the new VUV and EEDf-related plasmas comprise a new stabilization plasma, or a new process plasma, or any combination thereof.

14. The method of claim 11, wherein the (VUV and EEDƒ)) etch system comprises a capacitively-coupled (CCP) etch system, an inductively coupled plasma (ICP) etch system, or a transformer coupled plasma (TCP) etch system, or any combination thereof.

15. The method of claim 11, wherein one or more initial gas mixtures are flowed into a top portion of the process chamber during the first pre-processing time associated with the VUV and EEDf-related procedure.

16. The method of claim 11, wherein the (VUV and EEDƒ)) etch system comprises at least one RF generator coupled to the process chamber, the at least one RF generator being configured to provide an initial pre-processing power to a plasma generation gas during the first pre-processing time, thereby creating the initial VUV and EEDf-related pre-processing plasma in the processing region proximate to the substrate during the first pre-processing time.

17. The method of claim 11, wherein one or more of VUV and EEDf sensor subsystems are coupled to the process chamber and are used to determine the first measured VUV radiation value during the first pre-processing time.

18. The method of claim 11, wherein performing at least one first corrective action comprises updating at least one of: an RF power, an RF voltage, an RF bias, a DC electrical power, an initial gas mixture component, an initial gas mixture flow rate, an initial gas mixture direction, a number of initial pre-processing gases, an initial pre-processing gas flow rates, an initial pre-processing gas flow direction, chamber pressure, chamber temperature, an initial pre-processing power, and a substrate temperature.

19. The method of claim 11, wherein a high voltage direct current (DC) electrical power is coupled to the (VUV and EEDƒ) etch system, thereby creating an energetic (ballistic) electron beam that strikes the substrate during the first pre-processing time.

* * * * *